United States Patent
Babcock

(10) Patent No.: US 11,583,858 B2
(45) Date of Patent: Feb. 21, 2023

(54) MICROFLUIDIC PRODUCTS WITH CONTROLLED FLUID FLOW

(71) Applicant: Brian David Babcock, Columbia, TN (US)

(72) Inventor: Brian David Babcock, Columbia, TN (US)

(*) Notice: Subject to any disclaimer, the term of this patent is extended or adjusted under 35 U.S.C. 154(b) by 291 days.

(21) Appl. No.: 17/073,378

(22) Filed: Oct. 18, 2020

(65) Prior Publication Data

US 2021/0031190 A1 Feb. 4, 2021

Related U.S. Application Data

(63) Continuation of application No. 15/973,882, filed on May 8, 2018, now Pat. No. 10,821,438, which is a continuation of application No. 14/780,262, filed as application No. PCT/US2014/031889 on Mar. 26, 2014, now Pat. No. 9,968,930.

(60) Provisional application No. 61/859,652, filed on Jul. 29, 2013, provisional application No. 61/808,292, filed on Apr. 4, 2013.

(51) Int. Cl.
*B01L 3/00* (2006.01)
*B81C 1/00* (2006.01)

(52) U.S. Cl.
CPC ..... *B01L 3/50273* (2013.01); *B01L 3/502707* (2013.01); *B01L 3/502715* (2013.01); *B01L 3/502746* (2013.01); *B81C 1/00206* (2013.01); *B01L 2200/06* (2013.01); *B01L 2300/0627* (2013.01); *B01L 2300/0816* (2013.01); *B01L 2300/16* (2013.01); *B01L 2300/161* (2013.01); *B01L 2400/0406* (2013.01); *B01L 2400/0493* (2013.01); *B01L 2400/088* (2013.01); *B81B 2201/058* (2013.01)

(58) Field of Classification Search
CPC ........... B01L 2400/088; B01L 3/50273; B01L 3/5027; B01L 2200/06; B01L 2300/0627; B01L 2300/0816; B01L 2300/16; B81C 1/00206
See application file for complete search history.

(56) References Cited

U.S. PATENT DOCUMENTS

| | | | |
|---|---|---|---|
| 9,968,930 B2 * | 5/2018 | Babcock | ........... B01L 3/502746 |
| 10,821,438 B2 * | 11/2020 | Babcock | ........... B01L 3/502715 |
| 2008/0190220 A1 * | 8/2008 | Backes | ................. B29C 66/328 |
| | | | 73/864.81 |

* cited by examiner

*Primary Examiner* — Brian J. Sines

(57) ABSTRACT

A microfluidic product utilizing gradient surface energy coatings for fluid control comprising a plurality of fluid passages wherein at least one fluid passage comprises a coating configured to control liquid flow wherein the coating configured to control liquid flow comprises a gradient surface energy coating from a proximal location to a distal location on a surface of the fluid passage. The product can include uniform regions and surface gradient regions in the same passage. Coating compositions and product dimensions can be selected to provide control over different flow properties including fluid velocity, reduction and acceleration of fluid flow, and starting and stopping fluid flow.

20 Claims, 7 Drawing Sheets

MICROFLUIDIC PRODUCTS WITH CONTROLLED FLUID FLOW

RELATED APPLICATIONS

This application is a continuation application that claims benefit of U.S. patent application Ser. No. 15/973,882 filed May 8, 2018 which claims the benefit of U.S. patent application Ser. No. 14/31,889 filed Sep. 25, 2015 (now U.S. Pat. No. 9,968,930), a 371 of PCT/US2014/031889 filed Mar. 26, 2014 that claims priority from provisional application 61/808,292 filed Apr. 4, 2013 and provisional application 61/859,652 filed Jul. 29, 2013 the contents of which are herein incorporated by reference in their entirety.

FIELD OF INVENTION

The present invention relates to microfluidic products using surface energy gradients to control fluid flow within the product.

BACKGROUND

The use of microfluidic technology is suitable for a number of analytical chemical and biochemical operations. These technologies provide advantages of being able to perform chemical and biochemical reactions, macromolecular separations, and the like, that range from the simple to the relatively complex, in automatable, high-throughput, low-volume systems. In particular, these systems employ networks of integrated microscale channels in which materials are transported, mixed, separated and detected. The small size of these systems allows for the performance reactions at substantially greater rates, and with substantially less reagent volume. Expensive or rare fluids are employed in many emerging scientific applications, such as proteomics and genomics. Thus, considerable interest has been focused on microfluidic techniques, which typically involve small sample volumes and low reagent consumption. In addition, microfluidic techniques may be used to carry out numerous parallel processes, can be used across a range of fluid properties, and are compatible with movement of biological moieties that may vary by orders of magnitude in size and physical characteristics (e.g., from peptide hormones to intact cells).

A variety of microfluidic devices have been developed for chemical and bioanalytical applications. In some applications, microfluidic devices involve the miniaturization and automation of a number of laboratory processes, which are then integrated on a chip. Thus, microfluidic technology may be employed to carry out a series of chemical or biochemical processes in a single device, including sample purification, separation, and detection of specific analytes. Applications include medical diagnostics, genetic analysis, or environmental sampling. See, e.g., Ramsey et al. (1995) "Microfabricated chemical measurement systems," Nat. Med. 1:1093-1096.

Typical microfluidic systems employ a body structure or substrate that has at least one microscale channel disposed within it. Examples of such systems range from simple tubular capillary systems, e.g., fused silica capillaries, to more complex planar devices that can have from one to several intersecting channels disposed therein, i.e., between at least two planar substrate layers. Microfluidic systems generally have a broad range of uses including separation and characterization of macromolecular species, e.g., proteins and nucleic acids, see e.g., U.S. Pat. No. 5,699,157, screening assay platforms, e.g., drug screening, diagnostics, etc. Substrates and/or cover plates can be comprised of a rigid material such as glass (see, e.g., Woolley et al. (1994), "Ultra-high-speed DNA fragment separations using microfabricated capillary array electrophoresis chips," Proc. Natl. Acad. Sci. USA 91:11348-11352), plastic (see, e.g., McCormick et al. (1997), "Microchannel electrophoretic separations of DNA in injection-molded plastic substrates," Anal. Chem. 69:2626-2630), silicon, or quartz. In other applications, microfabricated elastomeric valve and pump systems have been proposed in International Patent Publication No. WO01/01025. Similar valves and pumps are also described in Unger et al. (2000) "Monolithic microfabricated valves and pumps by multilayer soft lithography," Science 288: 113-116. These publications describe soft lithography as an alternative to silicon-based micromachining as a means by which to form microfluidic devices.

The above-described microfluidic devices, however, pose certain technical challenges that must be overcome. For example, fluid flow characteristics within the small flow channels of a microfluidic device may differ from the flow characteristics of fluids in larger devices, since surface effects tend to predominate, and regions of bulk flow become proportionately smaller. Several techniques have been developed in order to achieve fluid flow control in microfluidic devices. One technique involves the generation of electric fields to manipulate buffered, conductive fluids around networks of channels through electrophoretic or electroosmotic forces. See, e.g., Culbertson et al. (2000), "Electroosmotically induced hydraulic pumping on microchips: differential ion transport," Anal. Chem. 72:2285-2291. Another technique, as described in Anderson et al. (2000), "A miniature integrated device for automated multistep genetic assays," Nucleic Acids Res. 28:E60, describes fluidic control by coupling the device to an external system of solenoid valves and pressure sources. However, these fluid control mechanisms greatly increase the complexity, cost, and manufacturability of such highly integrated designs.

Typically, microfluidic devices employ fluid or material direction systems to transport fluids or other materials through and among the channels and chambers of the device in order to perform the combinations, separations or other operations in carrying out a given analysis. Examples of such transport systems include pneumatically or hydraulically driven systems, e.g., as described in published PCT Application No. 97/02357, systems incorporating microfabricated pumps and/or valves, and, in preferred aspects, electrokinetic material transport systems, e.g., as described in Published PCT Application No. 96/04547.

Wetting behavior of a liquid on a substrate surface is typically a function of the surface energy of the substrate surface and the surface tension of the liquid. At the liquid-substrate surface interface, if the molecules of the liquid have a stronger attraction to the molecules of the substrate surface than to each other (the adhesive forces are stronger than the cohesive forces), then wetting of the substrate surface generally occurs. Alternatively, if the molecules of the liquid are more strongly attracted to each other than to the molecules of the substrate surface (the cohesive forces are stronger than the adhesive forces), then the liquid generally beads-up and does not wet the surface of the substrate. One way to quantify surface wetting characteristics of a liquid on a surface of a substrate is to measure the contact angle of a drop of liquid placed on that surface. The contact angle is the angle formed by the solid/liquid interface and the liquid/vapor interface measured from the side of the liquid. Typically, a decrease in the contact angle between the liquid and the surface correlates with an increase in wetting.

For many applications (e.g., sensors and microfluidic devices), the ability to precisely control the wetting and/or flow of a liquid on a surface of a substrate according to a precise high-resolution pattern can be important. Thus, it would be desirable to have additional methods and materials that can provide such control.

Surface energy gradients are useful for transporting small fluid volumes in analytical or medical devices while reducing or eliminating external forces. A microfluidic product using these gradients needs less energy to operate and could be shrunk to smaller sizes to be less invasive. In addition, the use of surface energy gradients to control fluid flow, including stopping and initiating flow within the microfluidic product can reduce or eliminate the need for expensive pumps and controllers in the overall system, greatly reducing the cost of current systems. A microfluidic product utilizing these gradients could be produced at similar or lower cost than current products and would also reduce the cost and complexity of external hardware and also the size of any individual components (analytical slides, cartridges, etc.). In addition, because the gradients can be created with small, precise dimensions, a component utilizing one or more surface energy gradients can also reduce the amount of solution used in the system. Because of the improved fluid transport properties due the surface energy gradients, the amount of solution loss due to hold-up in channels, wells, passages, etc. would also be greatly reduced.

New devices using surface energy gradients would have a great benefit. The invention has particular value for product applications that use high-volume, disposable parts.

SUMMARY

An embodiment of the invention is a microfluidic product that uses surface energy gradients to control fluid flow within channels and other fluid passages (tubes, shunts, other cross-section geometries, etc). The composition of the gradients as well as the degree of the gradient can be adjusted to control different aspects of fluid flow, including fluid velocity and stopping and starting fluid flow. The microfluidic product can use one or more gradient compositions in a plurality of channels to provide for different flow rates within different channels on a single product.

One embodiment is a microfluidic product that utilizes surface energy gradients for fluid control comprising a plurality of fluid passages wherein the fluid passages each comprise a top and a bottom surface wherein at least one fluid passage comprises a gradient surface energy region beginning at a proximal location on a surface of the fluid passage and ending at a distal location on a surface of the fluid passage. The product can include uniform regions and surface gradient regions in the same passage. Coating compositions and product dimensions can be selected to provide control over different flow properties including fluid velocity, reduction and acceleration of fluid flow, and starting and stopping fluid flow.

In an embodiment, the microfluidic product comprises one or more fluid passages wherein a first fluid passage comprises a top and a bottom surface wherein the first fluid passage comprises a coating configured to control liquid flow wherein the coating comprises a gradient surface energy coating from a proximal location to a distal location on a surface of the fluid passage. In an embodiment, the microfluidic product comprises a plurality of fluid passages wherein the plurality of fluid passages comprise a first fluid passage and a second fluid passage, each with a top and a bottom surface, wherein both the first fluid passage and the second fluid passage comprise a coating configured to control liquid flow wherein the coating comprises a gradient surface energy coating from a proximal location to a distal location on a surface of the fluid passage. In an embodiment, the contact angle formed with water and a surface at a proximal location of the surface energy gradient in the first fluid passage is different from the contact angle formed with water and a surface at a proximal location of the surface energy gradient in the second fluid passage. In an embodiment, the contact angle formed with water and a surface at a distal location of the surface energy gradient in the first fluid passage is different from the contact angle formed with water and a surface at a distal location of the surface energy gradient in the second fluid passage. In an embodiment, the first fluid passage and the second fluid passage are in fluid communication with each other. In an embodiment, the microfluidic product further comprises a fluid passage that is not coated. In embodiments, the fluid passages comprise rectangular or non-rectangular channels. In embodiments, the fluid passages comprise circular channels. In embodiments, the fluid passages comprise non-circular channels. In embodiments, the coating configured to control liquid flow is on the bottom surface of the fluid passage. In embodiments, the coating configured to control liquid flow is on the top surface of the fluid passages. In embodiments, the top and bottom surfaces of the fluid passages are coated with different coating compositions.

U.S. Pat. No. 7,790,265 discloses surface energy gradients comprised of mixed monolayer films and discloses different methods for producing such gradients. The entire content of U.S. Pat. No. 7,790,265 patent is incorporated by reference into this application.

The surface can be a wide variety of materials including metals, glasses, plastics, ceramics, etc. In addition, the surface can be a base substrate of either rigid or flexible material that contains a base coating. The base coating can be metallic, ceramic, or polymeric.

In an embodiment the surface is a nonwoven material or a film or other flexible material. In an embodiment, the nonwoven material or film comprises a metallic coating such as aluminum, nickel, gold, silver, copper, or other materials. Multiple methods can be used to apply metallic coatings to different film or nonwoven surfaces.

One embodiment of the invention is an analytical device wherein the surface energy gradient resides on a flexible film and the film is attached to or placed in contact with the top or bottom surface of a plastic material containing channels and/or wells intended for fluid transport and/or analysis. The film can be used to seal the top or bottom of the channel (or both the top and bottom) to form a device with channels containing a surface energy gradient on at least one surface. The width of the gradient coating can be different from the width of the channel. In some instances, it may be desirable to keep the drop confined to the gradient region without touching the plastic, non-gradient walls of the channel. In other instances, it may be desirable from a manufacturing standpoint to manufacture the surface energy gradients in the film with a wider width than the width of the channels and overlay and seal the film over the channels.

There are multiple embodiments of devices that can utilize these methods and designs. Examples of such devices include those disclosed in US patent application US 2008/

087868, "Method and Device for Forming an Assembly" filed Dec. 20, 2008 which is herein incorporated by reference.

DETAILED DESCRIPTION

Figure 1:
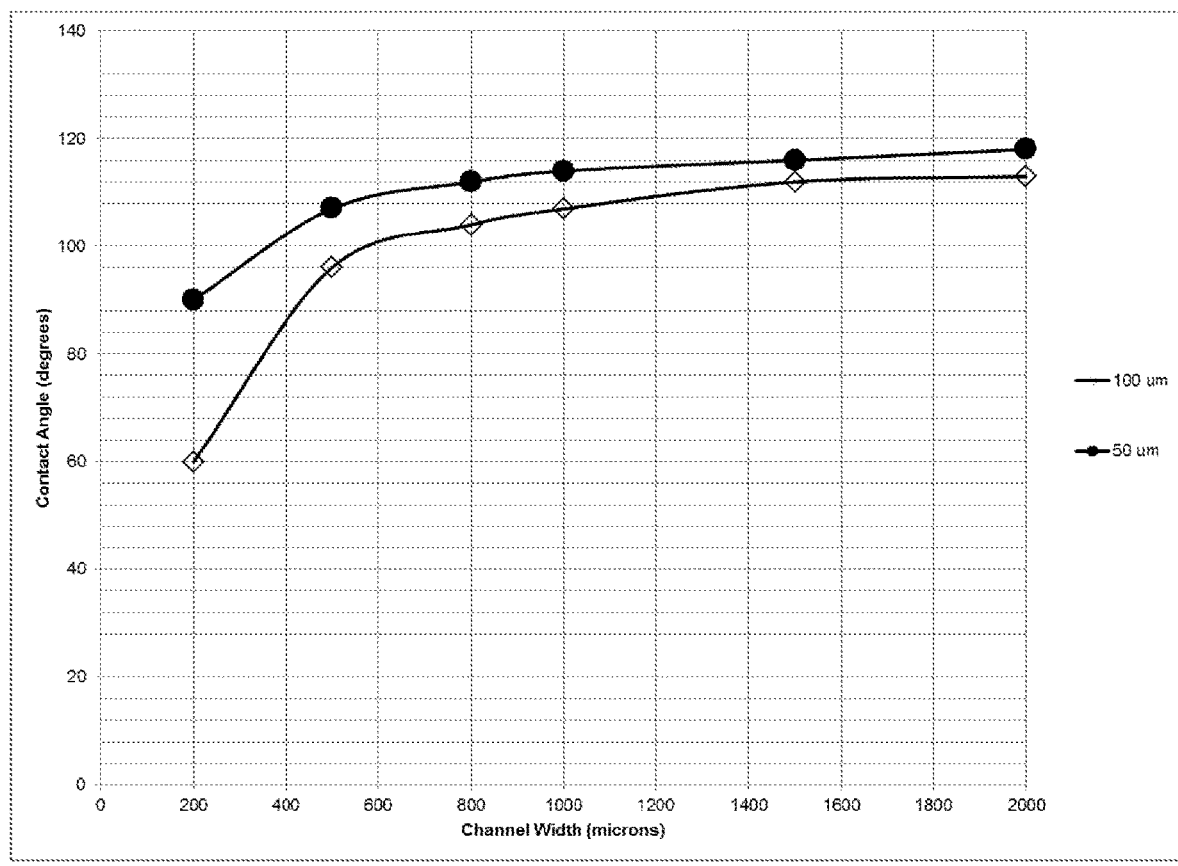
FIG. 1 is a graph showing the initial contact angle required to initiate flow with water in channels with channel widths ranging from 200 micron to 2000 microns (2 mm).

Current diagnostic and other systems using microfluidic cartridges are plagued by high hardware cost and/or poor control over fluid flow. High hardware costs are often primarily due to expensive pumps and control systems which can be 80 percent or more of the system cost. Flow in cartridges is typically disrupted by bubbles and other surface variances; and relatively long (sometimes serpentine) fluid paths increase the difficulty in controlling fluid flows. In addition, long fluid path lengths result in higher use of fluid and higher waste of fluid due to hold-up within the channels and/or passages.

There is a need to control the delivery, flow control, and analysis of precise volumes of fluid within microfluidic devices. Surface energy gradients can be used to improve or provide these functions within a microfluidic device. The microfluidic products of the invention can improve the accuracy and performance of diagnostic and other systems while also reducing their size. In an embodiment, separate channels in the microfluidic product are coated with different gradient compositions to provide for different fluid flow rates in the separate channels. In an embodiment, at least one fluid passage comprises a coating configured to control liquid flow wherein fluid flow is initiated at the beginning of the passage, and fluid flow velocity is stopped or reduced by at least 50 percent within the passage. In an embodiment, at least one fluid passage comprises a coating configured to control liquid flow wherein fluid flow is initiated at the beginning of the passage, and fluid flow velocity is increased by at least 10 percent within the passage. In an embodiment, at least one fluid passage comprises a coating configured to control liquid flow wherein fluid flow is initiated at the beginning of the passage, and fluid flow velocity is increased by at least 20 percent within the passage. In an embodiment, at least one fluid passage comprises a coating configured to control liquid flow wherein fluid flow is initiated at the beginning of the passage, and fluid flow velocity is increased by at least 100 percent within the passage. In an embodiment, the invention allows for fluids to be moved through microfluidic products without using pumps or control systems. In an embodiment, at least one fluid passage comprises a coating configured to control liquid flow wherein fluid flow is initiated at the beginning of the passage, and fluid flow velocity is decreased by at least 50 percent within the passage. In an embodiment, at least one fluid passage comprises a coating configured to control liquid flow wherein fluid flow is initiated at the beginning of the passage, and fluid flow velocity is decreased by at least 10 percent within the passage. In an embodiment, at least one fluid passage comprises a coating configured to control liquid flow wherein fluid flow is initiated at the beginning of the passage, and fluid flow velocity is decreased by at least 20 percent within the passage. In an embodiment, at least one fluid passage comprises a coating configured to control liquid flow wherein fluid flow is initiated at the beginning of the passage, and fluid flow velocity is decreased by at least 100 percent within the passage. In an embodiment, the invention allows for fluids to be moved through microfluidic products without using pumps or control systems. In an embodiment, a plurality of channels of the microfluidic product are in liquid communication with each other but the fluid flow velocities in the channels are different.

Coatings can also be applied to the areas of the product that are adjacent to the entrance and exit of the channels. The composition of the coating in the areas adjacent to the entrances and exits of the channels can be selected based on the composition of the coating inside the channel and the fluid flow properties desired. In an embodiment, the areas of the microfluidic product that are adjacent to the entrance and exit of the channel are coated. In another embodiment, areas of the microfluidic product that are adjacent to the entrance and exit of the channel are not coated.

A wide range of methods can be used to create the coatings on the microfluidic products. In self-assembled patterning the physical chemical properties of a molecule or combination of molecules are exploited under specific conditions to produce distributions of molecules with known properties. For example, a self-assembled monolayer of alkanethiols on gold will often have a high degree of order that results from intermolecular interactions between the components of the molecules. In directed patterning, the position of molecules is controlled by information that is brought in from the outside, such as a mask or a template. Directed patterning methods can in turn be divided into two types: lithographic approaches and writing approaches. Lithographic approaches include methods where a physical template such as a mask or a mold is used to transfer a pattern to an object. Examples include conventional photolithography and microcontact printing. In contrast, writing approaches use a serial approach to transfer a pattern, typically from a computer-based representation such as a CAD (computer assisted design) drawing, to an object. Electron beam lithography is a writing approach, by the definition used here. In general, lithographic approaches can produce many copies of the same pattern; writing approaches are often used for producing unique patterns for producing a large number of different patterns, or for changing patterns quickly. Useful digital application methods include, for example, spray jet, valve jet, and inkjet printing methods. Techniques and formulation guidelines are well known (see, for example, "Kirk-Othmer Encyclopedia of Chemical Technology", Fourth Edition (1996), volume 20, John Wley and Sons, New York, pages 112-117, the disclosure of which is incorporated herein by reference) and are within the capability of one of ordinary skill in the art. Combinations of these methods may also be employed.

Fluid materials used in practice of the present invention may be applied to any portion of the substrate surface by various techniques including, for example, moving the substrate relative to a fixed applicator, or by moving an applicator relative to the substrate. Accordingly, methods of the current invention are capable of forming detailed coating patterns on a surface of a microfluidic product.

In an embodiment of the microfluidic product of the invention, the width of the coating configured to control liquid flow is substantially equal to the width of the fluid passage. In some embodiments, the width of the coating configured to control liquid flow can be greater or less than the width of the fluid passages. In an embodiment, the coating configured to control liquid flow comprises a surface energy gradient region. In some instances, it may be desirable to keep the liquid confined to the surface energy gradient region without touching the walls of the fluid passage. In other instances, it may be desirable (for example, from a manufacturing standpoint) to manufacture the coatings with a wider width than the width of the fluid passages.

A "microfluidic product" is defined as any product that comprises one or more fluid passages wherein the volume capacity of any single fluid passage is no more than than 100 microliters. In an embodiment, at least one fluid passage has a volume of no more than 50 microliters. In an embodiment, at least one fluid passage has a volume of no more than 20 microliters. In an embodiment, at least one fluid passage has a volume of no more than 5 microliters. In an embodiment, at least one fluid passage has a volume of no more than 1 microliter.

The capillary pressure within a channel can be predicted by the following equation.

$$P = gam/h * (\cos(thet1) + \cos(thet2) - (2*h/w)) \quad \text{Eq 1}$$

where
P=Pressure
gam=surface tension of the liquid
h=channel height, distance between top and bottom surfaces
thet1=contact angle between liquid and bottom surface
thet2=contact angle between liquid and top surface
w=width of channel To initiate flow into a channel, the capillary pressure must be greater than 0. As can be seen from the equation, capillary pressure is a function of the contact angle the liquid forms with the top and bottom surfaces, the channel dimensions, and the liquid surface energy. Each of these parameters can be adjusted to control the entrance of a liquid into a capillary channel. Similar equations for different geometric shapes and varying cross-sections can be derived. A graph of capillary pressure as calculated in Equation 1 as a function of contact angle will show that the relationship between capillary pressure and contact angle is approximately linear for contact angle values between 30 and 130 degrees. This relationship indicates that velocity can be controlled within a channel by changing the contact angle in a controlled manner. Using the equations for drag in a capillary channel along with equation 1 for calculating the capillary pressure, coating compositions can be configured to produce controlled surface energy gradient coatings that can be used to provide a controlled, or even constant, fluid velocity over the length of a channel. Coatings can be configured to control liquid flow by providing coating compositions that control the initial contact angle at the beginning of the channel, by providing coating compositions that change the contact angle over the length of the channel, and by providing coating compositions that increase or decrease the rate of change of the contact angle over the length of the channel. The degree of the surface energy gradient can be changed by changing the coating composition over the length of the channel. For example, a coating could be configured on one channel surface that would provide a contact angle of 100 degrees at the entrance to a channel and that would then reduce the contact angle by 10 degrees every 5 mm for a given length of the channel. To increase or decrease the velocity in different channels, coatings can be configured that change the rate of the contact angle change over the length of the channel—to provide a higher fluid velocity, the rate of change in the contact angle per length could be increased; to provide a lower fluid velocity, the rate of change in the contact angle could be decreased. Average liquid velocity in the fluid channels due to the change in capillary pressure provided by the surface energy gradient can be varied from a low of 0 mm/s to more than 15 cm/s depending on the fluid properties and the channel dimensions. In embodiments, the average fluid velocity can be over 30 cm/s. The average fluid velocity can also be increased further by increasing the liquid head pressure from the fluid.

The microfluidic product can comprise one or more channels having a top and a bottom surface wherein the channel comprises a coating configured to control liquid flow wherein the coating comprises a gradient surface energy coating from a proximal location to a distal location on a top or bottom surface of the channel. In an embodiment, the microfluidic product can comprise a plurality of channels wherein the plurality of channels further comprise a first channel and a second channel wherein the first channel and the second channel are in fluid communication with each other. In an embodiment, the plurality of channels comprise a first channel and a second channel each with a top and a bottom surface wherein the first channel and the second channel are in fluid communication with each other and wherein both the first channel and the second channel comprise a coating configured to control liquid flow wherein the coating comprises a gradient surface energy coating from a proximal location to a distal location on a surface of the channel. In an embodiment, the composition of the coating in the first channel is different from the composition of the coating in the second channel.

Surface energy gradients can be characterized by the contact angle that water forms with the coated surface; for surfaces comprising a surface energy gradient region, the contact angle formed with water and the surface at a proximal location of the region will be different than the contact angle formed with water and the surface at a distal end of the region. In embodiments, the difference between the contact angle and a surface at the proximal location of the region with the surface energy gradient and the contact angle at a surface at the distal location of the region with the surface energy gradient will be at least 10 degrees. In embodiments, the difference between the contact angle and a surface at the proximal location of the region with the surface energy gradient and the contact angle at a surface at the distal location of the region with the surface energy gradient will be at least 20 degrees. In embodiments, the difference between the contact angle and a surface at the proximal location of the region with the surface energy gradient and the contact angle at a surface at the distal location of the region with the surface energy gradient will be at least 30 degrees. In embodiments, the difference between the contact angle and a surface at the proximal location of the region with the surface energy gradient and the contact angle at a surface at the distal location of the region with the surface energy gradient will be at least 40 degrees. In embodiments, the difference between the contact angle and a surface at the proximal location of the region with the surface energy gradient and the contact angle at a surface at the distal location of the region with the surface energy gradient will be at least 50 degrees. In embodiments, the difference between the contact angle and a surface at the proximal location of the region with the surface energy gradient and the contact angle at a surface at the distal location of the region with the surface energy gradient will be at least 60 degrees. In embodiments, the difference between the contact angle and a surface at the proximal location of the region with the surface energy gradient and the contact angle at a surface at the distal location of the region with the surface energy gradient will be at least 70 degrees. In embodiments, the difference between the contact angle and a surface at the proximal location of the region with the surface energy gradient and the contact angle at a surface at the distal location of the region with the surface energy gradient will be at least 80 degrees. In embodiments, the difference between the contact angle and a surface at the proximal location of the region with the surface energy gradient and the contact angle at a surface at the distal location of the region with the surface energy gradient will be at least 90 degrees. In embodiments, the difference between the contact angle and a surface at the proximal location of the region with the surface energy gradient and the contact angle at a surface at the distal location of the region with the surface energy gradient will be at least 100 degrees. In embodiments, the difference between the contact angle and a surface at the proximal location of the region with the surface energy gradient and the contact angle at a surface at the distal location of the region with the surface energy gradient will be at least 110 degrees.

In an embodiment, the contact angle formed between water and a surface at the proximal location of the surface energy gradient region is greater than 120 degrees. In an embodiment, the contact angle formed between water and a surface at the proximal location of the surface energy gradient region is greater than 100 degrees. In an embodiment, the contact angle formed between water and a surface at the proximal location of the surface energy gradient region is greater than 60 degrees. In an embodiment, the contact angle formed between water and a surface at the proximal location of the surface energy gradient region is greater than 40 degrees. In an embodiment, the contact angle formed between water and a surface at the proximal location of the surface energy gradient region is greater than 20 degrees. In embodiments, the contact angle formed between water and a surface at the proximal location of the surface energy gradient region is between 90 and 120 degrees and the contact angle formed between water and a surface at the distal location of the region is between 10 and 110 degrees. In embodiments, the contact angle formed between water and a surface at the proximal location of the region is between 90 and 120 degrees and the contact angle formed between water and a surface at the distal location of the region is between 60 and 110 degrees. In embodiments, the contact angle formed between water and a surface at the proximal location of the region is between 90 and 120 degrees and the contact angle formed between water and a surface at the distal location of the region is between 10 and 70 degrees. In embodiments, the contact angle formed between water and a surface at the proximal location of the region is between 50 and 90 degrees and the contact angle formed between water and a surface at the distal location of the region is between 10 and 80 degrees. In embodiments, the contact angle formed between water and a surface at the proximal location of the region is between 50 and 90 degrees and the contact angle formed between water and a surface at the distal location of the region is between 10 and 40 degrees. In embodiments, the contact angle formed between water and a surface at the proximal location of the region is between 50 and 90 degrees and the contact angle formed between water and a surface at the distal location of the region is between 30 and 80 degrees. In embodiments, the contact angle formed between water and a surface at the proximal location of the surface energy gradient region is between 40 and 100 degrees and the contact angle formed between water and a surface at the distal location of the region is between 10 and 100 degrees. In embodiments, the contact angle formed between water and a surface at the proximal location of the region is between 40 and 100 degrees and the contact angle formed between water and a surface at the distal location of the region is between 10 and 70 degrees. In embodiments, the contact angle formed between water and a surface at the proximal location of the region is between 40 and 100 degrees and the contact angle formed between water and a surface at the distal location of the region is between 10 and 40 degrees.

Fluid flow can be decelerated or stopped by configuring the coating so that the contact angle formed with water and a surface at a distal location of the surface energy gradient region is higher than the contact angle formed with water and a surface at a proximal end of the surface gradient region. In embodiments, the contact angle formed between water and a surface at the proximal location of the surface energy gradient region is at least 10 degrees lower than the contact angle formed between water and a surface at a distal location of the region. In embodiments, the contact angle formed between water and a surface at the proximal location of the surface energy gradient region is at least 30 degrees lower than the contact angle formed between water and a surface at a distal location of the region. In embodiments, the contact angle formed between water and a surface at the proximal location of the surface energy gradient region is at least 50 degrees lower than the contact angle formed between water and a surface at a distal location of the region. In embodiments, the contact angle formed between water and a surface at the proximal location of the surface energy gradient region is at least 90 degrees lower than the contact angle formed between water and a surface at a distal location of the region.

In an embodiment, the microfluidic product comprises a plurality of channels wherein the plurality of channels comprise a first channel and a second channel each with a top and a bottom surface wherein both the first channel and the second channel comprise a coating configured to control liquid flow wherein the coating comprises a gradient surface energy coating from a proximal location to a distal location on a surface of the channel. In an embodiment, the contact angle formed with water and a surface at a proximal location of the surface energy gradient in the first channel is different from the contact angle formed with water and a surface at a proximal location of the surface energy gradient in the second channel. In an embodiment, the contact angle formed with water and a surface at a distal location of the surface energy gradient in the first channel is different from the contact angle formed with water and a surface at a distal location of the surface energy gradient in the second channel. In an embodiment, the first channel and the second channel are in fluid communication with each other. In an embodiment, the microfluidic product further comprises a channel that is not coated.

Coating compositions can be configured to produce controlled surface energy gradient coatings that can be used to provide a controlled, or even constant, fluid velocity over the length of a channel. By providing different individual channels with different coating compositions, the surface energy gradient can be varied in each channel, resulting in different linear velocities for the fluid in individual channels. This feature allows for a slow reaction or process to take place in a first channel and a faster reaction or process to take place in a second channel, all on the same layer of the microfluidic product while keeping the same length, width, and height dimensions for the first and second channel. In some cases, serpentine paths and other long flow paths can be eliminated from the design of the microfluidic product, resulting in simpler manufacturing designs and smaller overall product dimensions. Using coatings providing surface energy gradients, linear velocities for liquids such as water in the range of 0-30 cm/s can be achieved for microfluidic channels. In an embodiment, linear velocity for the fluid in a first channel is greater than 0.5 mm/sec while linear velocity for the fluid in a second channel is less than 0.1 mm/sec. In an embodiment, the microfluidic product comprises a plurality of channels comprising a first channel and a second channel, each channel having a first surface and a second surface, wherein at least the first channel comprises a coating configured to control liquid flow from a proximal location to a distal location, and the linear velocity of fluid in the first channel is different from the linear velocity of the fluid in the second channel. In embodiments, the plurality of channels comprise a first and a second channel wherein each of the first and second channels have a top surface and a bottom surface, wherein each channel comprises a coating configured to control liquid flow from a proximal location to a distal location, and the linear velocity of fluid in the first channel is different from the linear velocity of the fluid in the second channel. In embodiments, the plurality of channels comprises a first channel and a second channel wherein the linear velocity of the liquid in the first channel is equal to the linear velocity of the liquid in the second channel. In embodiments, the linear velocity of liquid in a first channel is no less than 10 percent higher than the linear velocity of liquid in a second channel. In embodiments, the linear velocity of liquid in a first channel is no less than 20 percent higher than the linear velocity of liquid in a second channel. In embodiments, the linear velocity of liquid in a first channel is no less than 50 percent higher than the linear velocity of liquid in a second channel. In embodiments, the linear velocity of liquid in a first channel is no less than 100 percent higher than the linear velocity of liquid in a second channel. In embodiments, the linear velocity of liquid in a first channel is no less than 200 percent higher than the linear velocity of liquid in a second channel. In embodiments, the linear velocity of liquid in a first channel is no less than 300 percent higher than the linear velocity of liquid in a second channel. In embodiments, the linear velocity of liquid in a first channel is no less than 500 percent higher than the linear velocity of liquid in a second channel. In embodiments, the linear velocity of liquid in a first channel is no less than 1000 percent higher than the linear velocity of liquid in a second channel. In embodiments, the linear velocity of liquid in a first channel is no less than 2000 percent higher than the linear velocity of liquid in a second channel. In embodiments, the linear velocity of liquid in a first channel is no less than 5000 percent higher than the linear velocity of liquid in a second channel. In embodiments, the linear velocity of liquid in a first channel is no less than 10,000 percent higher than the linear velocity of liquid in a second channel. In embodiments, the linear velocity of liquid in a first channel is no less than 50,000 percent higher than the linear velocity of liquid in a second channel.

In embodiments, the linear velocity of liquid in a first or second channel is no more than 0.02 mm/s. In embodiments, the linear velocity of liquid in a first or second channel is no more than 0.1 mm/s. In embodiments, the linear velocity of liquid in a first or second channel is no more than 1 mm/s. In embodiments, the linear velocity of liquid in the first or second channel is no more than 5 mm/s. In embodiments, the linear velocity of liquid in a first or second channel is no more than 10 mm/s. In embodiments, the linear velocity of liquid in the first or second channel is no more than 15 mm/s. In embodiments, the linear velocity of liquid in a first or second channel is no more than 20 mm/s. In embodiments, the linear velocity of liquid in the first or second channel is no more than 50 mm/s. In embodiments, the linear velocity of liquid in the first or second channel is no more than 100 mm/s. In embodiments, the linear velocity of liquid in a first or second channel is no more than 200 mm/s. In embodiments, the linear velocity of liquid in the first or second channel is no more than 300 mm/s. In embodiments, the linear velocity of liquid in a first or second channel is no less than 0.005 mm/s. In embodiments, the linear velocity of liquid in the first or second channel is no less than 0.01 mm/s. In embodiments, the linear velocity of liquid in a first or second channel is no less than 0.05 mm/s. In embodiments, the linear velocity of liquid in the first or second channel is no less than 0.1 mm/s. In embodiments, the linear velocity of liquid in a first or second channel is no less than 0.5 mm/s. In embodiments, the linear velocity of liquid in the first or second channel is no less than 1 mm/s. In embodiments, the linear velocity of liquid in a first or second channel is no less than 5 mm/s. In embodiments, the linear velocity of liquid in the first or second channel is no less than 10 mm/s. In embodiments, the linear velocity of liquid in the first or second channel is no less than 50 mm/s. In embodiments, the linear velocity of liquid in a first or second channel is no less than 100 mm/s. In embodiments, the linear velocity of liquid in the first or second channel is no less than 200 mm/s.

The coating can be configured with a coating composition that provides a surface energy gradient region on a surface from a proximal location to a distal location wherein the contact angle formed between water and the surface at a proximal location of the region is different from the contact angle formed between water and the surface at a distal location of the region. The coating can be configured so that the contact angle changes in a continuous fashion or in a step-wise fashion on the surface from a proximal location to a distal location. In embodiments, the proximal location corresponds to the channel entrance, and the distal location corresponds to the channel exit. In embodiments, the proximal location corresponds to a location downstream of the channel entrance. In embodiments, the proximal location corresponds to a location on the channel that is at the mid-point between the channel entrance and the channel exit. In embodiments, the proximal location corresponds to a location on the channel that is downstream of the mid-point between the channel entrance and the channel exit. In embodiments, the proximal location corresponds to a location on the channel that is upstream of the mid-point between the channel entrance and the channel exit. In embodiments, the distal location corresponds to a location upstream of the channel exit. In embodiments, the distal location corresponds to a location on the channel that is at the mid-point between the channel entrance and the channel exit. In embodiments, the distal location corresponds to a location on the channel that is downstream of the mid-point between the channel entrance and the channel exit. In embodiments, the proximal location corresponds to a location on the channel that is upstream of the mid-point between the channel entrance and the channel exit. In embodiments the distance between the proximal location and the distal location can be no less than 1 millimeters. In embodiments the distance between the proximal location and the distal location can be no less than 3 millimeters. In embodiments the distance between the proximal location and the distal location can be no less than 5 millimeters. In embodiments the distance between the proximal location and the distal location can be no less than 10 millimeters. In embodiments the distance between the proximal location and the distal location can be no less than 15 millimeters. In embodiments the distance between the proximal location and the distal location can be no less than 20 millimeters. In embodiments the distance between the proximal location and the distal location can be no less than 25 millimeters. In embodiments the distance between the proximal location and the distal location can be no less than 50 millimeters. In embodiments the distance between the proximal location and the distal location can be no less than 100 millimeters. In embodiments, the distance between the proximal location and the distal location can be no more than 0.1 millimeters. In embodiments, the distance between the proximal location and the distal location can be no more than 0.5 millimeters. In embodiments, the distance between the proximal location and the distal location can be no more than 1 millimeter. In embodiments, the distance between the proximal location and the distal location can be no more than 5 millimeters. In embodiments, the distance between the proximal location and the distal location can be no more than 10 millimeters. In embodiments, the distance between the proximal location and the distal location can be no more than 25 millimeters. In embodiments, the distance between the proximal location and the distal location can be no more than 50 millimeters. In embodiments, the distance between the proximal location and the distal location can be no more than 200 millimeters. In embodiments, the distance between the proximal location and the distal location can be no more than 500 millimeters.

The composition of the coating as well as the channel dimension can be adjusted based on the particular liquid used and the liquid properties including viscosity, density, surface tension, and the contact angle the liquid forms with the coating or surface to configure the coating to provide flow control for many different microfluidic systems using many different fluids. Preferred methods and materials for creating coatings will vary for many reasons including the substrate used for the surface, the chemical species selected, the surface activation method chosen, cost, fluid solutions selected, and operating conditions for the process. The surfaces of the fluid channels can comprise coated and uncoated regions.

Microfluidic products can be created by many known methods including machining, micromolding, embossing, additive manufacturing, thermoforming, injection molding, laser-etching, chemical etching, UV-exposure, chemical or physical deposition, etc. These methods can also be used to create the flow passages and wells configured to allow liquid flow through the device. Components and sub-assemblies of the microfluidic products can be produced by one or more manufacturing method and then combined with other components and sub-assemblies manufactured by a different method. For the invention many possible materials can be used as the material for the microfluidic products of the invention; suitable materials include PTFE, polycarbonate, polypropylene, polyethylene, PDMS, polyester, nylon, PMMA, COC polymer, acrylic, glasses, metals, ceramics, etc. The microfluidic products of the invention can be fabricated using other different manufacturing methods, such as photolithography techniques, micromachining technology, or additive manufacturing. Such methods that may be used to fabricate channels, substrates, and products according to the invention are well known in the art and include film deposition processes, such as spin coating and chemical vapor deposition, laser fabrication or photolithographic techniques, or etching methods, which may be performed either by wet chemical or plasma processes.

Microfluidic products may be constructed using different manufacturing techniques. For example, the microfabrication methods used to make microchips in the computer industry may also be used to create microfluidic products, enabling the creation of intricate, minute patterns of interconnected channels. Once a pattern is created, microchip manufacturing methods can be employed to recreate the channel design on a surface, layer, or component of the microfluidic product. In some instances, chemical etching or stamping techniques can be employed. As a result, highly precise channels with dimensions that can be varied in their width and depth may be produced. Once the pattern is produced, a cover plate can be affixed or sealed over the surface so as to form conduits in combination with the channels.

Different solid substrate materials may be used in practice of the present invention. For example, useful substrates may be opaque, translucent, clear, textured, patterned, rough, smooth, rigid, flexible, treated, primed, or a combination thereof. The substrate typically comprises organic and/or inorganic material. The substrate may be, for example, thermoplastic, thermoset, or a combination thereof. Exemplary substrates include films, plates, tapes, rolls, molds, sheets, blocks, molded articles, fabrics, and fiber composites (e.g., circuit boards), and may comprise at least one organic polymer such as polyimide, polyester, acrylic, polyurethane, polyether, polyolefin (e.g., polyethylene or polypropylene), polyolefin-copolymer, polyimide, and combinations thereof. Exemplary inorganic substrates include metals (e.g., chromium, aluminum, copper, nickel, silver, gold, steel, and alloys thereof), ceramics, glass, china, quartz, polysilicon, and combinations thereof. For microfluidic products comprised of laminated layers, each layer can comprise a different substrate material. The product can comprise a plurality of layers. In embodiments, the plurality of layers comprises a first layer and a second layer wherein the first layer comprises a different polymer than the second layer. In embodiments, the plurality of layers comprises a first layer and a second layer wherein the first layer comprises the same polymer as the second layer. In embodiments, the fluid passages of the microfluidic products can be located at any position within the cartridge and oriented at any angle. In an embodiment, the fluid passages are located, primarily, in planar networks, located proximate to the outside surfaces to allow for a multi-layered cartridge design that uses, e.g., machined, die-cut, laser-cut and/or molded cartridge body component. In embodiments, fluid passage geometries include passages with cross-sections that are circular, oval, square or rectangular in cross-section. Width and height can vary widely from nm to cm ranges depending on the application, sample volume and cartridge design. Ranges for the height are 0.02 to 2 mm, more preferably, 0.05 to 1.5 mm, most preferably 0.05 mm to 1 mm.

The fluidic network may be formed within the cartridge in a number of different ways, dependent, in part, upon the materials chosen for the cartridge. Any known fabrication method appropriate to the cartridge body material may be employed including, but not limited to, stereolithography, chemical/laser etching, integral molding, machining, lamination, etc. Such fabrication methods may be used alone or in combination. In certain embodiments of the invention, the cartridge comprises a cartridge body and one or more cover layers mated to surfaces of the cartridge body so as to define one or more fluidic networks preferably, planar fluidic networks) therebetween. Similarly, z-transitions and/or ports can be selectively molded into, or machined out of, the cartridge body at predetermined locations to form the fluidic connections between the fluid passages on the upper and lower surfaces.

One embodiment of the cartridge may be fabricated using a "lamination" process whereby the cartridge body's functional surfaces are sealed using cover layers to form the fluidic network. For example, recesses (e.g., channels, grooves, wells, etc.) can be manufactured into one or more surfaces of the cartridge body to provide a recessed pattern of the fluidic network. Sealing/mating of the recessed patterns to cover layers forms a fluidic network comprising fluidic components (e.g., conduits, chambers, etc.) at least some of which are defined in part by the recesses in the cartridge body and in part by a surface of a cover layer. In an embodiment, the cover layers are comprised of plastic film. The cover layer may be coated with an adhesive to seal the cover layer against the cartridge layer. Other methods for mating the cover layer to the cartridge body will be known to the skilled artisan, e.g., the seal may be achieved by heat sealing, ultrasonic welding, RF (radio frequency) welding, by solvent welding (applying a solvent between the components that softens or partially dissolves one or both surfaces), by use of an intervening adhesive layer (e.g., a double sided adhesive tape, etc.). Advantageously, cartridge features that are created by patterned deposition (e.g., patterned deposition of electrode or dielectric layers and/or patterned deposition of reagents to form dry reagent pills or to form binding domains with immobilized binding reagents) are created on cover layers so as to take advantage of automation available to process plastic film in large sheets or rolls.

Recesses may be, e.g., molded in, etched in or machined from the cartridge body. By analogy, fluidic components may also be defined, at least in part, by recesses in a cover layer that is mated to a cartridge body. Fluidic components may also be defined, at least in part, by regions cutout from gasket layers disposed between the cartridge body and cover layers. Apertures in the cartridge body and/or cover layers may be used to provide for access ports to the fluidic network, e.g., sample introduction ports, vent ports, reagent addition ports and the like. Vent ports can be used to allow the equilibration of fluid in the chambers with the atmosphere or to allow for the directed movement of fluid into or out of a specified chamber by the application of positive or negative pressure. Vent ports are designed to prevent the leakage of liquid samples or reagents through the ports and may include aerosol-resistance filters, membrane or filter materials that permit air flow but act as barriers to liquid solutions and materials that are porous to air but seal when they come in contact with solutions.

The products of the invention can comprise a surface comprising a glass, metal, metal oxide, or polymer surface. In an embodiment, the surface is a metal oxide comprising a metal oxide from the group comprising silica, alumina, quartz, glass, or the like and the coating configured to control liquid flow comprises carboxylic acid moiety. In an embodiment, the base surface is a metal selected from the group comprising gold, silver, copper, cadmium, zinc, palladium, platinum, mercury, lead, iron, chromium, manganese, tungsten, and any of their alloys, and the coating comprises a sulfur-containing moiety (e.g.thiols, sulfides, disulfides, and the like). In another embodiment, the surface is doped or undoped silicon and the coating comprises a silane or chlorosilane species. In another embodiment, the surface is a metal selected from the group comprising palladium and platinum and the coating comprises a nitrites or isonitrile species. In an embodiment, the surface is copper and the coating comprises a hydroxamic acid species. In another embodiment, the surface is gold and the coating comprises at least one sulfur-containing functional group selected from the group comprising thiols, sulfides, or disulfides. In an embodiment, the product of the invention comprises a surface comprising a cylic olefin copolymer. In an embodiment, the microfluidic product of the invention comprises a surface comprising a dielectric material.

In embodiments, the surfaces of the fluid passages can comprise polymeric species selected to exhibit one or more properties desired for the surface or other substrate to which the polymer molecules are bonded. In embodiments, the coating configured to control liquid flow in the microfluidic product can comprise polymeric species selected to exhibit one or more properties desired for the surface or other substrate to which the polymer molecules are bonded. For example, it may be desired in some instances to provide polymeric species with very hydrophilic properties, in which case polymer species such as hyaluronic acid may be employed. The polymer polyethylene glycol may be employed to repel proteins from a surface. Heparin, a polysaccharide, may be used to impart antithrombogenic characteristics, and chitosan may be employed to provide hemostatic properties. In another embodiment, the polymer species comprises ionic, nonionic, polar, nonpolar, halogenated, alkyl, aryl or other functionalities.

In embodiments, the compounds used to form the coating compositions for the coating configured to control liquid flow can have the general formula X-J-M where X represents a species that forms the bond to the surface, J represents a spacer moiety or polymer backbone species, and M represents a functional group that is provided to the surface of the coating.

Species X1, X2, . . . Xn can be selected based on the surface materials and bonding requirements desired. Species J1, J2, . . . Jn can be selected based on the properties of the polymer chain desired, including chain length, film stability, cross-linking capabilities, reactivity, etc. Species M1, M2, . . . Mn can be selected based on the surface energy properties desired as well as other functional properties desired including reactivity, adsorption, bonding, etc. In embodiments, multiple n solutions comprising compounds of Xn-Jn-Mn can be used. In embodiments, X-J-M compounds can form self-assembled monolayers from solution.

In embodiments, the functional group M1, M2, . . . Mn is selected from the group comprising ionic, nonionic, polar, nonpolar, halogenated, alkyl, aryl or other functionalities, In other embodiments, the functional group M1, M2, . . . Mn can include any one of the following: —OH, —CONHR, —CONHCOR, —NHR, —COOH, —COOR, —CSNHR, —COR, —RCSR, —RSR, —ROR, —SOOR, —RSOR, —CONR$_2$, —(OCH$_2$ CH$_2$)$_n$OH, —(OCH$_2$ CH$_2$)$_n$OR—CH$_3$, —NR$_2$, —CN, —(CF$_2$)$_n$CF$_3$, —CO$_2$CH$_3$, —CONHCH$_3$, —CR, CHCH$_2$, —OCH$_2$CF$_2$CF$_3$, Cl, Br, olefins, and the like, and any combination thereof.

In the above list, R is hydrogen or an organic group such as a hydrocarbon or fluorinated hydrocarbon. As used herein, the term "hydrocarbon" includes alkyl, alkenyl, alkynyl, cycloalkyl, aryl, alkaryl, aralkyl, and the like. The hydrocarbon group may, for example, comprise methyl, propenyl, ethynyl, cyclohexyl, phenyl, tolyl, and benzyl groups. The term "fluorinated hydrocarbon" is meant to refer to fluorinated derivatives of the above-described hydrocarbon groups.

In another embodiment, J is a hydrocarbon chain with the formula—$(CH_2)_n$—where n is between 1 and 22, preferably between 2 and 18, more preferably between 2 and 12. In some embodiments using metal oxide base surfaces, the functional group X is a carboxylic acid.

In an additional embodiment, the base surface is a metal selected from the group comprising gold, silver, copper, aluminum, cadmium, zinc, palladium, platinum, mercury, lead, iron, chromium, manganese, tungsten, and any alloys of the above. In some embodiments using metals for the base surfaces, the functional group X is a sulfur-containing functional group (e.g. thiols, sulfides, disulfides, and the like). In other embodiments, the metal of the base surface is in the form of a metalized film coating a polymer surface.

In another embodiment, the base surface is doped or undoped silicon. In some embodiments using doped or undoped silicon for the base surface, the functional group X is selected from the group comprising silanes or chlorosilanes. In another embodiment, the base surface is a metal selected from the group comprising palladium and platinum. In some embodiments using these metals for the base surface, the functional group X is a functional group selected from the group comprising nitrites and isonitriles. In another embodiment, the base surface is copper. In some embodiments using copper for the base surface, the functional group X is a hydroxamic acid. In another embodiment, the base surface is gold. In some embodiments using gold for the base surface, the functional group X is at least one sulfur-containing functional group selected from the group consisting of thiols, sulfides, or disulfides.

In one embodiment a method of derivatizing a surface with a mixed monolayer to create a surface energy gradient comprises the following steps:

a) exposing a base surface having a proximal and a distal location to a first solution comprising a plurality of molecules of the formula X1-J1-M1, wherein X1 and M1 represent separate functional groups and J1 represents a spacer moiety that, together, are able to promote formation from solution of a self-assembled monolayer for sufficient time to form a monolayer surface having a substantially uniform surface energy on the base surface, b) removing a portion of the monolayer of step (a) such that a portion of the base surface is again fully or partially exposed, c) exposing the portion of the base surface from (b) to a second solution comprising a plurality of molecules of the formula X2-J2-M2 and a plurality of molecules of the formula X1-J1-M1 wherein the functional group M2 has a different surface energy from that of the functional group M1 such that a surface energy gradient from a proximal location to a distal location is formed. The X2 and J2 groups for the molecule in the second solution can be the same as the X1 and J1 groups for the molecule in the first solution, or they can be different, depending on the desired final properties of the mixed monolayer.

In some preferred embodiments, at least one of the molecules of formula (X-J-M) chosen to form the coating configured to control liquid flow is resistant to the adsorption of biopolymers such as proteins, enzymes, antibodies, polynucleic acids, cells, and other biological molecules. By the term "resistant to the adsorption of biopolymers" it is meant that the base surface covered by the coating has a reduction in the amount of a biopolymer adsorbed on the surface, when contacted with a medium containing biopolymers available for adsorption, as compared to the amount adsorbed on the same base surface that is not covered by the coating. In some embodiments, the coating configured to control liquid flow is a monolayer.

For some embodiments, the J group of the molecule is a spacer moiety comprising a biopolymer-resistant domain. Suitable moieties for the biopolymer-resistant domain of the J group are discussed in U.S. Pat. No. 6,235,340 and include oligoethers, oligoglycols, oligoalcohols, oligocarbonyls, oligosulfides, oligosulfones and oligosaccharides. Such moieties typically are used to produce a monolayer or other coating that is both hydrophilic and biopolymer-resistant.

In one embodiment, the biopolymer-resistant domain comprises an oligo-(ethylene glycol) linkage $(-OCH_2CH_2-)_n$ where n is 2 to 4.

The surfaces of the fluid passages or the coating configured to control liquid flow may use polymers that are natural or synthetic in origin. Such polymers include oligomers, homopolymers and copolymers resulting from addition or condensation polymerization, and natural polymers including oligosaccharides, polysaccharides, peptides, and proteins. The polymers may include several distinct polymer types, as prepared by terminal or side chain grafting The polymers of the invention may include cellulose-based products such as hydroxyethyl cellulose, hydroxypropyl cellulose, carboxymethyl cellulose, cellulose acetate and cellulose butyrate, acrylics such as those polymerized from hydroxyethyl acrylate, hydroxyethyl methacrylate, glyceryl acrylate, glyceryl methacrylate, acrylic acid, methacrylic acid, acrylamide and methacrylamide, vinyls such as polyvinyl pyrrolidone and polyvinyl alcohol, nylons such as polycaprolactam, polylauryl lactam, polyhexamethylene adipamide and polyhexamethylene dodecanediamide, polyurethanes, polylactic acids, linear polysaccharides such as amylose, dextran, chitosan, and hyaluronic acid, and branched polysaccharides such as amylopectin, hyaluronic acid and hemi-celluloses.

In an embodiment, the surfaces of the fluid passages can comprise latent reactive (e.g., photoreactive) groups bonded to the surface itself. In an embodiment, the coating configured to control liquid flow can comprise latent reactive (e.g., photoreactive) groups bonded to the surface itself. For instance, with ceramic or glass surfaces, a photoreactive silane can be used. Similarly, with surfaces of gold or other noble metals, an intermediate layer can be provided using a photoreactive sulfur compound (e.g., thiol or thioether such as methyl thioxanthone) or other suitable compound. In another embodiment, a SAM (self-assembled monolayer) can be formed at a suitable interface, and optionally transferred to a solid support surface. The surface, in turn, can be provided by a material selected from ceramics, metals and polymeric materials. For instance, the surface can be provided by a material selected from organosilane-pretreated glasses, organosilane-pretreated silicon materials, and silicon hydrides, or by a polymeric material selected from the group consisting of polystyrene, polycarbonate, polyester, polyethylene, polyethylene terephthalate (PET), polyglycolic acid (PGA), polyolefin, poly-(p-phenyleneterephthalamide), polyphosphazene, polypropylene, polytetrafluoroethylene, polyurethane, polyvinyl chloride, polyacrylate (including polymethacrylate), and silicone elastomers, as well as copolymers and combinations thereof.

The surfaces of the fluid passages and/or the coating configured to control liquid flow can comprise a photoreactive group. Photoreactive groups respond to specific applied external stimuli to undergo active specie generation with resultant covalent bonding to an adjacent chemical structure, e.g., as provided by the same or a different molecule. Photoreactive groups are those groups of atoms in a molecule that retain their covalent bonds unchanged under conditions of storage but that, upon activation by an external energy source, form covalent bonds with other molecules. Upon activation of the photoreactive groups, the reagent molecules are covalently bound to each other and/or to the material surface by covalent bonds through residues of the photoreactive groups. The photoreactive groups generate active species such as free radicals and particularly nitrenes, carbenes, and excited states of ketones upon absorption of electromagnetic energy. Photoreactive groups may be chosen to be responsive to various portions of the electromagnetic spectrum, and photoreactive groups that are responsive to e.g., ultraviolet and visible portions of the spectrum are preferred and may be referred to herein occasionally as "photochemical group" or "photogroup". Latent reactive groups can be chosen that are responsive to various portions of the electromagnetic spectrum, with those responsive to ultraviolet and visible portions of the spectrum (referred to herein as "photoreactive") being particularly preferred. In an embodiment, the coating can provide latent reactive groups to the surface, for instance, wherein the surface comprises a ceramic, silicon oxide, metal oxide, or glass surface, and the coating comprises a photoreactive silane.

Photoreactive aryl ketones, such as acetophenone, benzophenone, anthraquinone, anthrone, and anthrone-like heterocycles (i.e., heterocyclic analogs of anthrone such as those having N, O, or S in the 10-position), or their substituted (e.g., ring substituted) derivatives may be used in the coating configured to control liquid flow. The functional groups of such ketones are readily capable of undergoing the activation/inactivation/reactivation cycle described herein. Benzophenone is a preferred photoreactive moiety, since it is capable of photochemical excitation with the initial formation of an excited singlet state that undergoes intersystem crossing to the triplet state. The excited triplet state can insert into carbon-hydrogen bonds by abstraction of a hydrogen atom (from a support surface, for example), thus creating a radical pair. Subsequent collapse of the radical pair leads to formation of a new carbon-carbon bond. If a reactive bond (e.g., carbon-hydrogen) is not available for bonding, the ultraviolet light-induced excitation of the benzophenone group is reversible and the molecule returns to ground state energy level upon removal of the energy source. In an embodiment, the surface comprises a polymer surface and the coating comprises a photoreactive aryl ketone. Additional photoreactive groups include azides. The azides constitute a class of photoreactive groups and include arylazides such as phenyl azide and particularly 4-fluoro-3-nitrophenyl azide, acyl azides such as benzoyl azide and p-methylbenzoyl azide, azido formates such as ethyl azidoformate, phenyl azidoformate, sulfonyl azides such as benzenesulfonyl azide, and phosphoryl azides such as diphenyl phosphoryl azide and diethyl phosphoryl azide. Diazo compounds constitute another class of photoreactive groups and include diazoalkanes such as diazomethane and diphenyldiazomethane, diazoketones such as diazoacetophenone and 1-trifluoromethyl-1-diazo-2-pentanone, diazoacetates such as t-butyl diazoacetate and phenyl diazoacetate, and beta-keto-alpha-diazoacetates such as t-butyl alpha diazoacetoacetate. Other photoreactive groups include the diazirines such as 3-trifluoromethyl-3-phenyldiazirine, and ketenes such as ketene and diphenylketene.

The surfaces of the fluid passages and/or the coatings configured to control liquid flow may contain one or more thermochemically reactive groups (i.e., groups having a reaction rate dependent on temperature). Suitable groups are selected from the group consisting of activated esters, epoxide, azlactone, activated hydroxyl and maleimide groups. Those skilled in the art would also recognize numerous other amine-reactive functional groups such as isocyanates, thioisocyanates, carboxylic acid chlorides, epoxides, aldehydes, alkyl halides and sulfonate esters, such as mesylate, tosylate and tresylate, each of which could serve as the thermochemically reactive group. Optionally, the coating can also contain one or more photoreactive groups. Additionally, the coating may comprise one or more hydrophilic polymers, to which the thermochemically reactive and/or photoreactive groups can be pendent. The photoreactive groups (alternatively referred to herein as "photogroups") can be used, for instance, to attach molecules to the surface of the support upon the application of a suitable energy source such as light. The thermochemically reactive groups, in turn, can be used to form covalent bonds with appropriate and complementary functional groups on a different molecule. In another embodiment, the coating can comprise self-assembling monolayer molecules wherein the self-assembling monolayer molecules themselves provide thermochemical reactive groups and the method comprises the further step of attaching binding molecules to the monolayer by reaction between corresponding reactive groups of the binding molecules and the reactive groups of the self-assembling monolayer molecules.

Polymers appropriate for use as either a surface or component of the microfluidic product include a variety of biocompatible polymers known in the art to be suitable for use in life science applications. The biocompatible polymer may be biostable or biodisintegrable. By "biostable" is meant a polymer that does not substantially disintegrate (i.e., deteriorate) in vivo. Thus, a biostable polymer is one that maintains its structural integrity, i.e., is substantially inert, in the presence of a physiological environment. "Biodisintegrable" polymers are those that undergo substantial deterioration in vivo, and include soluble polymers, bioerodable polymers and biodegradable polymers.

Biocompatible biostable polymers include numerous thermoplastic and elastomeric polymeric materials that are known in the art. Polyolefins such as metallocene catalyzed polyethylenes, polypropylenes, and polybutylenes and copolymers thereof, ethylenic polymers such as polystyrene; ethylenic copolymers such as ethylene vinyl acetate (EVA), ethylene-methacrylic acid and ethylene-acrylic acid copolymers where some of the acid groups have been neutralized with either zinc or sodium ions (commonly known as ionomers); polyacetals; chloropolymers such as polyvinylchloride (PVC); fluoropolymers such as polytetrafluoroethylene (PTFE); polyesters such as polyethylene terephthalate (PET); polyester-ethers; polysulfones; polyamides such as nylon 6 and nylon 6,6; polyamide ethers; polyethers; elastomers such as elastomeric polyurethanes and polyurethane copolymers; silicones; polycarbonates; and mixtures and block or random copolymers of any of the foregoing are non-limiting examples of biostable biocompatible polymers useful for manufacturing the medical devices of the present invention.

Additional polymers that can be used as surfaces or components of the microfluidic product include polyurethanes, silicones, poly(meth)acrylates, polyesters, polyalkylene oxides such as polyethylene oxide, polyvinyl alcohols, polyethylene glycols and polyvinyl pyrrolidone; hydrogels such as those formed from crosslinked polyvinyl pyrrolidone and polyesters could also be used. Other polymers include polyolefins, polyisobutylene and ethylene-alphaolefin copolymers; acrylic polymers (including methacrylic polymers) and copolymers, vinyl halide polymers and copolymers, such as polyvinyl chloride; polyvinyl ethers, such as polyvinyl methyl ether; polyvinylidene halides such as polyvinylidene fluoride and polyvinylidene chloride; polyacrylonitrile, polyvinyl ketones; polyvinyl aromatics such as polystyrene; polyvinyl esters such as polyvinyl acetate; copolymers of vinyl monomers with each other and olefins, such as ethylene-methyl methacrylate copolymers, acrylonitrile-styrene copolymers, ABS resins and ethylene-vinyl acetate copolymers; polyamides, such as nylon 6,6 and polycaprolactam; alkyd resins; polycarbonates; polyoxymethylenes; polyimides; polyethers; epoxy resins; rayon; rayon-triacetate, cellulose, cellulose acetate, cellulose acetate butyrate; cellophane; cellulose nitrate; cellulose propionate; cellulose ethers (i.e. carboxymethyl cellulose and hydroxyalkyl celluloses); and combinations thereof. Mixtures and block or random copolymers of any of the foregoing are also useful in the present invention.

In addition to being used as surfaces or components in the microfluidic product, biodisintegrable polymers can also be incorporated into the coating configured to control liquid flow in the microfluidic product. Biodisintegrable polymers include, but are not limited to, polylactic acid, polyglycolic acid and copolymers and mixtures thereof such as poly(L-lactide) (PLLA), poly(D,L-lactide), polyglycolic acid (polyglycolide), poly(L-lactide-co-D,L-lactide), poly(L-lactide-co-glycolide), poly(D, L-lactide-co-glycolide), poly(glycolide-co-trimethylene carbonate), poly(D,L-lactide-co-caprolactone), poly(glycolide-co-caprolactone), polyethylene oxide (PEO), polydioxanone, polypropylene fumarate, poly(ethyl glutamate-co-glutamic acid), poly(tert-butyloxy-carbonylmethyl glutamate), polycaprolactone, polycaprolactone co-butylacrylate, polyhydroxybutyrate and copolymers of polyhydroxybutyrate, poly(phosphazene), poly(phosphate ester), poly(amino acid) and poly (hydroxy butyrate), polydepsipeptides, maleic anhydride copolymers, polyphosphazenes, polyiminocarbonates, poly [(97.5% dimethyl-trimethylene carbonate)-co-(2.5% trimethylene carbonate)], cyanoacrylate, hydroxypropylmethylcellulose, polysaccharides such as hyaluronic acid, chitosan and regenerate cellulose, tyrosine-based polymers (e.g., tyrosine-derived polycarbonates such as the Tyrosorb™ Synthetic Polymers available from Integra LifeSciences and those described in U.S. Pat. No. 6,120,491), and proteins such as gelatin and collagen and genetically engineered variants thereof (e.g., collagen engineered to include thrombin cleavage sites), as well as mixtures and copolymers of the above, among others. Additional polymers include aliphatic polyesters, poly(amino acids), copoly(ether-esters), polyalkylene oxalates, polyamides, poly(iminocarbonates), polyorthoesters, polyoxaesters, polyamidoesters, polyoxaesters containing amido groups, poly(anhydrides), polyphosphazenes, biomolecules, and blends thereof. Aliphatic polyesters include homopolymers and copolymers of lactide (which includes lactic acid d-,l- and meso lactide), epsilon-caprolactone, glycolide (including glycolic acid), hydroxybutyrate, hydroxyvalerate, para-dioxanone, trimethylene carbonate (and its alkyl derivatives), 1,4-dioxepan-2-one, 1,5-dioxepan-2-one, 6,6-dimethyl-1,4-dioxan-2-one and polymer blends thereof. Biodisintegrable polymers also include naturally occurring materials that may be enzymatically degraded in the human body or are hydrolytically unstable in the human body such as fibrin, fibrinogen, collagen, elastin, and absorbable biocompatible polysaccharides such as chitosan, starch, fatty acids (and esters thereof), glucoso-glycans and hyaluronic acid. Mixtures and block or random copolymers of any of the foregoing are also contemplated.

Gradient coatings can be applied to the surfaces using different dispensing and coating applications. Several manufacturers including Epson, Hewlett Packard, Biofluidix, BioDot, Agilent, Life Technologies, Formulatrix, Deerac, and others manufacture systems that can dispense sub-microliter droplets with precision and accuracy to produce one or more products of the invention. U.S. Pat. No. 7,790,265 and US 2003/0049381 (dip-pen nanolithography) disclose methods for using AFM tips to pattern surfaces. In an embodiment, the coating may be formed on the surface using an AFM or dip-pen nanolithography.

In an embodiment, the microfluidic product comprises a channel surface comprising a surface energy gradient coating wherein the surface is also configured for electrowetting or heating. In this embodiment, the surface energy gradient coating may reduce the electrical or thermal energy required to move liquids through the channel.

A surface with one or more surface energy gradient regions surrounded by regions of uncoated or uniformly-coated surfaces can be used in the invention. In one embodiment, the starting surface is a uniform surface that already has a monolayer film on it. The uniform monolayer film could be removed using a laser or a solvent or chemical etch. The gradient could be created on the newly exposed regions using any of the methods previously described in the prior art. In another embodiment, the surface energy gradient regions are created first using the methods described in the prior art. Then the uncoated areas of the surface could be coated with a uniform monolayer to create the desired surface.

Multiple manufacturing steps can be used to manufacture the channels configured to control liquid flow in the microfluidic products of this invention. The channels can vary in length, width, and height. In an embodiment, a different solution or even air or other gas could be used to displace solutions from the channel. In an embodiment, different flow paths with different entrances and exits for the fluids can be used to create surface energy gradients in different directions. In an embodiment, mixers can be added to improve the mixing of the solutions before they are delivered to the channel to apply the coating. In an embodiment, different solutions could be used with different reactive species and/or concentrations to produce different types of surface energy gradients. In an embodiment, a plurality of surface energy gradients could be produced on a plurality of flow paths, including radial flow out from a point, multiple parallel channels out from a central axis, and any other pattern that can be manufactured. In embodiments, methods for preparing the surface can include simple cleaning, acid activation, electrochemical activation, UV-activation, chemical activation, etc.

Microfluidic products of the invention can be used in many different product applications. The microfluidic products of the invention can be used with many different fluids, including bodily fluids commonly used for diagnostic testing. These bodily fluids include blood, tears, saliva, plasma, urine, sweat, and others. In an embodiment, the microfluidic product is used with a solution comprising a therapeutic or treatment agent. In an embodiment, the microfluidic product is used with analytical buffer solutions.

The microfluidic product may comprise a microscope coverslip, microscope slide, petri dish, tissue culture flask, biomedical implant, diagnostic assay, a biochip, a protein/nucleic acid biochip sensor, a cell-based sensor, a lab-on-a-chip assay, a lab-in-a-capillary assay, a cell adhesion assay, a cell translocation/migration/invasion/chemotaxis assay, or a neuronal-guidance assay. The microfluidic product may comprise a non-flat substrate. The microfluidic product may have an exterior side opposite an interior side, and wherein the interior side has the coating applied thereon. The substrate may include silicon, plastic, rubber, metal, ceramic material.

Life science applications where the microfluidic products can be used include in-vitro diagnostic devices, lab-on-a-chip devices, microarrays, microplates, analytical slides, organ-on-a-chip, system-on-a-chip, and other diagnostic products. The microfluidic products can also be used in medical devices for fluid transport or drainage, or for drug delivery. These medical devices include implantable devices such as stents, shunts, insulin pumps, ports, and catheters and others. The microfluidic products can also be used in wound healing devices or patches. In an embodiment, the invention provides surface modification and enhancement of microarrays for sequencing. A DNA microarray (also commonly known as DNA chip or biochip) is a collection of microscopic DNA spots attached to a solid surface. Scientists use DNA microarrays to measure the expression levels of large numbers of genes simultaneously or to genotype multiple regions of a genome. In various embodiments, the microfluidic products of the invention can provide the following benefits in applications:

Equality and uniformity in the sample across the target surface, providing equal signal strength increasing the signal to noise ratio and improved CV data.

Lower volume required of reagent thus saving considerable money in chemistry usage.

Increased density due to the process of coating small landing pad zones reagent chemistries with a higher density than what could be achieved with standard screening and or fluid dispensing.

Moving fluids in specific patterns in series and parallel to enable faster sample reaction times.

In one embodiment of the invention, a microfluidic product comprises at least one inlet port in communication with a first channel, a detection region within fluid communication of the first channel, and a detector associated with the detection region. In an embodiment according to the invention, the microfluidic product comprises a detection region along a channel. There may be a plurality of detection regions and detectors, working independently or together, e.g., to analyze one or more properties of a chemical such as a reagent.

The surfaces of the fluid passages and/or the coating configured to control liquid flows can comprise coating compositions that can be used to form a coating for a variety of medical devices for which it is desired to provide a functional coating at a surface thereof. Exemplary medical devices include catheters, other vascular devices (e.g., grafts, valves, artificial hearts, heart assist devices); implantable defibrillators; blood oxygenator devices (e.g., tubing, membranes); surgical; membranes; cell culture devices; chromatographic support materials; biosensors; shunts for hydrocephalus; wound management devices; endoscopic devices; infection control devices; urological devices; colostomy bag attachment devices; ophthalmic devices; glaucoma drain shunts; intraocular lenses; respiratory, peripheral cardiovascular, spinal, neurological, dental, ear/nose/throat (e.g., ear drainage tubes); renal devices; and dialysis (e.g., tubing, membranes, grafts). Other medical devices can include urinary catheters, intravenous catheters, small diameter grafts, vascular grafts, artificial lung catheters, glucose sensors (long-term and short-term), degradable coronary stents (e.g., degradable, non-degradable, peripheral), blood pressure and stent graft catheters, birth control devices, implanted drug infusion tubes, intravitreal drug delivery devices, nerve regeneration conduits, oncological implants, pain management implants, spinal/orthopedic repair devices, wound dressings, embolic protection filters, heart valves (e.g., mechanical, polymeric, tissue, percutaneous, carbon, sewing cuff), valve annuloplasty devices, mitral valve repair devices, vascular intervention devices, left ventricle assist devices, neurological catheters, left atrial appendage filters, hemodialysis devices, vascular access catheters, cardiac sensors, uterine bleeding patches, urological catheters/stents/implants, in vitro diagnostics, aneurysm exclusion devices, and neuropatches. Other medical devices include, but are not limited to, vena cava filters, drug infusion catheters, esophageal stents, circulatory support systems, angiographic catheters, transition sheaths and dialators, coronary and peripheral guidewires, hemodialysis catheters, neurovascular balloon catheters, tympanostomy vent tubes, cerebro-spinal fluid shunts, drainage tubes, thoracic cavity suction drainage catheters, electrophysiology catheters, stroke therapy catheters, abscess drainage catheters, biliary drainage products, dialysis catheters, central venous access catheters, and parental feeding catheters. Other medical devices suitable for the present disclosure include, but are not limited to implantable vascular access ports, vascular stents, blood tubing, vascular grafts, total artificial hearts and ventricular assist pumps, extracorporeal devices such as blood oxygenators, blood filters, hemodialysis molecules, hemoperfusion molecules, plasmapheresis molecules, and hybrid artificial organs such as pancreas or liver and artificial lungs.

The microfluidic products of the invention can also be used in industrial applications such as cooling and microreactor applications. Such applications include cooling of electronic devices such as servers, computer chips, and integrated circuits. Typical fluids in these applications include water, glycols, alcohols, organic solvents, and aqueous solutions. In an embodiment, the liquid used in a microfluidic product of the invention comprises a phase-change material. In an embodiment, the liquid used in the microfluidic product of the invention comprises and emulsion. In an embodiment, the liquid used in the microfluidic product comprises an emulsion comprising nanoparticles. In an embodiment, the liquid used in the microfluidic product comprises a water-in-oil emulsion or an oil-in-water emulsion. In an embodiment, the fluid used in the microfluidic product comprises a two-phase fluid.

The microfluidic products of the invention can be used with many different liquids or fluids. In an embodiment, surface tension values of fluids used with the invention range from 10-150 dynes/cm. In an embodiment, viscosity ranges for the fluid range from 0.1-500 centipoise. In certain embodiments, the microfluidic product is designed to only allow for flow of a particular liquid when the liquid attains a targeted viscosity or a targeted surface tension, such as after being heated or being mixed with another material. In an embodiment, the microfluidic product can transport adhesive or another sealing material to a location for bonding materials or sealing leaks. In an embodiment, the microfluidic product can transport a phase-change material.

In an embodiment, the products of the invention can be used with at least one of the following liquids or mixtures of liquids:

| Name | Molecular Formula | Molecular Wt | Specific Density (g/ml @25 C.) | Surface Tension (dynes/cm @25 C.) | Viscosity @25 C. (cP) | Viscosity @25 C. (cs) |
|---|---|---|---|---|---|---|
| Bromine | $Br_2$ | 159.81 | 3.214 | 41 | 0.94 | 0.29 |
| Tetrachloromethane (carbon tetrachloride) | $CCl_4$ | 153.82 | 1.583 | 26.3 | 0.91 | 0.57 |
| Trichloromethane (chloroform) | $CHCl_3$ | 119.38 | 1.48 | 26.7 | 0.54 | 0.36 |
| Dichloromethane (methylene chloride, DCM) | $CH_2Cl_2$ | 84.93 | 1.318 | 27.8 | 0.41 | 0.31 |
| Diiodomethane (methylene iodide) | $CH_2I_2$ | 267.84 | 3.306 | 50.8 | 2.6 | 0.78 |
| Methanoic acid (formic acid) | $CH_2O_2$ | 46.03 | 1.214 | 37.7 | 1.61 | 1.32 |
| Formamide (methanomide) | $CH_3NO$ | 45.04 | 1.129 | 57 | 3.34 | 2.96 |
| Nitromethane | $CH_3NO_2$ | 61.04 | 1.129 | 36.3 | 0.63 | 0.56 |
| Methanol (methyl alcohol) | $CH_4O$ | 32.04 | 0.787 | 22.1 | 0.54 | 0.69 |
| Trichloroethylene (TCE, trichloroethene) | $C_2HCl_3$ | 131.39 | 1.458 | 28.7 | 0.55 | 0.38 |
| 1,1,1-Trichloroethane (methyl chloroform) | $C_2H_3Cl_3$ | 133.4 | 1.33 | 25 | 0.79 | 0.59 |
| Acetonitrile (ethane nitrile) | $C_2H_3N$ | 41.05 | 0.779 | 28.7 | 0.37 | 0.47 |
| 1,2-Dichloroethane (ethylene dichloride) | $C_2H_4Cl_2$ | 98.96 | 1.246 | 32.6 | 0.78 | 0.63 |
| Acetic acid (ethanoic acid) | $C_2H_4O_2$ | 60.05 | 1.043 | 27 | 1.06 | 1.02 |
| Ethanol (ethyl alcohol) | $C_2H_6O$ | 46.07 | 0.787 | 22 | 1.07 | 1.36 |
| Dimethyl sulfoxide (DMSO) | $C_2H_6OS$ | 78.13 | 1.095 | 42.9 | 1.99 | 1.82 |
| Ethylene glycol | $C_2H_6O_2$ | 62.07 | 1.111 | 48.4 | 16.1 | 14.5 |
| 2-Aminoethanol (ethanolamine) | $C_2H_7NO$ | 61.08 | 1.014 | 48.3 | 21.1 | 20.8 |
| Acrylonitrile (ethenylnitrile) | $C_3H_3N$ | 53.06 | 0.801 | 26.7 | 0.34 | 0.42 |
| Epichlorhydrin (chloromethyloxirane) | $C_3H_5ClO$ | 92.52 | 1.174 | 36.3 | 1.07 | 0.91 |
| Acetone (propanone) | $C_3H_6O$ | 58.08 | 0.786 | 23 | 0.31 | 0.39 |
| Methyl acetate | $C_3H_6O_2$ | 74.08 | 0.927 | 24.5 | 0.36 | 0.39 |
| N,N-Dimethylformamide (DMF) | $C_3H_7NO$ | 73.09 | 0.945 | 34.4 | 0.79 | 0.84 |
| 1-Propanol (n-propanol, n-propyl alcohol) | $C_3H_8O$ | 60.1 | 0.802 | 20.9 | 1.95 | 2.43 |
| 2-Propanol (isopropyl alcohol) | $C_3H_8O$ | 60.1 | 0.783 | 23.3 | 2.04 | 2.61 |
| 2-Methoxyethanol (ethylene glycol monomethyl ether) | $C_3H_8O_2$ | 76.1 | 0.96 | 42.8 | 1.7 | 1.8 |
| Dimethoxymethane (methylal) | $C_3H_8O_2$ | 76.1 | 0.854 | 18.8 | 0.33 | 0.39 |
| 1,2-Propanediol (propylene glycol) | $C_3H_8O_2$ | 76.1 | 1.033 | 45.6 | 40.4 | 39.1 |
| Glycerol | $C_3H_8O_3$ | 92.09 | 1.257 | 76.2 | 934 | 743 |
| Propylene carbonate | $C_4H_6O_3$ | 102.09 | 1.200 | 40.9 | 2.50 | 2.08 |
| 2-Butanone (methyl ethyl ketone) | $C_4H_8O$ | 72.11 | 0.799 | 24 | 0.41 | 0.51 |
| Tetrahydrofuran | $C_4H_8O$ | 72.11 | 0.88 | 26.7 | 0.46 | 0.52 |
| 1,4-Dioxane | $C_4H_8O_2$ | 88.11 | 1.029 | 32.9 | 1.18 | 1.15 |
| Ethyl acetate (ethyl ethanoate) | $C_4H_8O_2$ | 88.11 | 0.894 | 23.2 | 0.42 | 0.47 |
| Morpholine | $C_4H_9NO$ | 87.12 | 0.997 | 38.8 | 2.02 | 2.03 |
| 1-Butanol (n-butyl alcohol) | $C_4H_{10}O$ | 74.12 | 0.806 | 25 | 2.54 | 3.15 |
| 2-Butanol (sec-butanol) | $C_4H_{10}O$ | 74.12 | 0.805 | 22.6 | 3.1 | 3.85 |
| Diethyl ether (ethoxyethane) | $C_4H_{10}O$ | 74.12 | 0.708 | 16.7 | 0.22 | 0.31 |
| 2-Methylpropyl alcohol (isobutanol) | $C_4H_{10}O$ | 74.12 | 0.797 | 22.6 | 3.95 | 4.96 |
| 1,3-Butanediol | $C_4H_{10}O_2$ | 90.12 | 1.002 | 47.1 | 98.3 | 98.1 |
| 1,2-Dimethoxyethane (DME (ethylene glycol dimethyl ether) | $C_4H_{10}O_2$ | 90.12 | 0.865 | 20 | 1.1 | 1.3 |
| 2-Ethoxyethanol (ethylene glycol monoethyl ether) | $C_4H_{10}O_2$ | 90.12 | 0.925 | 28.8 | 2.1 | 2.3 |

-continued

| Name | Molecular Formula | Molecular Wt | Specific Density (g/ml @25 C.) | Surface Tension (dynes/cm @25 C.) | Viscosity @25 C. (cP) | Viscosity @25 C. (cs) |
|---|---|---|---|---|---|---|
| Diethylene glycol | $C_4H_{10}O_3$ | 106.12 | 1.114 | 55.1 | 30.2 | 27.1 |
| Dimethylethanolamine (2-(dimethylamino)ethanol) | $C_4H_{11}NO$ | 89.14 | 0.882 | 51.6 | 4.08 | 4.63 |
| Pyridine | $C_5H_5N$ | 79.1 | 0.979 | 36.7 | 0.88 | 0.9 |
| 2-Furanmethanol (furfuryl alcohol) | $C_5H_6O_2$ | 98.1 | 1.127 | 53.3 | 4.62 | 4.1 |
| Methyl methacrylate | $C_5H_8O_2$ | 100.12 | 0.937 | 24.2 | 0.57 | 0.61 |
| N-Methyl-2-pyrrolidine | $C_5H_9NO$ | 99.13 | 1.025 | 44.6 | 1.67 | 1.63 |
| Isopropyl acetate (isopropyl ethanoate) | $C_5H_{10}O_2$ | 102.13 | 0.871 | 22.3 | 0.52 | 0.6 |
| Propyl acetate (propyl ethanoate) | $C_5H_{10}O_2$ | 102.13 | 0.883 | 23.9 | 0.54 | 0.61 |
| 1,2-Dichlorobenzene | $C_6H_4Cl_2$ | 147 | 1.301 | 35.7 | 1.32 | 1.01 |
| Benzene | $C_6H_6$ | 78.11 | 0.873 | 28.2 | 0.6 | 0.69 |
| Aniline | $C_6H_7N$ | 93.13 | 1.018 | 42.4 | 3.85 | 3.78 |
| Cyclohexanone | $C_6H_{10}O$ | 98.14 | 0.942 | 34.4 | 2.02 | 2.14 |
| Cyclohexane | $C_6H_{12}$ | 84.16 | 0.773 | 24.7 | 0.89 | 1.15 |
| Cyclohexanol | $C_6H_{12}O$ | 100.16 | 0.96 | 33.4 | 57.5 | 59.9 |
| 4-Methyl-2-pentanone (methyl isobutyl ketone) | $C_6H_{12}O$ | 100.16 | 0.796 | 23.5 | 0.55 | 0.69 |
| Butyl acetate | $C_6H_{12}O_2$ | 116.16 | 0.876 | 24.8 | 0.69 | 0.79 |
| 2-Methyl propyl ethanoate (isobutyl acetate) | $C_6H_{12}O_2$ | 116.16 | 0.869 | 23 | 0.68 | 0.78 |
| 2-Butoxyethanol (ethylene glycol monobutyl ether) | $C_6H_{14}O_2$ | 118.17 | 0.896 | 26.6 | 6.4 | 7.1 |
| Triethanolamine | $C_6H_{15}NO_3$ | 149.19 | 1.12 | 51.5 | 609 | 543 |
| Benzonitrile | $C_7H_5N$ | 103.12 | 1.001 | 38.8 | 1.27 | 1.27 |
| Benzaldehyde | $C_7H_6O$ | 106.12 | 1.04 | 38.3 | 1.4 | 1.4 |
| Toluene | $C_7H_8$ | 92.14 | 0.865 | 27.9 | 0.56 | 0.65 |
| Benzyl alcohol | $C_7H_8O$ | 108.14 | 1.041 | 36.8 | 5.47 | 5.25 |
| 3-Methylphenol (m-Cresol) | $C_7H_8O$ | 108.14 | 1.03 | 35.8 | 12.9 | 12.5 |
| 2-Heptanone (methyl n-amyl ketone) | $C_7H_{14}O$ | 114.19 | 0.811 | 26.1 | 0.71 | 0.88 |
| n-Heptane | $C_7H_{16}$ | 100.2 | 0.682 | 19.8 | 0.39 | 0.57 |
| Styrene (phenylethene) | $C_8H_8$ | 104.15 | 0.9 | 32 | 0.7 | 0.78 |
| Acetophenone (1-phenylethanone) | $C_8H_8O$ | 120.15 | 1.024 | 39 | 1.68 | 1.64 |
| Ethylbenzene | $C_8H_{10}$ | 106.17 | 0.865 | 28.6 | 0.63 | 0.73 |
| o-Xylene | $C_8H_{10}$ | 106.17 | 0.876 | 29.6 | 0.76 | 0.87 |
| p-Xylene | $C_8H_{10}$ | 106.17 | 0.861 | 27.9 | 0.6 | 0.7 |
| Phenoxyethanol (ethylene glycol monophenyl ether) | $C_8H_{10}O_2$ | 138.16 | 1.11 | — | 20.3 | 18.3 |
| Octanoic acid (caprylic acid) | $C_8H_{16}O_2$ | 144.21 | 0.903 | 27.9 | 5.02 | 5.56 |
| 2-Ethyl-1-hexanol | $C_8H_{18}O$ | 130.23 | 0.83 | 27.7 | 6.27 | 7.55 |
| Isophorone | $C_9H_{14}O$ | 138.21 | 0.92 | 35.5 | 2.33 | 2.53 |
| 1-Bromonaphthalene | $C_{10}H_7Br$ | 207.07 | 1.478 | 44.4 | — | — |
| Dibutyl phthalate | $C_{16}H_{22}O_4$ | 278.34 | 1.043 | 37.4 | 16.6 | 15.9 |
| Hexadecane | $C_{16}H_{34}$ | 226.44 | 0.77 | 27.1 | — | — |
| Dioctyl hexanedioate (dioctyl adipate) | $C_{22}H_{42}O_4$ | 370.57 | 0.92 | — | 13.7 | 14.9 |
| Bis(2-ethylhexyl)phthalate (BEHP, dioctyl phthalate) | $C_{24}H_{38}O_4$ | 390.56 | 0.98 | 31.1 | 80 | 82 |
| Water | $H_2O$ | 18.02 | 0.999 | 72.7 | 0.89 | 0.89 |
| Hydrogen peroxide | $H_2O_2$ | 34.02 | 1.449 | 74 | 1.25 | 0.86 |
| Hydrazine | $H_4N_2$ | 32.04 | 0.95 | 66.9 | 0.88 | 0.93 |
| Mercury | Hg | 200.59 | 13.63 | 474.4 | 1.53 | 0.11 |
| Silicon tetrachloride | $SiCl_4$ | 169.9 | 1.645 | 18.8 | 99.4 | 60.4 |

Coatings solutions used to apply the coating configured to control liquid flows in the microfluidic products of the invention can also comprise a liquid or mixture of liquids from the table above.

An embodiment of the invention is an analytical device wherein the gradient regions are created on a layer using the methods described in the art cited in this application. The layer is then attached and/or bonded to one or more molded plastic layers containing a pattern for sample wells, analysis wells, and fluid passages wherein the fluid passages comprise a top and bottom surface. The surfaces of the fluid passages may be flat or non-flat. Dimensions for the widths of such passages can be in the range of 100-2500 microns, but the dimensions can be smaller or larger depending on the manufacturing procedure used to create the fluid passages. In an embodiment, the wells are constructed to hold liquid volumes in the 0.2-200 microliter range, but can be configured to hold volumes down to the picoliter range. Wells and manifolds can also be constructed to hold much higher volumes (1 mL or more). In an embodiment, one or more of the fluid passages comprises a coating configured to control liquid flow wherein the coating comprises a gradient surface energy coating from a proximal location on the fluid passage to a distal location on a top or bottom surface of the fluid passage. In an embodiment, the width of the coating is substantially equal to the width of the fluid passage. In another embodiment, the width of the coating can be greater or less than the width of the fluid passages. In an embodiment, the top and bottom surfaces of the fluid passages both comprise a coating configured to control liquid flow. In another embodiment, only one surface of the fluid passage comprises a coating configured to control liquid flow. In another embodiment, one or more surfaces of the fluid passages comprise a substantially uniform coating.

In embodiments, the microfluidic product comprises one or more fluid passages wherein the width of the one or more fluid passages is no greater than 3 millimeters. In embodiments, the microfluidic product comprises one or more fluid passages wherein the width of the one or more fluid passages is no greater than 2 millimeters. In embodiments, the microfluidic product comprises one or more fluid passages wherein the width of the one or more fluid passages is no greater than 1 millimeter. In embodiments, the microfluidic product comprises one or more fluid passages wherein the width of the one or more fluid passages is no greater than 0.8 millimeters. In embodiments, the microfluidic product comprises one or more fluid passages wherein the width of the one or more fluid passages is no greater than 0.5 millimeters. In embodiments, the microfluidic product comprises one or more fluid passages wherein the width of the one or more fluid passages is no greater than 0.3 millimeters. In embodiments, the microfluidic product comprises one or more fluid passages wherein the width of the one or more fluid passages is no greater than 0.1 millimeters. In embodiments, the microfluidic product comprises one or more fluid passages wherein the width of the one or more fluid passages is no greater than 0.05 millimeters.

In embodiments, the microfluidic product comprises one or more fluid passages wherein the width of the one or more fluid passages is no less than 0.05 millimeters. In embodiments, the microfluidic product comprises one or more fluid passages wherein the width of the one or more fluid passages is no less than 0.1 millimeters. In embodiments, the microfluidic product comprises one or more fluid passages wherein the width of the one or more fluid passages is no less than 0.2 millimeters. In embodiments, the microfluidic product comprises one or more fluid passages wherein the width of the one or more fluid passages is no less than 0.5 millimeters. In embodiments, the microfluidic product comprises one or more fluid passages wherein the width of the one or more fluid passages is no less than 0.7 millimeters. In embodiments, the microfluidic product comprises one or more fluid passages wherein the width of the one or more fluid passages is no less than 1 millimeter. In embodiments, the microfluidic product comprises one or more fluid passages wherein the width of the one or more fluid passages is no less than 2 millimeters.

Specific embodiments that use different values for the height, widths, and length of the fluid passages are within the scope of this invention. Different polymers (polycarbonate, polyester, polypropylene, nylon, polyethylene, PTFE, PVDF, COC, etc.) can be used for the plastic layers comprising the fluid passages. Different manufacturing techniques (machining, injection molding, additive manufacturing, etc) can be used to manufacture the invention. Different attachment methods (overmolding, thermal welding, adhesives, gaskets, clamps, etc) can be used to contact or seal the layer with the gradient regions to the other layers of the microfluidic product. In an embodiment, one or more registration marks on a first component of the microfluidic product correspond to one or more registration marks on a second component of the microfluidic product wherein the second component of the microfluidic product comprises a coating configured to control liquid flows.

EXAMPLES

Examples 1-4

Figure 2A:
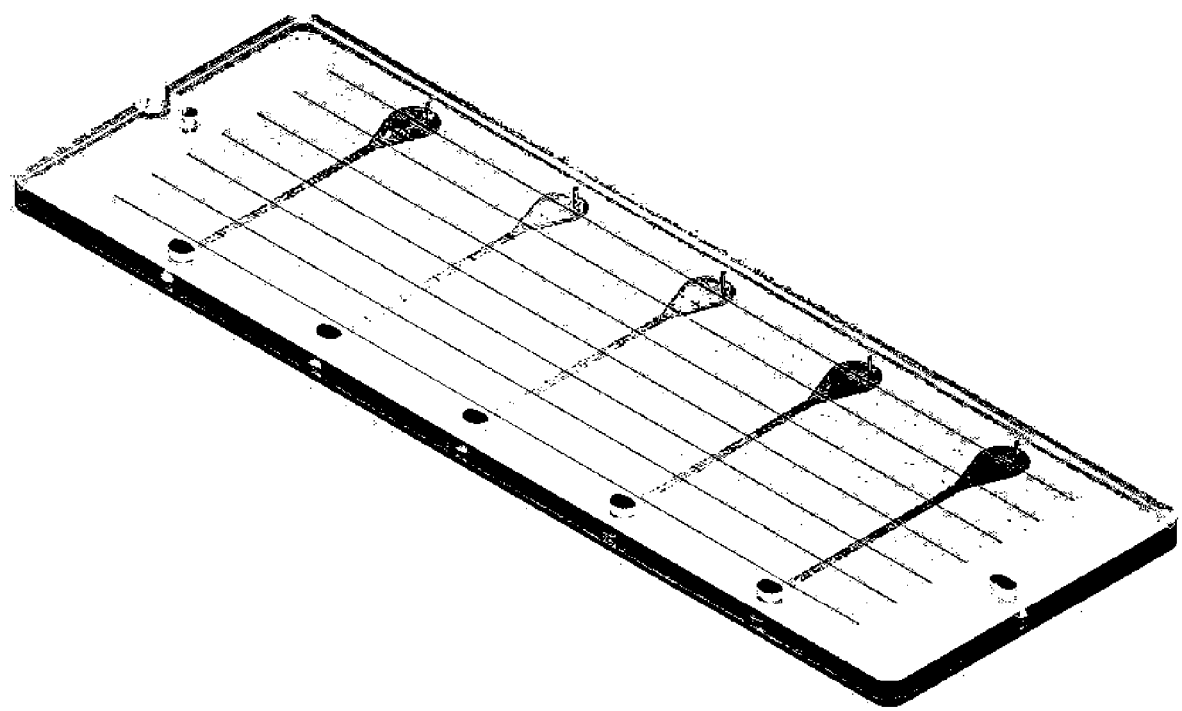
FIG. 2A is a figure showing a microfluidic product used to test flow through channels.
Figure 2B:
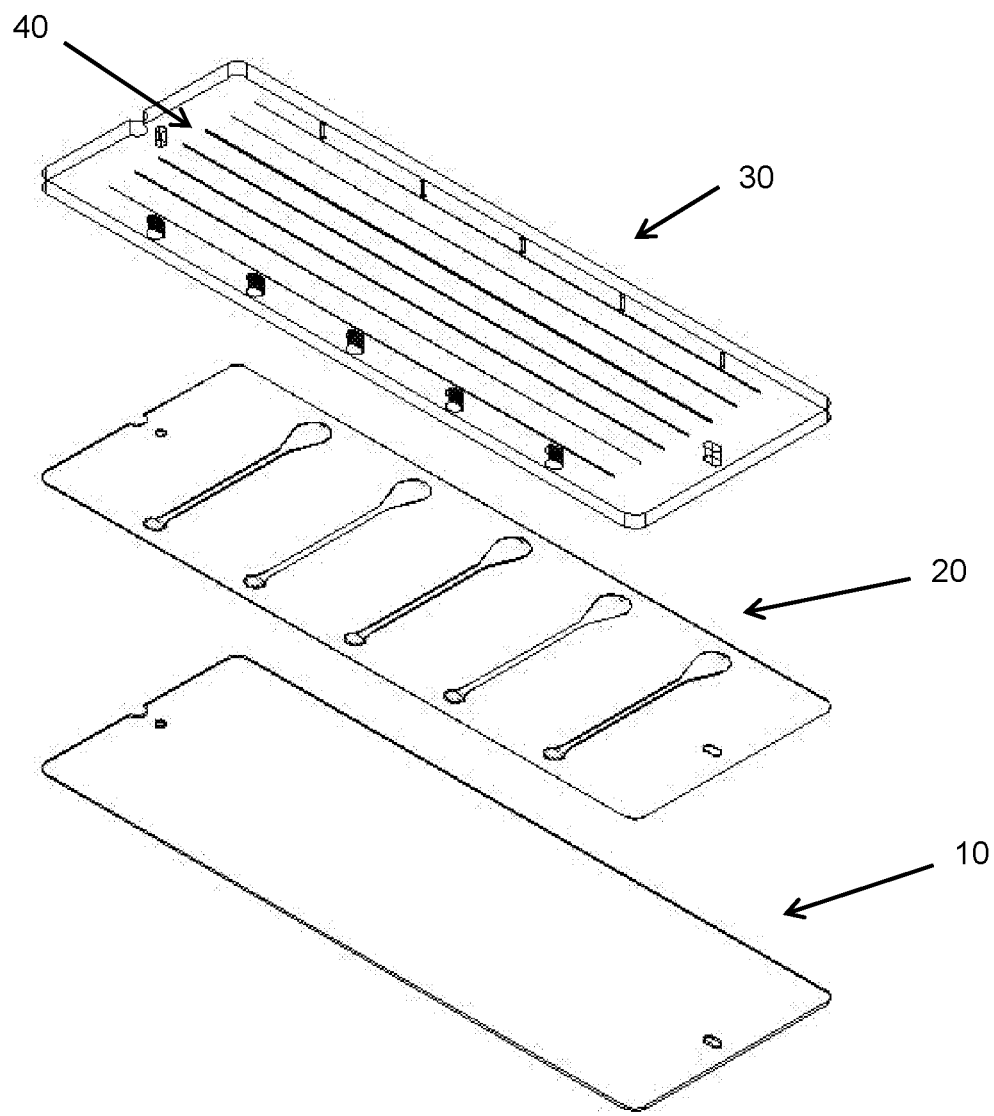
FIG. 2B is a figure showing the layers used to make the product shown in FIG. 2A.

Test slides such as those shown in FIG. 2A were made by laminating three layers of material together to form a device with sample wells, channels, and exit wells.

In the test slides, the bottom layer 10 of the device was a gold-coated Mylar, 0.010" nominal, 0.095" measured polyester layer, the second layer 20 with the well and channel patterns cut out of it was an 0.004" thick laminate composed of a 0.001" thick layer of 3M 9461 Transfer Adhesive material on the top and bottom of a 0.002" thick PET film, and the top layer 30 was an Evonik CYRO LLC Acrylite FF 0.060" Acrylic layer. All channels on the slides were cut to a width of 800 microns and a length of 1.5 cm. The top cover had lines 40 etched perpendicular to the channels every 3 mm; these lines were used to determine the distance that the liquid in the channel traveled over a given length of time.

To prepare surface energy gradient surfaces, the gold surfaces of the bottom layer were coated using thiol solutions to form self-assembled monolayers on the gold. Hydrophobic coatings were formed by coating the gold surface with using 5-mM solutions of 1-dodecanethiol (available from Aldrich Chemical Company) in 2-Propanol (available from VWR scientific). Hydrophilic coatings were formed using 5-mM solutions of 11-Mercapto-1-undecanol in 2-Propanol. The contact angle formed with the hydrophobic coating was ~116 degrees while the contact angle formed with the hydrophilic coating was ~25 degrees. Mixed solutions of varying ratios of the 1-dodecanethiol solution and the 11-mercapto-1-undecanol solution were used to prepare coatings with contact angles between 116 degrees and 20 degrees. No coating was applied to the sample well site.

To test the flow through each channel, a 2-microliter sample of water at room temperature was added to the sample well. A Celestron Digital Microscope with video recording capabilities (Digital Microscope Suite 2.0) was used to record the experiments. The video recording was used to determine the time required for the water to travel each 3 mm increment in the channels. Results of the experiments showed that liquid flow could be controlled for any length of the channels tested (an aspect ratio range of 0-18.75).

FIG. 1 is a graph for the necessary contact angle needed with the bottom surface of the test slides to initiate capillary flow of water into the channel using Equation 1. Based on the results of FIG. 1, no capillary-driven flow would be expected with hydrophobic or bare gold surfaces on the bottom layer for channels that were 800 microns wide by 100 microns deep. The curves in FIG. 1 were generated for a channel where the top surface was a material that formed a contact angle of 60 degrees with water. Using a different liquid besides water, or using a different material for the top surface would change the curves seen in FIG. 1.

Figure 3:
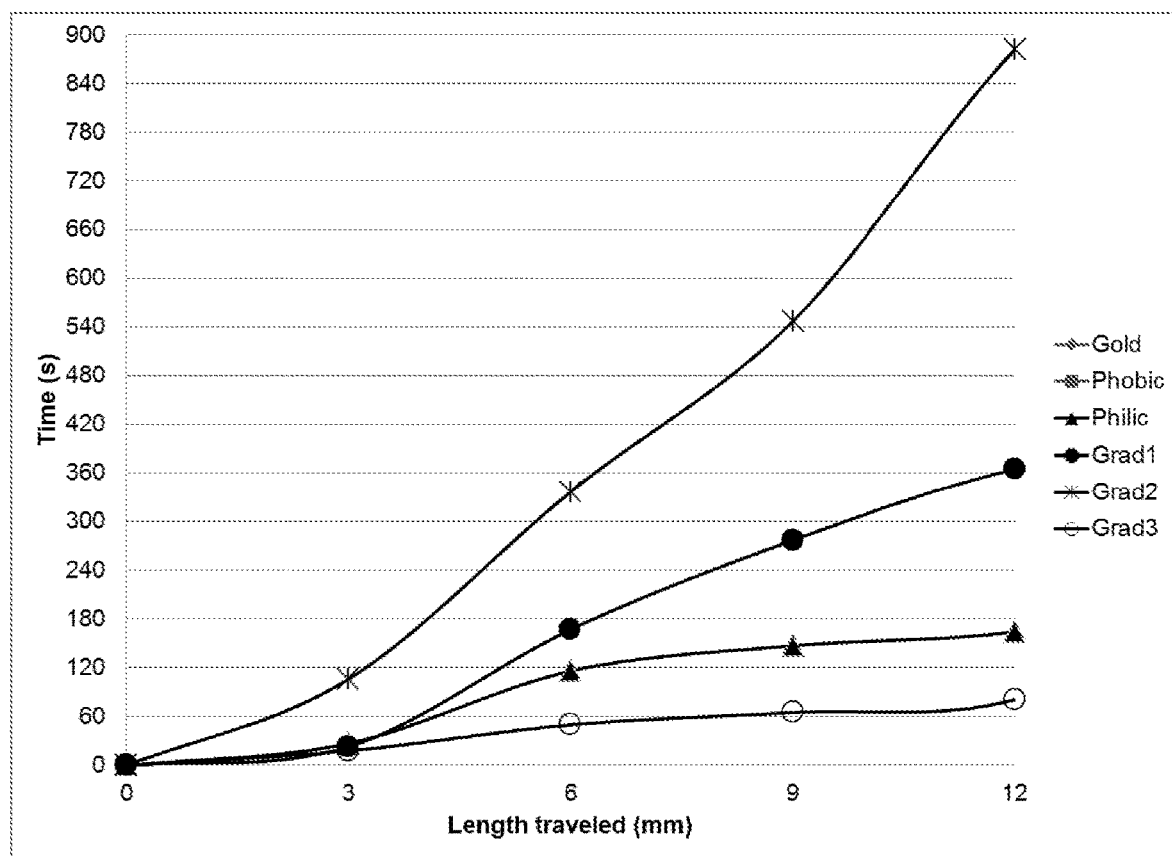
FIG. 3 is a graph showing how the fluid velocity was controlled using different surface energy gradient compositions

Results showing how fluid velocities can be controlled by surface energy gradients are shown in FIG. 3. As seen in the figure, no flow was seen for the channels containing a hydrophobic coating or a bare gold surface. For channels coated with the hydrophilic coating, it can be seen that the liquid took just under 3 minutes (180 seconds) to travel 1.2 cm. The results show that gradients can be used to provide further control over the fluid velocity in the channel. The curves for Grad 1, Grad 2, and Grad 3 show that flow was initiated in the channel for all three gradients, but the flow rates through the channel were different for each gradient. It is interesting to note that the flow rate for the gradient-coated channels appear to be more constant than the flow rate for the hydrophilic-coated channels. In Grad1, the contact angle between water and the bottom surface at the entrance of the channel was about 100 degrees and the contact angle decreased at an average rate of about 5 degrees/mm until it reached the end of the channel where the contact angel was about 25 degrees. In Grad2, the contact angle between water and the bottom surface at the entrance of the channel was about 100 degrees and the contact angle decreased at an average rate of about 2.5 degrees/mm until it reached the end of the channel where the contact angle was about 60 degrees. In Grad3, the contact angle between water and the bottom surface at the entrance of the channel was about 75 degrees and the contact angle decreased at an average rate of about 3 degrees/mm until it reached the end of the channel where the contact angle was about 25 degrees. The results show that both the composition of the coating at the beginning of the channel as well as the degree of the surface energy gradient along the channel can be used to control liquid flows.

Figure 4:
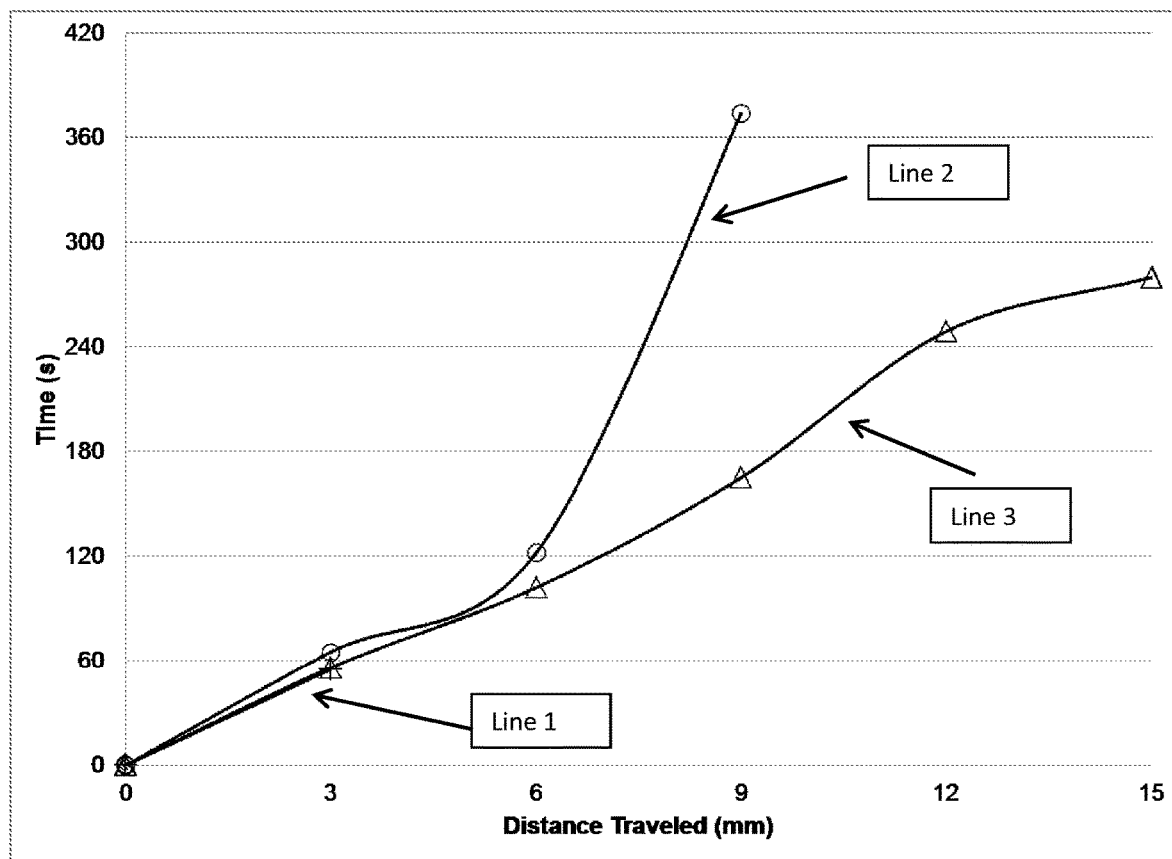
FIG. 4 is a graph showing further control of fluid flow within the channels using surface energy gradient coatings.

FIG. 4 shows how surface energy gradients can be used to provide further control over liquid flows within a fluid passage. The results show that gradient coatings can be used to stop, reduce, or accelerate the fluid flow within a channel. As seen in FIG. 4, no flow was seen in channels with a bare-gold surface as expected. It can also be seen that the liquid flows do not reach the end of the channel for 2 of the surfaces (Lines 1 and 2). The liquid flow in the channel represented by Line 3 did reach the end of the channel. Coatings for the channels used to collect the data shown in Lines 1, 2, and 3 can be characterized as follows:

Line 1: Contact angle with water at the channel entrance was about 55 degrees and after 3 mm, the contact angle with water changed to about 116 degrees.

Line 2: Contact angle with water at the channel entrance was about 55 degrees and decreased by an average rate of 2.5 degrees/mm for about 6 mm and then the contact angle with water changed to about 116 degrees for the remainder of the channel length.

Line 3: Contact angle with water at the channel entrance was about 55 degrees and decreased by an average rate of about 2.5 degrees/mm for about 9 mm to reach a contact angle of about 30 degrees and the contact angle stayed at about 30 degrees for the remainder of the channel.

These results showed that the coatings can be configured in channels that are capable of stopping liquid flows (Line 1) and slowing and stopping liquid flows (Line 2). In addition, Line 3 shows that the coatings of the invention can be used to increase liquid flow through a channel in comparison to uncoated surface and hydrophobically-coated surfaces. In the curve for Line 1, it can be seen that the liquid moves through the first 3 mm of the channel at an average velocity of about 0.05 mm/s before stopping after 3 mm. For Line 2, the liquid flowed through the first 6-mm of the channel at an average velocity of about 0.05 mm/s before the flow was decelerated and stopped; the average velocity for the liquid to move from the 6-mm point of the channel to the 9-mm point of the channel was about 0.0125 mm/s and flow was stopped after 9-mm. For Line 3, the liquid flowed through the first 9-mm of the channel at an average velocity of about 0.05 mm/s before it reached the point where the contact angle changed and the fluid flow was accelerated. Average fluid velocity for the last 3-mm of the channel was about 0.1 mm/s in Line 3.

Example 5

Glass slides were first coated with a solution of 1% octylsilane in ethanol that contained sufficient acetic acid to lower the pH to 5.5. Slides were placed in solution for 5 minutes and then cured at 110° C. in an oven for 2 hours.

Solutions Used for Coating

A) Solution A: Blend of 10 mg/ml PTFM (poly(2,2,2-trifluoroethyl methacrylate)), 0.3 mg/ml PHFM (poly(hexafluorethyl methacrylate)), and 0.5 mg/ml Isurlite® in methyl acetate B) Solution B: 10 mg/ml of Pluronic F38 (PEG/PPO block-copolymer MW 100,000) from BASF and 0.5 mg/ml Isurlite® in methyl acetate C) Mixture of 30% Solution A and 70% Solution B D) Mixture of 10% Solution A and 90% Solution B E) Mixture of 5% Solution A and 95% Solution B F) Mixture of 1% Solution A and 99% Solution B G) Mixture of 0.1% Solution A and 99.9% Solution B H) Mixture of 0.01% Solution A and 99.99% Solution B Slides were then marked into 6 different regions and each region was coated with solutions A-F shown above using the following procedure:

1) The entire slide was immersed for 30 seconds in a 0.5 mg/ml solution of Isurlite® in isopropyl alcohol. The slides were then removed at a rate of ~0.5 cm/sec.

2) Coated slides were air dried for ~15 min

3) The slides were then exposed to UV-C (254 nm peak) for 1 min using UV-C at a distance of ~4 inches.

4) For Slide 1, coating solutions were applied to specific regions (~0.4 square inches each) of each slide using a pipetter and a 20-ul drop. Solutions were applied and spread on each region to give an average liquid film thickness of ~0.08 mm.

5) For Slide 2, coating solutions were applied to specific regions (~0.4 square inches each) of each slide using a pipetter and a 10-ul drop. Solutions were applied and spread on each region to give an average liquid film thickness of ~0.04 mm.

6) Samples were allowed to dry at room temperature

7) The slides were then exposed to UV-C (254 nm peak) for 1 min using UV-C at a distance of ~4 inches.

Afterwards, contact angle measurements were taken using 0.5-uL drops of deionized water. Results for the contact angle measurements for the slides are shown in Table 1.

TABLE 1

Contact Angle Measurements for Coated Regions

| | Coating Solution | | | | | |
|---|---|---|---|---|---|---|
| | B | F | E | D | C | A |
| Slide 1 | 15 | 75 | 70 | 50 | 60 | 80 |

| | Coating Solution | | | | | |
|---|---|---|---|---|---|---|
| | A | D | F | G | H | B |
| Slide 2 | 105 | 52 | 45 | 36 | 35 | 15 |

Results indicated that the wet film thickness and drying time will affect the final contact angles for mixtures. Even at low concentrations, the hydrophobic species in solution may stay in solution while the solution dries, resulting in the hydrophobic species being more concentrated at the surface of the final coating. Thinner films and shorter drying times can limit the tendency of one species to become concentrated at the surface of the coating.

Example 6

Glass slides were first coated with a solution of 1% octyltrimethoxysilane in ethanol that contained sufficient acetic acid to lower the pH to 5.5. Slides were placed in solution for 5 minutes and then cured at 110° C. in an oven for 2 hours.

Solutions Used for Coating
  A) Solution A: Blend of 10 mg/ml PTFM, 0.3 mg/ml PHFM, and 0.5 mg/ml Isurlite® in methyl acetate
  B) Solution B: 10 mg/ml of Pluronic F38 (PEG/PPO block-copolymer MW 100,000) from BASF and 0.5 mg/ml Isurlite® in methyl acetate
  C) Mixture of 10% Solution A and 90% Solution B
  D) Mixture of 1% Solution A and 90% Solution B
  E) Mixture of 0.1% Solution A and 99.9% Solution B
  F) Mixture of 0.01% Solution A and 99.99% Solution B Specific areas of the silanized slides were then further coated with solutions A-F as shown in Table 2 using the following procedure:
  1) The entire slide was immersed for 30 seconds in a 0.5 mg/ml solution of Isurlite® in isopropyl alcohol. The slides were then removed at a rate of ~0.5 cm/sec.
  2) Coated slides were air dried for ~15 min
  3) The slides were then exposed to UV-C (254 nm peak) for 1 min using UV-C at a distance of ~4 inches.
  4) Coating solutions were applied to specific regions (~0.8 square inches each) of each slide using a pipetter and a 20-ul drop. (Slide 1 used 10-ul drops). Solutions were applied and spread on each region to give an average liquid film thickness of ~0.04 mm.
  5) Samples were allowed to dry at room temperature
  6) The slides were then exposed to UV-C (254 nm peak) for 1 min using UV-C at a distance of ~4 inches.

Afterwards, contact angle measurements were taken using 0.5-uL drops of deionized water. Results for the contact angle measurements for the slides are shown in Table 3.

TABLE 2

Coating Patterns - Coating Solutions Used in Each Region of Slides

| Coating Pattern | Region 1 | Region 2 | Region 3 | Region 4 |
|---|---|---|---|---|
| 1 | A | A | A | A |
| 2 | C | D | E | F |
| 3 | D | E | F | F |
| 4 | D | D | E | F |
| 5 | F | E | D | C |

TABLE 3

Contact Angle Measurements for Each Coated Region

| Slide | Coating Pattern | Region1 | Region 2 | Region 3 | Region 4 |
|---|---|---|---|---|---|
| 1 | 5 | 15 | 15 | 85 | 110 |
| 2 | 4 | 85 | 65 | 15 | <15 |
| 3 | 3 | 75 | 20 | 15 | <15 |
| 4 | 2 | 105 | 85 | 15 | 15 |

Example 7

Specific portions of bare glass slides were coated with solutions A-F from Example 6 using the following procedure:
  1) The entire slide was immersed for 30 seconds in a solution of Photoprime SR in isopropyl alcohol (either 10 mg/ml or 3 mg/ml). The slides were then removed at a rate of ~0.5 cm/sec.
  2) Coated slides were air dried for ~15 min
  3) The slides were then exposed to UV-C (254 nm peak) for 1 min using UV-C at a distance of ~4 inches.
  4) Coating solutions were applied to specific regions (~0.4 square inches each) of each slide using a pipetter and a 10-ul drop. Solutions were applied and spread on each region to give an average liquid film thickness of ~0.04 mm.
  5) Samples were allowed to dry at room temperature
  6) The slides were then exposed to UV-C (254 nm peak) for 1 min using UV-C at a distance of ~4 inches.

Afterwards, contact angle measurements were taken using 0.5-uL drops of deionized water. Results for the contact angle measurements for the slides are shown in Table 4.

TABLE 4

Contact Angle Measurements for Coated Regions

| | Coating Solution | | | | | |
|---|---|---|---|---|---|---|
| | A | C | D | E | F | B |
| 10 mg/ml Photoprime SR® | 105 | 75 | 80 | 110 | 85 | 65 |
| 3 mg/ml Photoprime SR® | 105 | 85 | 90 | 42 | 30 | 25 |

Results indicate that the higher concentration of PhotoprimeSR® resulted in coatings that retained a higher concentration of Photoprime SRO at the surface. Coatings using a lower PhotoprimeSR® concentration showed a general decrease in contact angle as the concentration of the hydrophilic species increased.

Example 8

Specific portions of bare glass slides were coated with solutions A-F from Example 6 as shown in Table 5 using the following procedure:

1) The entire slide was immersed for 30 seconds in a solution of 3 mg/ml Photoprime SR in isopropyl alcohol. The slides were then removed at a rate of about 0.5 cm/sec. 2) Coated slides were air dried for about 15 min 3) The slides were then exposed to UV-C (254 nm peak) for 1 min using UV-C at a distance of about 4 inches.

4) Coating solutions were applied to specific regions (about 0.4 square inches each) of each slide using a pipetter and a 10-ul drop. Solutions were applied and spread on each region to give an average liquid film thickness of about 0.04 mm.

5) Samples were allowed to dry at room temperature

6) The slides were then exposed to UV-C (254 nm peak) for 1 min using UV-C at a distance of about 4 inches.

Afterwards, contact angle measurements were taken using 0.5-uL drops of deionized water. Results for the contact angle measurements for the slides are shown in Table 6.

TABLE 5

Coating Patterns - Coating Solutions Used in Each Region of Slides

| Coating Pattern | Region 1 | Region 2 | Region 3 | Region 4 |
|---|---|---|---|---|
| 1 | A | A | A | A |
| 2 | C | D | E | F |
| 3 | D | E | F | F |
| 4 | D | D | E | F |
| 5 | F | E | D | C |

TABLE 6

Contact Angle Measurements for Each Coated Region

| Slide | Coating Pattern | Region 1 | Region 2 | Region 3 | Region 4 |
|---|---|---|---|---|---|
| 1 | 3 | 65 | 30 | 24 | 15 |
| 2 | 4 | 62 | 65 | 29 | 20 |
| 3 | 2 | 95 | 66 | 23 | 12 |
| 4 | 5 | 15 | 15 | 68 | 100 |

Example 9

Figure 6:
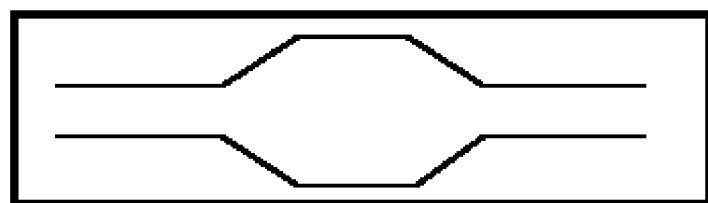
FIG. 6 is a figure showing an embodiment of a pattern on a glass slide

Glass slides with a pattern as shown in FIG. 6 were coated with solutions A-F from Example 6 as shown in Table 7. The slides were coated according to the following procedure:

1) The entire slide was immersed for 30 seconds in a solution of 3 mg/ml Photoprime SRO in isopropyl alcohol. The slides were then removed at a rate of about 0.5 cm/sec.

2) Coated slides were air dried for ~15 min

3) The slides were then exposed to UV-C (254 nm peak) for 1 min using UV-C at a distance of ~4 inches.

4) Coating solutions were applied to specific region of each slide using a pipette; volumes applied to each region are shown in Table 7.

5) Samples were allowed to dry at room temperature

6) Samples were UV-cured for 5 minutes at a distance of 1-inch using a Loctite Zeta 7735 UV-Curing system.

Afterwards, contact angle measurements were taken using 0.5-uL drops of deionized water. Results for the contact angle measurements for the slides are shown in Table 8.

TABLE 7

Coating Patterns for Slides with Diamond Shape

| | Region | | | | | | | | |
|---|---|---|---|---|---|---|---|---|---|
| | 1 | 2 | 3 | 4 | 5 | 6 | 7 | 8 | 9 |
| | | | | x-axis dimension | | | | | |
| | 7 mm | 7 mm | 4 mm | 10 mm | 2 mm | 2 mm | 4 mm | 4 mm | 10 mm |
| Dispense Volume (microliters) | 1.1 | 1.1 | 1.6 | 6.4 | 0.8 | 0.8 | 0.6 | 0.6 | 2.4 |
| Slide 1 | B | B | B | B | B | B | B | B | B |
| Slide 2 | D | D | D | D | E | F | B | B | B |
| Slide 3 | C | D | D | D | E | F | B | B | B |
| Slide 4 | C | D | D | D | E | F | B | C | A |

TABLE 8

Contact Angle for Each Coated Region

| | Region | | | | | | | | |
|---|---|---|---|---|---|---|---|---|---|
| | 1 | 2 | 3 | 4 | 5 | 6 | 7 | 8 | 9 |
| | | | | x-axis dimension | | | | | |
| Slide | 7 mm | 7 mm | 4 mm | 10 mm | 2 mm | 2 mm | 4 mm | 4 mm | 10 mm |
| 1 | <15 | <15 | <15 | <15 | <15 | <15 | <15 | <15 | <15 |
| 2 | 55 | 55 | 45 | 40 | 25 | 20 | 20 | 20 | 15 |
| 3 | 60 | 45 | 48 | 45 | 30 | 30 | 20 | 15 | 15 |
| 4 | 60 | 50 | 50 | 45 | 30 | 25 | 25 | 60 | 90 |

Example 10

Experiments were then performed to produce coatings on polyester. A 20-mm wide strip of Duralar® polyester (0.005" thick) was cleaned with isopropyl alcohol, eleven 16-mm long sections were marked on the slide, and each section was then coated with the solutions shown in Table 9 using the following procedure:

1) 10-ul volumes were dispensed over each region and spread over each region with a pippetter; the average liquid film thickness was about 0.03 mm.

2) Coatings were allowed to dry at room temperature.

3) Samples were UV-cured for 5 minutes at a distance of 1-inch using a Loctite Zeta 7735 UV-Curing system.

Afterwards, contact angle measurements were taken using 0.5-uL drops of deionized water. Three measurements were taken for each section. Results for the contact angle measurements for the samples are shown in Table 9.

TABLE 9

Contact Angle Measurements for Coatings on Polyester

| Section | Coating Solution | Contact Angle after UV-cure |
|---|---|---|
| 1 | None (no UV-cure) | 75 |
| 2 | Solution B from Ex. 6 | 20 |
| 3 | 20 mg/ml poly(2,2,2-trifluoromethacrylate) in methyl acetate | 115 |
| 4 | Solution A from Ex. 6 | 120 |
| 5 | 0.5 mg/ml Isurlite ® in isopropyl alcohol | 58 |
| 6 | None | 60 |
| 7 | 5 mg/mL benzophenone in isopropyl alcohol | 58 |

TABLE 9-continued

Contact Angle Measurements for Coatings on Polyester

| Section | Coating Solution | Contact Angle after UV-cure |
|---|---|---|
| 8 | 5 mg/ml 4,4'-dihodroxy benzophenone in isopropyl alcohol | 48 |
| 9 | 5 mg/ml 4,4'-difluoro-benzophenone in isopropyl alcohol | 105 |
| 10 | Solution D from Ex. 6 | 45 |
| 11 | Solution E from Ex. 6 | 30 |

Example 11

Polyester strips were coated with solutions using 2 different concentrations of Isurlite®; 0.5 mg/mL and 2.0 mg/mL. A 20-mm wide strip of Duralar® polyester (0.005" thick) was cleaned with isopropyl alcohol, twelve 16-mm long sections were marked on the slide, and each section was then coated with the solutions shown in Table 10 and Table 11 using the following procedure:
1) 10-ul volumes were dispensed over each region and spread over each region with a pippetter; the average liquid film thickness was about 0.03 mm.
2) Coatings were allowed to dry at room temperature.
3) One set of samples were then exposed to UV-C (254 nm peak) for 1 min using UV-C at a distance of about 4 inches.
4) One set of samples were then exposed to UV-C (254 nm peak) for 2 min using UV-C at a distance of about 4 inches.

Afterwards, samples were rinsed with deionized water and allowed to dry at room temperature. Contact angle measurements were then taken using 0.5-uL drops of deionized water. Three measurements were taken for each section. Results for the contact angle measurements for the samples are shown in Table 9.

TABLE 10

Contact Angle Measurements for 1-min UV Cure

| Section | Coating Solution | Contact Angle after 1-min UV-cure |
|---|---|---|
| 1 | A | 118 |
| 2 | C | 60 |
| 3 | D | 55 |
| 4 | E | 42 |
| 5 | F | 22 |
| 6 | B | 39 |
| 7 | None | 60 |
| 8 | H | 72 |
| 9 | I | 53 |
| 10 | J | 30 |
| 11 | K | 21 |
| 12 | G | 16 |

TABLE 11

Contact Angle Measurements for 2-min UV Cure

| Section | Coating Solution | Contact Angle after 2-min UV-cure |
|---|---|---|
| 1 | A | 90 |
| 2 | C | 53 |
| 3 | D | 45 |
| 4 | E | 40 |
| 5 | F | 35 |
| 6 | B | 27 |
| 7 | None | 62 |
| 8 | H | 75 |
| 9 | I | 53 |
| 10 | J | 30 |
| 11 | K | 24 |
| 12 | G | 25 |

A) Solution A: Blend of 10 mg/ml PTFM, 0.3 mg/ml PHFM, and 0.5 mg/ml Isurlite® in methyl acetate
B) Solution B: 10 mg/ml of Pluronic F38 (PEG/PPO block-copolymer MW 100,000) from BASF and 0.5 mg/ml Isurlite® in methyl acetate
C) Mixture of 10% Solution A and 90% Solution B
D) Mixture of 1% Solution A and 90% Solution B
E) Mixture of 0.1% Solution A and 99.9% Solution B
F) Mixture of 0.01% Solution A and 99.99% Solution B
G) Solution B: 10 mg/ml of Pluronic F38 (PEG/PPO block-copolymer MW 100,000) from BASF and 2.0 mg/ml Isurlite® in methyl acetate
H) Mixture of 10% Solution A and 90% Solution G
I) Mixture of 1% Solution A and 90% Solution G
J) Mixture of 0.1% Solution A and 99.9% Solution G
K) Mixture of 0.01% Solution A and 99.99% Solution G

Example 12

Figure 7:
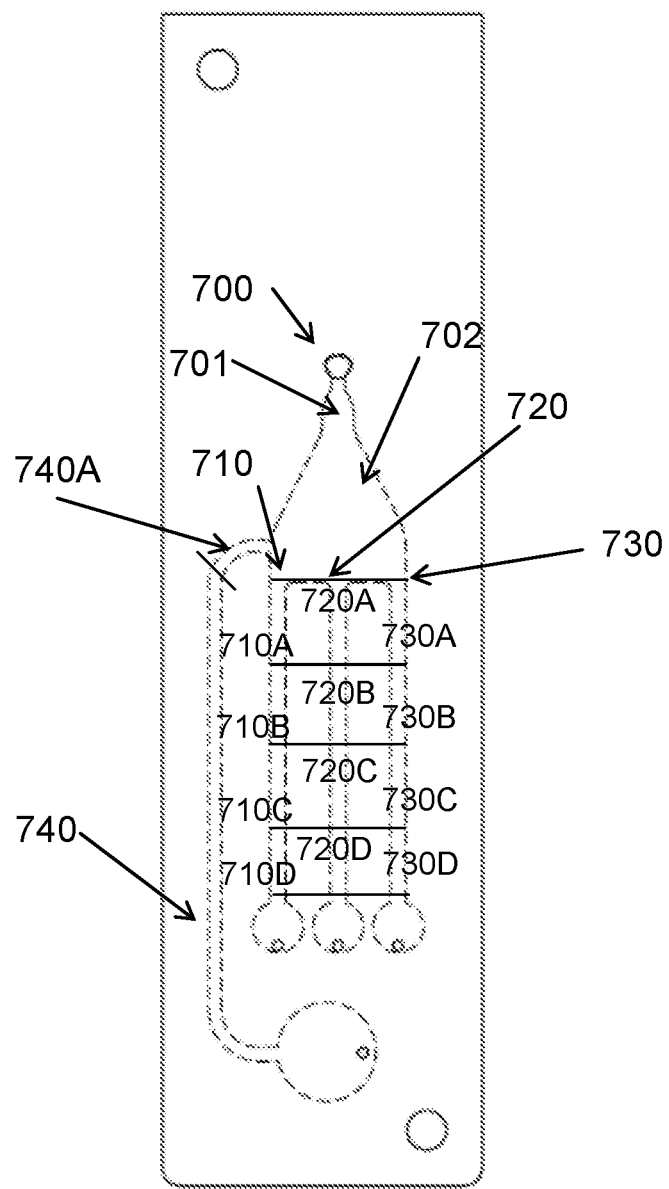
FIG. 7 is a figure of one embodiment of a microfluidic product of the invention

Coatings were applied for on a substrate in a pattern similar to the one shown in FIG. 7. Dimensions for an embodiment used in this example are shown in FIG. 7. The substrate was Duralar® polyester (0.005" thick). Each straight channel in the part was coated with a different composition. The inlet channel region and manifold sections were also coated with different coating compositions. Coatings were dispensed onto each region to give a wet film thickness of 0.03-0.04 mm. Dispense volumes varied from 100 nL-1 uL for each region depending on the area of the region. After the solutions were dispensed onto each region, they were allowed to dry at room temperature. The coated materials were then UV-cured for 1 minute using UV-C(254 nm peak) at a distance of about 4 inches.

Coatings were applied to create a gradient coating from the inlet port 700 to the expansion region 701 and manifold region 702 and through each of the three straight channel sections 710, 720, and 730. For the straight channel sections, coatings were applied along 4 equally-spaced 5-mm lengths A, B, C, and D of each channel. In addition, a coating was applied to the entrance region 740A of the waste channel 740 in order to prevent/delay flow of liquid into the waste channel until the liquid filled at least one straight channel sections.

The following coating solutions were used in this example:
A) Solution A: Blend of 10 mg/ml PTFM, 0.3 mg/ml PHFM, and 0.5 mg/ml Isurlite® in methyl acetate
B) Solution B: 10 mg/ml of Pluronic F38 (PEG/PPO block-copolymer MW 100,000) from BASF and 2.0 mg/ml Isurlite® in methyl acetate
C) Mixture of 10% Solution A and 90% Solution B
D) Mixture of 5% Solution A and 95% Solution B E) Mixture of 1% Solution A and 90% Solution B
F) Mixture of 0.1% Solution A and 99.9% Solution B
G) Mixture of 0.01% Solution A and 99.99% Solution B
Four separate coating patterns were created by dispensing solutions A-G onto specific regions of the substrate as shown below in Table 12.

TABLE 12

Coating Patterns for Multi-Channel Example
Coating Solutions Used for Patterns in Multi-Channel Part

| Region | Length (mm) | Max Width (mm) | Area (mm2) | Coat 1 Pattern | Coat 2 Pattern | Coat 3 Pattern | Coat 4 Pattern |
|---|---|---|---|---|---|---|---|
| 701 | 3 | 2 | 4.5 | C | C | C | None |
| 702 | 9 | 8 | 52.5 | D | D | D | None |
| 710A | 5 | 1 | 5 | F | G | E | G |
| 710B | 5 | 1 | 5 | G | G | F | G |
| 710C | 5 | 1 | 5 | B | B | G | B |
| 710D | 5 | 1 | 5 | B | B | B | B |
| 720A | 5 | 1 | 5 | E | E | F | C |
| 720B | 5 | 1 | 5 | E | E | G | D |
| 720C | 5 | 1 | 5 | F | E | B | D |
| 720D | 5 | 1 | 5 | B | B | B | D |
| 730A | 5 | 1 | 5 | F | F | E | C |
| 730B | 5 | 1 | 5 | F | F | E | C |
| 730C | 5 | 1 | 5 | F | F | F | D |
| 730D | 5 | 1 | 5 | G | B | G | D |
| 740A | 4 | 0.8 | 3.2 | A | A | A | A |
| 740 | 34 | 0.8 | 27.2 | None | None | None | None |

Contact angle measurements were then taken for each coating pattern as well as for uncoated materials. 200-nL drops of deionized water were used for the contact angle measurements. Results for the contact angle measurements are shown in Table 13.

TABLE 13

Contact Angle Measurements for Multi-channel Example

Contact Angles for Regions in each Coating Pattern

| Region | Uncoated | Coat 1 | Coat 2 | Coat 3 | Coat 4 |
|---|---|---|---|---|---|
| 701 | 60 | 72 | 64 | 67 | 60 |
| 702 | 55 | 52 | 48 | 49 | 60 |
| 710A | 59 | 33 | 21 | 39 | 25 |
| 710B | 59 | 22 | 15 | 30 | 25 |
| 710C | 60 | 15 | 20 | 22 | 15 |
| 710D | 60 | 20 | 20 | 14 | 10 |
| 720A | 60 | 48 | 45 | 27 | 70 |
| 720B | 60 | 41 | 30 | 24 | 60 |
| 720C | 56 | 30 | 30 | 11 | 60 |
| 720D | 58 | 15 | 15 | 11 | 60 |
| 730A | 59 | 33 | 23 | 42 | 70 |
| 730B | 59 | 32 | 22 | 39 | 70 |
| 730C | 66 | 33 | 24 | 24 | 60 |
| 730D | 55 | 21 | 15 | 18 | 60 |
| 740A | 59 | 115 | 114 | 105 | 110 |
| 740 | 63 | 60 | 65 | 60 | 60 |

Results of the experiment showed that gradients were created along the length of the part from the inlet port through each channel. Results also showed that different gradients were created with varying degrees of gradient in the channel sections.

A microfluidic part was then assembled using the substrate coated with coating pattern 4 as the bottom layer, the adhesive layer in Example 1 as the second layer, and uncoated 0.005" thick Duralar® polyester as the top layer. 10-ul, 6-ul, and 6-ul volumes of water were dispensed to the inlet of the port by a pipette tip using gravity flow. After 10-ul was dispensed, all the fluid bypassed side channel 740 due to the hydrophobic coating in 740A. All the initial liquid was directed into channel 710 and did not enter channels 720 or 730. After subsequent additions of the 6-ul water volumes, the liquid flowed into channels 720 and 730 but only after channel 710 was filled. The flow rates in all three channels was different due to the difference the gradient coatings in each channel. Total time to flow through channel 710 was about 32 seconds; total time to flow through channel 720 was about 47 seconds; and total time to flow through channel 730 was about 67 seconds. Once the three channels 710, 720, and 730 were filled, the pressure in the product was high enough for liquid to then flow into channel 740. These results show that fluid flow can be controlled in channels in fluid communication with each other using gradient coatings. The coatings can be used to control the order of channel entry and fluid velocities for multiple channels in fluid communication with each other.

Example 13

Gradient coatings were produced on plastic microfluidic products comprising 6 individual channels that were each 1-mm wide, 100 microns high, and 15-mm in length. Coatings were applied to a 0.010" thick acrylic which was then used as the bottom layer of the product. The adhesive channel layer made of the same material as in Example 1 was used as the $2^{nd}$ layer, and an uncoated 0.010" thick acrylic was used as the top layer.

The following coating solutions were used in this example:
A) Solution A: Blend of 10 mg/ml PTFM, 0.3 mg/ml PHFM, and 0.5 mg/ml Isurlite® in methyl acetate
B) Solution B: 10 mg/ml of Pluronic F38 (PEG/PPO block-copolymer MW 100,000) from BASF and 2.0 mg/ml Isurlite® in methyl acetate
C) Mixture of 10% Solution A and 90% Solution B
D) Mixture of 5% Solution A and 95% Solution B
E) Mixture of 1% Solution A and 99% Solution B
F) Mixture of 0.1% Solution A and 99.9% Solution B
G) Mixture of 0.01% Solution A and 99.99% Solution B
Coatings were applied in every 3-mm length section of the channels as shown in Table 13:

TABLE 13

Coating Pattern For Channel Regions
Coating pattern

| Channel | 0-3 mm | 3-6 mm | 6-9 mm | 9-12 mm | 12-15 mm |
|---|---|---|---|---|---|
| 1 | None | None | None | None | None |
| 2 | A | A | A | A | A |
| 3 | A | A | A | D | D |
| 4 | A | D | E | E | E |
| 5 | C | F | G | G | G |
| 6 | D | F | B | B | B |

2.2 ul of 60 dyne/cm Accudyne Test fluid (Diversified Enterprises, Claremont, N.H.) were then delivered to the inlet port of each channel at the same time using a multi-tip pipettor. The times required to flow across each region of the channel were recorded and are shown in Table 14.

Results show that a wide range of flow rates can be achieved with the products of the invention. In this example, flow rates from 0.014 mm/s up to 3 mm/s were achieved, all by changing the coating over each channel region. In addition, flow could be accelerated and decelerated by changing the coating in each channel region.

TABLE 14

Flow times for Liquid in Each Channel Region
Time (seconds) Required to Travel Across Channel Region

| Channel | 0-3 mm | 3-6 mm | 6-9 mm | 9-12 mm | 12-15 mm |
|---|---|---|---|---|---|
| 1 | 3 | 3 | 4 | 1 | 2 |
| 2 | 30 | 32 | 83 | 150 | 215 |
| 3 | 30 | 65 | 35 | 24 | 18 |
| 4 | 30 | 15 | 45 | 13 | 8 |
| 5 | 25 | 3 | 27 | 8 | 11 |
| 6 | 11 | 22 | 4 | 4 | 3 |

Products of the invention can be single or multi-layered cartridges, disks, or other component and can have a rectangular, circular, oval, racetrack, or any other shape. Products can be manufactured from any of the materials described previously. Products of the invention can have additional product design features that are useful in the transport and analysis of liquids in microfluidic products.

In an embodiment, a microfluidic product according to the invention comprises at least one substrate. A substrate may include one or more expansions or areas along a channel or fluid passage. The substrates of the product may comprise an array of connected fluid passages. In one embodiment, a microfluidic product is provided that includes one or more substrates comprising a first channel comprising an inlet separated from an outlet and one or more secondary channels (or branch channels) in fluid communication with the first channel.

Figure 5:
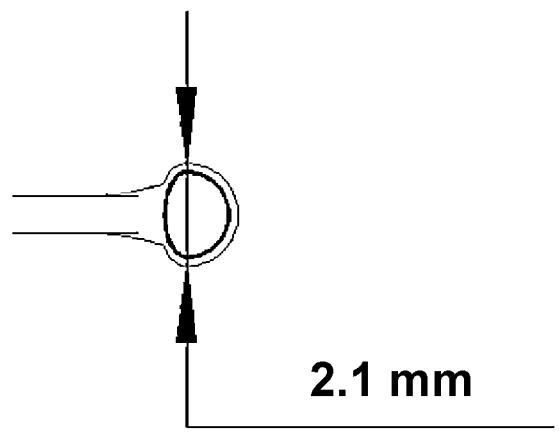
FIG. 5 is a figure showing one embodiment of an inlet port for use in the microfluidic products of the invention

The microfluidic product may comprise one or more outlet ports or inlet ports. Each of the outlet and inlet ports may also communicate with a well or reservoir. The inlet and outlet ports may be in fluid communication with the channels or reservoirs that they are connecting or may contain one or more valves. Fluid can be introduced into the channels via the inlet by any means. In an embodiment, the inlet ports of the microfluidic product have a shape like that shown in FIG. 5. This inlet port design is useful for encouraging liquid to contact the entrance of a channel in microfluidic products. In an embodiment, the port can be designs by designing a semicircle 0.016" smaller in diameter than 3 times the desired channel width. The semicircle can then be centered one radius away from the channel entrance center point. The remaining half of the inlet port design is an elliptical arc with major axis length 2 times the minor axis length, centered at the semicircle center. In another embodiment, the inlet port opening is smaller on the top layer of the microfluidic product than it is on the bottom layer of the microfluidic product. The sample inlet may intercept the first channel at any angle. A first channel may in turn communicate with two or more branch channels at another junction or "branch point", forming, for example, a T-shape or a Y-shape. Other shapes and channel geometries may be used as desired.

In one embodiment of the invention, a microfluidic product comprises at least one inlet port in fluid communication with a first channel, a detection region in fluid communication with the first channel, and a detector associated with the detection region. In an embodiment according to the invention, the microfluidic product comprises a detection region along a channel. There may be a plurality of detection regions and detectors, working independently or together, e.g., to analyze one or more properties of a chemical such as a reagent.

In an embodiment, a microfluidic product can be fabricated with a fluid reservoir or well at the inlet port, which is typically in fluid communication with an inlet channel. A reservoir preferably facilitates introduction of fluids into the substrate and into the first channel. An inlet port may have an opening such as in the floor of the substrate to permit entry of the sample into the device. The inlet port may also contain a connector adapted to receive a suitable piece of tubing, such as Teflon® tubing, liquid chromatography or HPLC tubing, through which a fluid may be supplied In an embodiment, the fabricated fluid passages and other components are covered and sealed, often with a transparent cover, although other clear or opaque cover materials may be used. Analytical devices having channels, valves, and other elements can be designed and fabricated from various materials. A variety of channels for sample flow and mixing can be fabricated and can be positioned at any location on the product as the detection and discrimination or sorting points. In embodiments, channels can also be designed into the microfluidic product that place the fluid flow at different times/distances into a field of view of a detector. Channels can also be designed to merge or split fluid flows at precise times/distances.

In an embodiment, a group of manifolds (a region consisting of several fluid passages that lead to or from a common fluid passage) can be included to facilitate the movement of liquid through the microfluidic product. The outlet can be adapted for receiving, for example, a segment of tubing or a sample tube.

In an embodiment, the microfluidic products of the invention can include assay modules, preferably assay cartridges. An assay module of the invention incorporates one or more fluidic components such as compartments, wells, chambers, fluidic conduits, fluid ports/vents, valves, and the like and/or one or more detection components such as electrodes, electrode contacts, sensors (e.g. electrochemical sensors, fluid sensors, mass sensors, optical sensors, capacitive sensors, impedance sensors, optical waveguides, etc.), detection windows (e.g. windows configured to allow optical measurements on samples in the cartridge such as measurements of absorbance, light scattering, light refraction, light reflection, fluorescence, phosphorescence, chemiluminescence, electrochemiluminescence, etc.), and the like. A module may also comprise reagents for carrying out an assay such as binding reagents, detectable labels, sample processing reagents, wash solutions, buffers, etc. The reagents may be present in liquid form, solid form and/or immobilized on the surface of solid phase supports present in the cartridge. In certain embodiments of the invention, the modules include all the components necessary for carrying out an assay. In other embodiments, the invention also includes a module reader adapted to receive the module and carry out certain operations on the module such as fluid movement, supplying power, conducting physical measurements on the cartridge, and the like.

In another embodiment, the microfluidic product comprises a detection region having one or more binding domains having immobilized binding reagents wherein the detection region is in fluid communication with the sample inlet. In an embodiment, the detection region comprises one or more immobilized binding reagents and comprises a signal indicator when species are bound to the binding reagents. The signal may be an electrochemiluminescent signal wherein the detection chamber further comprises electrodes. The one or more binding reagents can comprise one or more electrochemiluminescent labels.

In an embodiment, one or more fluidic networks may be defined within the cartridge's body by one or more cover layers mated to a side of the cartridge body. A second cover layer, or set of cover layers, may be mated to a second side of the cartridge body to form one or more additional second side fluidic networks therebetween, the first and second side fluidic networks being in fluidic communication by at least one though-hole within the cartridge body. The fluidic networks may be defined, at least in part, by recesses in the cartridge body and/or cover layers. In addition, at least one of the fluidic networks may be defined, at least in part, by apertures or openings within a gasket layer disposed between the cartridge body and at least one cover layer.

In another embodiment, the microfluidic product may comprise air vent ports.

In an embodiment, the microfluidic products of the invention comprise a plurality of flow cells or detection chambers. In certain embodiments the flow cell may comprise the same assay domains or, at least, have at least some assay domains that share specificity for the same analytes of interest. In these embodiments, the plurality of flow cells may be used to analyze a plurality of different samples or to compare samples that have been pre-treated in different ways. Alternatively, one of the flow cells may be a control flow cell used to analyze a control sample and another of the flow cells may be a test flow cell used to analyze a test sample. The control sample may be a completely pre-defined control sample or may be a mixture comprising the test sample but spiked with added analytes of interest so as to allow for calibration of the assays by the method of standard addition. In an alternative embodiment, the microfluidic product has at least two flow cells that have assay domains for two different assay panels. Advantageously, such a product may be used to separately perform assay reactions that are incompatible with each other.

In a preferred embodiment of the invention, the microfluidic product has minimal or no active mechanical or electronic components.

In other embodiments, the microfluidic product is introduced onto a cartridge reader to carry out an assay. For example, a reader may have electronic circuitry for applying electrical energy to the assay electrodes and for measuring the resulting potentials or currents at assay electrodes. The reader may have one or more light detectors for measuring luminescence generated at assay electrodes. Light detectors that may be used include, but are not limited to photomultiplier tubes, avalanche photodiodes, photodiodes, photodiode arrays, CCD chips, CMOS chips, film. The light detector may be comprised within an optical detection system that also comprise lenses, filters, shutters, apertures, fiber optics, light guides, etc. The reader may also have pumps, valves, heaters, sensors, etc. for providing fluids to the cartridge, verifying the presence of fluids and/or maintaining the fluids at an appropriate controlled temperature. The reader may be used to store and provide assay reagents, either onboard the reader itself or from separate assay reagent bottles or an assay reagent storage device. The reader may also have cartridge handling systems such as motion controllers for moving the cartridge in and out of the reader. The reader may have a microprocessor for controlling the mechanical and/or electronic subsystems, analyzing the acquired data and/or providing a graphical user interface (GUI). The cartridge reader may also comprise electrical, mechanical and/or optical connectors for connecting to the cartridge.

In an embodiment, the components of the microfluidic products can be designed and incorporated into the cartridge to form the fluidic network using certain predefined design guidelines. The design guidelines for each component can be dependent upon one or more factors such as, e.g., cartridge body design (i.e., single-piece body, multiple piece body, modular body, single read chamber, multiple read chamber, and the like), manufacturing process (e.g., injection molding, blow molding, hot stamping, casting, machining, etc.), materials (e.g., acrylic, PVDF, PET, polystyrene, polypropylene and the like), assay requirements (e.g., binding assay, competitive binding assay, single step assay, two-step assay, etc.), functional requirements (e.g., sample size, assay reagent volumes, detection technology, time-to-result, incubation, heating, mixing/agitating), safety/handling requirements (e.g., self-containment, regulatory approval, ease of use, etc.), and/or the like.

The skilled practitioner will be able to readily select materials suitable for the fabrication of the microfluidic products of the invention. Suitable materials include glass, ceramics, metals and/or plastics such as acrylic polymers (such as Lucite), acetal resins (such as Delrin), polyvinylidene fluoride (PVDF), polyethylene terephthalate (PET), polytetrafluoroethylene (e.g., Teflon), polystyrene, polypropylene, ABS, PEEK and the like. Preferably, the materials are inert to any solutions/reagents that will contact them during use or storage of the microfluidic product. In certain embodiments, at least some portion of the microfluidic product is fabricated from transparent and/or translucent materials such as glass or acrylic polymer to provide windows that allow optical interrogation of fluids or surfaces inside the cartridge, e.g., for analysis of compositions within detection chambers of the cartridge or for monitoring and controlling the movement of liquids through the fluidic networks defined within the cartridge.

An embodiment of the microfluidic product is a cartridge comprising a coating configured to control liquid flow wherein the cartridge includes one or more sample chambers, one or more detection chambers (preferably, detection chambers adapted for use in ECL measurements as described above) and one or more waste chambers. The chambers are connected in by fluid passage so that a sample introduced into a sample chamber can be delivered into one or more detection chambers for analysis and then passed into one or more waste chambers for disposal. This cartridge may include one or more reagent chambers for storing liquid reagents, the reagent chambers connected via fluid passages to the other components so as to allow the introduction of the liquid reagents into specified sample or detection chambers. The cartridge may also include vent ports in fluidic communication with the sample, detection and/or waste chambers (directly or through vent conduits) so as to allow the equilibration of fluid in the chambers with the atmosphere or to allow for the directed movement of fluid into or out of a specified chamber.

In an embodiment, the microfluidic cartridge comprises a sample chamber wherein the sample chamber is a chamber defined within a cartridge that is adapted for receiving a sample to be analyzed in the cartridge. The sample chamber includes a sample introduction port for introducing sample into the chamber. The port is preferably an opening in the cartridge that provides access to the sample chamber. Alternatively, the port may be a membrane or septa through which a sample may be injected into the sample chamber, e.g., through the use of a needle or cannula. In an embodiment, the cartridge also includes a sealable closure for sealing the sample introduction port and preventing leakage of the sample and possible exposure of the user and/or associated instruments to biohazards. Use of a modular detachable insert within the sample chamber also allows for independent selection of materials for the main cartridge body. In an alternative embodiment, sealing of the sample introduction port is achieved by applying an adhesive tape to the port. The sample chamber may contain dry reagents used in carrying out the assay that reconstitute on addition of a liquid sample. Optionally, the sample chamber contains an anti-foam agent to prevent foaming of the sample in the cartridge. In an embodiment, the sample chamber comprises the coating configured to control liquid flow in order to prevent leaks.

In one embodiment, the microfluidic product comprises a sample chamber wherein the sample chamber comprises a sample introduction port wherein the sample introduction port aperture also acts as a vent port. The vent port may also be provided through the top of the sealing/capping mechanism by, e.g., incorporating a vent hole in the top surface of the sealing/capping mechanism. An alternative embodiment may employ a scheme whereby the cartridge reader itself can include a piercing/venting mechanism that is adapted and configured to pierce through the top surface of the flexible sealing/capping mechanism. In an embodiment, the sealing/capping mechanism is adapted and configured to be self-sealing upon withdrawal/removal of the piercing/venting mechanism, e.g., via the use of a septum preferably comprising an elastomeric material. In an embodiment, the sample chamber comprises the coating configured to control liquid flow in order to prevent leaks.

In an embodiment, the sample chamber may also include a filter for, e.g., removing particulate matter that may be present within the sample itself or that may be present as a result of using a swab or the like to introduce sample into the sample chamber. An embodiment may employ a filter that not only removes any particulate matter but that is also designed to separate red blood cells (RBC) from blood plasma; e.g., where the particular assay/assay format requires blood plasma as the sample. Such a filter can be an integral cross-flow filter, in-line filter or the like. In an embodiment, the filter is arranged at or near the entrance of the sample conduit.

In an embodiment, microfluidic products may also comprise a cartridge that comprises a reagent module. The reagent module can comprise a container such as an ampoule (e.g., glass, plastic, or the like), a pouch (e.g., plastic, metal foil, plastic/metal foil laminates, rubber, or the like), a blister pack, a syringe, or the like, or any other container that can be filled with fluid, sealed and dropped into the cartridge for subsequent fluid delivery. Preferred materials include glass, plastics with good water vapor barrier properties (e.g., cyclic olefin copolymers such as copolymers of ethylene and norbornene, nylon 6, polyethylene naphthalate, polyvinylidene chloride and polychlorotrifluoroethylene) and metal foil/plastic laminates because of their chemical inertness and their resistance to evaporative losses, other suitable materials will be apparent to the skilled practitioner. Ampoules can comprise a material that can be made to shatter or break on impact such as glass or hard plastic. Embodiments incorporating breakable ampoules preferably also include filters to ensure that substantially all of the fragments that may result upon rupturing the ampoules are not permitted to enter the fluidic network and possibly obstruct/block fluid flow.

In an alternative embodiment, a pierceable container such as a pouch or blister pack may be employed. Preferably, the pierceable container has a pierceable wall made from a plastic film, a metal foil, or most preferably, a metal foil/plastic film laminate. In such an embodiment the assay reagent release mechanism could employ a piercing scheme. In another alternate embodiment, liquid reagents are stored in a syringe comprising a syringe chamber and a plunger. The chamber may be an integral component of the cartridge, a module that is inserted into the cartridge or a separate component that is attached (e.g., via a luer lock connection) to the cartridge prior to use. Actuation of the plunger may be used to release the contents of the syringe into a reagent chamber or, alternately, to transfer the contents directly into other fluidic components of the cartridge.

In an embodiment, the microfluidic product can comprise waste chambers linked to a waste chamber conduit and, preferably, to a vent port (e.g., through a vent conduit). The waste chamber can be configured to allow liquid waste to be delivered to the waste chamber through the waste chamber conduit and, preferably, for air that is included in the waste stream to escape through a waste chamber vent port. Optionally, the waste chambers contain a water absorbing material, such as a sponge, that retains waste fluid and prevents leakage of the waste fluid on disposal of a cartridge.

In an embodiment, the microfluidic product comprises a cartridge comprising detection chambers. The detection chambers are adapted for carrying out a physical measurement on the sample. If the measurement requires illumination or optical observation of the sample (e.g., as in measurements of light absorbance, photoluminescence, reflectance, chemiluminescence, electrochemiluminescence, light scattering and the like) the detection chamber should have at least one transparent wall arranged so as to allow the illumination and/or observation. When employed in solid phase binding assays, the detection chamber preferably comprises a surface (preferably, a wall of the chamber) that has one or more binding reagents (e.g., antibodies, proteins, receptors, ligands, haptens, nucleic acids, etc.) immobilized thereon. In an embodiment, the detection chamber is an electrochemiluminescence detection chamber having one or binding reagents immobilized on one or more electrodes. In one embodiment, the cartridge comprises a working electrode having an array of binding reagents immobilized thereon. In another embodiment, the cartridge comprises an array of independently controllable working electrodes each having a binding reagent immobilized thereon.

A cartridge may comprise one or more detection chambers. Cartridges comprising multiple detection chambers may comprise separate fluidic systems for each detection chamber (e.g., multiple sample chambers and/or reagent chambers and associated fluidic conduits) so that assays on multiple samples may be carried out in parallel. In embodiments, multiple detection chambers are linked to a single sample chamber and may share the use of other fluidic components such as reagent chambers, waste chambers and the like. In these embodiments, the two detection chambers may be used to carry out different sets of assays, thus increasing the number of measurements that can be carried out on a sample relative to a cartridge with one detection chamber. Advantageously, the use of multiple detection chambers allows for carrying out in a single cartridge multiple incompatible measurements, that is measurements that cannot be performed in a single reaction volume or benefit from being carried out in separate reaction volumes, e.g., measurements that have different requirements for pH or assay composition or otherwise negatively interfere with each other.

In another embodiment the microfluidic product comprises a plurality of detection chambers wherein one or more of a plurality of detection chambers is used as control/calibration chamber for measuring assay control/calibration samples. In one such embodiment, a first and a second detection chamber are each configured to carry out a panel of one or more assays for one or more analytes. One detection chamber (the test chamber) is used to analyze a sample. The other detection chamber (the control chamber) is used to analyze a spiked sample having a predetermined additional amount of the one or more of the analytes of interest. The change in signal between the two chambers allows for the calculation of the responsivity of the signal to changes in analyte and can be used to calibrate the system and/or to determine if the cartridge is functioning properly. In another embodiment employing a control chamber, the control chamber is not used to analyze the sample or a derivative thereof but is used to measure analyte in a separate control or calibrator matrix. The signal in the control chamber may be used for determining background signals (by using a matrix with no analyte), for calibrating the instrument (by using a calibrator matrix with a predetermined amount of analyte to determine calibration parameters) or to determine if the cartridge is functioning properly (by using a control matrix with a predetermined amount of analyte and determining if the signal falls within a predetermined acceptable range).

In another embodiment of the microfluidic product, the cartridge fluidics may include bubble traps. The bubble trap is a chamber or conduit adapted for removing bubbles from fluid streams. In an embodiment, there is a bubble trap between the sample and detection chambers so that bubbles in the sample may be removed prior to introducing the sample into the detection chamber.

Although some embodiments of the microfluidic products of the invention can operate without valves to control fluid flow under different flow conditions, in some embodiments, the microfluidic products may also comprise valves to provide additional control the flow of fluid through the cartridge. A variety of suitable valves (including mechanical valves, valves based on electrokinetic flow, valves based on differential heating, etc.) will be known to one of average skill in the art of assay cartridges or microfluidic devices. In one embodiment, a fluid conduit has a flexible wall/diaphragm that in the absence of external force allows fluid to pass through the conduit. Application of an external force on the wall/diaphragm (e.g., from a piston or via the application of gas or hydrostatic pressure) causes the diaphragm to impinge on the conduit, thus impeding the flow of fluid.

In an embodiment, the fluidic network of the microfluidic products may include at least one viscosity measuring conduit, preferably linked to a sample chamber or sample conduit, having an inlet and an outlet. The conduit is adapted so that a liquid sample can be introduced into the conduit and the time it takes the liquid to move between two locations in the conduit can be timed. Such an arrangement can advantageously be used to measure clotting times of a blood or plasma sample, or for determining viscosity changes of a liquid under different flow and temperature conditions.

In an embodiment, the microfluidic product comprises vent ports with apertures on the surface of the cartridge that are in fluidic communication with fluidic chambers or fluid passages within the cartridge. In an embodiment, the microfluidic product comprises a laminated cartridge construction comprising vent ports that are provided by apertures in cover layers that seal against a cartridge body to define planar fluidic networks or alternatively, by through-holes exposed on one surface of the cartridge body that communicate with fluidic networks on the opposing side. In an embodiment, the vent ports are used to introduce air into liquid streams passing through the fluidic conduits of the invention, for example, to segment the fluid streams with slugs of air. The introduction of air may be used to prevent mixing of two liquid slugs passed sequentially through a conduit, to clear a liquid from a conduit and/or to enhance the efficiency of a wash step. In an embodiment, the vent ports are arranged in a single row at a common location along the cartridge body's width.

Assays Utilizing Microfluidic Products of the Invention

In an embodiment, the microfluidic product of the invention comprises one or more assay cartridges. The assay cartridges may be used to carry out panels of assays. Suitable panels include panels of assays for analytes or activities associated with a specific biochemical system, biochemical pathway, tissue, organism, cell type, organelle, disease state, class of receptors, class of enzymes, class of pathogen, environmental sample, food sample, etc. Preferred panels include immunoassay for cytokines and/or their receptors, growth factors and/or their receptors, second messengers (e.g., cAMP, cGMP, phosphorylated forms of inositol and phosphatidyl inositol, etc.) drugs of abuse, therapeutic drugs, auto-antibodies (e.g., one or more antibodies directed against the Sm, RNP, SS-A, SS-B Jo-1, and Scl-70 antigens), allergen specific antibodies, tumor markers, cardiac markers (e.g., one or more of Troponin T, Troponin I, myoglobin, CKMB, etc.), markers associated with hemostasis (e.g., one or more of Fibrin monomer, D-dimer, thrombin-antithrombin complex, prothrombin fragments 1 & 2, anti-Factor Xa, etc.), markers of acute viral hepatitis infection (e.g., one or more of IgM antibody to hepatitis A virus, IgM antibody to hepatitis B core antigen, hepatitis B surface antigen, antibody to hepatitis C virus, etc.), markers of Alzheimers Disease (beta-amyloid, tau-protein, etc.), markers of osteoporosis (e.g., one or more of cross-linked N or C-telopeptides, total deoxypyridinoline, free deoxypyridinoline, osteocalcin, alkaline phosphatase, C-terminal propeptide of type I collagen, bone-specific alkaline phosphatase, etc.), markers of fertility (e.g., one or more of Estradiol, progesterone, follicle stimulating hormone (FSH), luetenizing hormone (LH), prolactin, beta-hCG, testosterone, etc.), markers of congestive heart failure, markers of thyroid disorders, and markers of prostrate cancer (e.g., one or more of total PSA, free PSA, complexed PSA, prostatic acid phosphatase, creatine kinase, etc.), pathogens associated with upper respiratory infection (e.g., influenza A, influenza B, Respiratory Syncytial Virus, Streptococci species), pathogens found in food and water (e.g., *salmonella, listeria, cryptosporidia, campylobacter, E. Coli* 0157, etc.), sexually transmitted diseases (e.g., HIV, syphilis, herpes, gonorrhea, HPV, etc.), blood borne pathogens and potential bioterrorism agents (e.g., pathogens and toxins in the CDC lists of Select A, B and C agents such as *B. anthracis, Y. pestis*, small pox, *F. tularensis*, ricin, botulinum toxins, staph enterotoxins, etc.). Assay panels also include nucleic acid arrays for measuring mRNA levels of mRNA coding for cytokines, growth factors, components of the apoptosis pathway, expression of the P450 enzymes, expression of tumor related genes, pathogens (e.g., the pathogens listed above), etc. Preferred panels also include nucleic acid arrays for genotyping individuals (e.g., SNP analysis), pathogens, tumor cells, etc. Preferred panels also include libraries of enzymes and/or enzyme substrates (e.g., substrates and/or enzymes associated with ubiquitination, protease activity, kinase activity, phosphatase activity, nucleic acid processing activity, GTPase activity, guanine nucleotide exchange activity, GTPase activating activity, etc.). Preferred panels also include libraries of receptors or ligands (e.g., panels of G-protein coupled receptors, tyrosine kinase receptors, nuclear hormone receptors, cell adhesion molecules (integrins, VCAM, CD4, CD8), major bistocompatibility complex proteins, nicotinic receptors, etc.). Preferred panels also include libraries of cells, cell membranes, membrane fragments, reconstituted membranes, organelles, etc. from different sources (e.g., from different cell types, cell lines, tissues, organisms, activation states, etc.).

In an embodiment, the microfluidic products comprise a component of a test kit. In an embodiment, the microfluidic product comprises and assay cartridge component of a test kit. The test kits may include disassembled components necessary to make an assay cartridge of the invention. Alternatively, the kits may comprise, in one or more containers, an assay cartridge of the invention and at least one additional assay reagent necessary to carry out an assay. The one or more assay reagents may include, but are not limited to, binding reagents (preferably, labeled binding reagents, more preferably binding reagents labeled with electrochemiluminescent labels) specific for an analyte of interest, ECL coreactants, enzymes, enzyme substrates, extraction reagents, assay calibration standards or controls, wash solutions, diluents, buffers, labels (preferably, electrochemiluminescent labels), etc. In another embodiment, the kits include cartridges of the invention adapted for extracting samples such as samples collected on applicator sticks. These kits can include applicator sticks (more preferably swabs) that have properties that are matched to the specific cartridge. Such kits may also include extraction buffers for extracting the sample on the applicator stick. The kit may also contain (in the cartridge or as a separate component), one or more labeled binding reagents against markers of pathogens.

In still other embodiments, the present invention provides an apparatus comprising: a substrate having therein a fluidic channel, the substrate comprising a test area and a reservoir, the reservoir, wherein the fluidic channel fluidically communicating with the test area so that a test compound placed in the reservoir is delivered to the test area. In some embodiments, the fluidic channel ends in an open port adjacent to the test area. In further embodiments, the apparatus is configured for use with an assay system selected from the group consisting of colorimetric, liquid crystal, fluorimetric, and densitometric assay systems. In some embodiments, the reservoir and the fluidic channel are formed from a material selected from the group consisting of glass, polypropylene, polystyrene, and silicone. In other embodiments, the apparatus is configured as an insert for use with a multiwell plate. In further embodiments, the apparatus comprises a plurality of test areas, reservoirs, and fluidic channels allowing parallel testing of a plurality of test compounds.

In other embodiments, the microfluidic products of the invention can be used to analyze a predetermined property of a cell or cells comprising: providing a substrate, cells and mesogens; applying the cells to the surface; and analyzing the cells by contacting the surface and the cells with the mesogens. Analysis of a variety of predetermined properties is contemplated, including, but not limited to proliferation in response to a compound, differentiation in response to a compound, and taxis in response to compound. In some embodiments, the analyzing step further comprises measuring the effect of a substance or compound on the cell. In some embodiments, the effect is quantified.

A detailed description of various physical and chemical assays is provided in Remington: The Science and Practice of Pharmacy, A. R. Gennaro (ed.), Mack Publishing Company, chap. 29, "Analysis of Medicinals," pp. 437-490 (1995) and in references cited therein while chapter 30 of the same reference provides a detailed description of various biological assays. The assays described include titrimetric assays based on acid-base reactions, precipitation reactions, redox reactions, and complexation reactions, spectrometric methods, electrochemical methods, chromatographic methods, and other methods such as gasometric assays, assays involving volumetric measurements and measurements of optical rotation, specific gravity, and radioactivity. Other assays described include assays of enzyme-containing substances, proximate assays, alkaloidal drug assays, and biological tests such as pyrogen test, bacterial endotoxin test, depressor substances test, and biological reactivity tests (in-vivo and in-vitro). Many assays based on fluorescence or changes in fluorescence have been developed and could be performed using methods and devices of the invention.

In addition, Remington: The Science and Practice of Pharmacy, A. R. Gennaro (ed.), Mack Publishing Company, chap. 31, "Clinical Analysis," pp. 501-533 (1995) and references cited therein provide a detailed description of various methods of characterizations and quantitation of blood and other body fluids. In particular, the reference includes a detailed description of various tests and assays involving various body fluid components such as erythrocytes, hemoglobin, thrombocyte, reticulocytes, blood glucose, nonprotein nitrogen compounds, enzymes, electrolytes, blood-volume and erythropoeitic mechanisms, and blood coagulation.

Detection/Analysis Features of Microfluidic Products

Many different techniques exist to identify or measure practically any characteristic of a chemical provided that the characteristic or characteristics of interest for analysis can be sufficiently identified and detected or measured to distinguish chemicals having the desired characteristic(s) from those which do not. In embodiments, the microfluidic products can comprise an optical detection system. Optical detection systems typically include an optical train for directing an optical signal from the microfluidic channels of the device via the optical element integrated therein, to an appropriate light detector, such as a photodiode or photomultiplier tube. In some embodiments, the detector includes a light source for directing an appropriate amount of light energy at the channels of the device, in order to produce a measurable optical signal, e.g., fluorescence, absorbance, etc. Examples of appropriate light sources include, e.g., lasers, laser diodes, LEDs, high intensity lamps, and the like. The detector can be any device or method for evaluating a physical characteristic of a fluid as it passes through the detection region.

One optical detector can be a microscope, which may be coupled with a computer and/or other image processing or enhancement devices to process images or information produced by the microscope using known techniques. For example, molecules can be analyzed and/or sorted by size or molecular weight. Reactions can be monitored by measuring the concentration of a product produced or the concentration of a reactant remaining at a given time. Enzymes can be analyzed and/or sorted by the extent to which they catalyze a chemical reaction of an enzyme's substrate (conversely, an enzyme's substrate can be analyzed (e.g., sorted) based on the level of chemical reactivity catalyzed by an enzyme). Biological particles or molecules such as cells and virions can be sorted according to whether they contain or produce a particular protein, by using an optical detector to examine each cell or virion for an optical indication of the presence or amount of that protein. A chemical itself may be detectable, for example by a characteristic fluorescence, or it may be labeled or associated with a tag that produces a detectable signal when, for example, a desired protein is present, or is present in at least a threshold amount.

To detect a chemical or tag, or to determine whether a chemical or tag has a desired characteristic, the detection region may include an apparatus (e.g., a light source such as a laser, laser diode, high intensity lamp such as mercury lamp) for stimulating a chemical or tag for that characteristic to, for example, emit measurable light energy. In embodiments where a lamp is used, the channels may be shielded from light in all regions except the detection region. In embodiments where a laser is used, the laser can be set to scan across a set of detection regions. In addition, laser diodes may be fabricated into the same substrate that contains the analysis units. Alternatively, laser diodes may be incorporated into a second substrate (i.e., a laser diode chip) that is placed adjacent to the analysis or sorter substrate such that the laser light from the diodes shines on the detection region(s).

Additional Agents that can be Incorporated into Fluid Passages or Coatings Configured to Control Liquid Flow In embodiments, the surfaces of the fluid passages of the microfluidic product can comprise one or more species or agents that provide additional functions. The coating configured to control liquid flow can also comprise one or more species or agents that are incorporated into coating that provide additional functions. These species include therapeutic agents, detection agents, biomolecules or biopolymers, and color agents. The species can comprise polymerized or repeating units of nucleic acid or amino acid units. Species can be for example oligonucleotides, DNA, RNA, protein, peptide, sugar, carbohydrate, and the like. The species can be a natural species such as for example a natural protein.

In one embodiment, the species can comprise one or more lipids, and lipids are generally known in the art. See for example, Bohinski, Modern Concepts in Biochemistry, 4.sup.th Ed., Chapter 8, "Lipids and Biomembranes." For example, lipids can be simple lipids, compound lipids, or derived lipids. Simple lipids can be for example acylglycerols or waxes. Compound lipids can be for example phsphoacylglycerols, sphingomyelins, cerebrosides, or gangliosides. Derived lipids can be for example steroids, carotenoids, or lipid vitamins. Lipids can be used which are natural or synthetic. The lipid can be able to form liposomes in aqueous solution, either on its own or in combination with other lipids. Lipids can be compounds comprising long hydrocarbon chains which can result in them being insoluble in water but soluble in nonpolar organic solvents. Additional examples of lipids include fats, oils, steroid and waxes.

In embodiments, the surfaces of the fluid passages of the microfluidic product can comprise glycerides. In another embodiment, the coating configured to control liquid flow can comprise glycerides. Glycerides are one type of lipids which are formed from glycerol and fatty acids. Glycerol comprises three hydroxyl groups which upon esterification with one, two or three fatty acids forms monoglycerides, diglycerides and triglycerides respectively. If one of the fatty acids is replaced with a sugar or a phosphate the resulting compound is a glycolipid or a phospholipid respectively. The fatty acids can be unsaturated, saturated, monounsaturated or polyunsaturated. Examples of unsaturated fatty acids includes, oleic, linoleic, linolenic and arachidonic acid. Examples of saturated fatty acids includes, myristic, palmitic and stearic acids. Further, the fatty acids may adopt a cis or trans configuration. The length of the fatty acid chain may vary. For example, the fatty acid hydrocarbon chain may comprise more than 3 carbon atoms, between 3-18 atoms or between 12-20 carbon atoms. The chain may or may not be branched. In one embodiment, the lipid compound comprises a phosphate group. In another embodiment, the lipid compound comprises a sugar group. In one embodiment, the lipid compound comprises one, two or three fatty acids. In a further embodiment, the lipid compound comprises at least one fatty acid which is saturated, monounsaturated or polyunsaturated. The lipid can comprise two fatty acids. At least one fatty acid can be monounsaturated. Both fatty acids can be monounsaturated. The fatty acid may be cis or trans. In one embodiment, at least one fatty acid comprises at least 3 carbon atoms. In another embodiment, at least one fatty acid comprises between 3 and 18 carbon atoms, including all integers in between. In another embodiment, at least one fatty acid comprises between 12 and 20 carbon atoms including all integers in between.

In embodiments, the lipid can be a phospholipid or a phospholipid derivative. The lipid can exhibit a gel-liquid crystal transition temperature. The molecular weight of the lipid can be for example 250 to about 2,000, or about 500 to about 1,500, or about 500 to about 1,000. Non limiting examples include phophacholine, phosphoglycerol, phosphatidic acid, phosphoserine, PEG phospholipid, and the like. The lipid can serve as a carrier. In one embodiment, the lipid is 1,2-dioleoyl-sn-glycero-3 pphosphocholine ("DOPC"). Other examples include POPC and DM PC. See for example Lenhart et al., Small, 2007, 3, no. 1, 71-75 for lipids which can be patterned.

In embodiments, the surfaces of the fluid passages of the microfluidic product can comprise species such as proteinaceous material and proteins and peptides. In another embodiment, the coating configured to control liquid flow can comprise species such as proteinaceous material and proteins and peptides. Proteinaceous materials include for example antibodies, enzymes, and the like. Types of proteins that can be incorporated include, but are not limited to, enzymes, storage proteins, transport proteins, contractile proteins, protective proteins, toxins, hormones, and structural proteins. Examples of storage proteins include, but are not limited to ovalbumin, casein, ferritin, gliadin, and zein. Examples of transport proteins include, but are not limited to hemoglobin, hemocyanin, myoglobin, serum albumin, .beta.1-lipoprotein, iron-binding globulin, and ceruloplasmin. Examples of contractile proteins include, but are not limited to myosin, actin, dynein. Examples of protective proteins include, but are not limited to antibodies, complement proteins, fibrinogen, and thrombin. Examples of enzymes include, but are not limited to ribonucleases, cytochrome c, lysozymes, proteases, kinases, polymerases, exonucleases, and endonucleases. Enzymes and their binding mechanisms are disclosed, for example, in Enzyme Structure and Mechanism, 2.sup.nd Ed., by Alan Fersht, 1977, including in Chapter 15 the following enzyme types: dehydrogenases, proteases, ribonucleases, staphyloccal nucleases, lysozymes, carbonic anhydrases, and triosephosphate isomerase. Examples of toxins include, but are not limited to, *Clostridium botulinum* toxin, diptheria toxin, cholera toxin proteins, Alexa Fluor 594 modified cholera toxin proteins, snake venoms, and ricin. Examples of hormones include, but are not limited to, insulin, adrenocorticotrophic hormone and insulin-like growth hormone, and growth hormone. Examples of structural proteins include, but are not limited to, viral-coat proteins, glycoproteins, membrane-structure proteins, .alpha.-keratin, sclerotin, fibroin, collagen, elastin, and mucoproteins. Natural or synthetic peptides and proteins can be used. Proteins that can be used, for example, are prepared by recombinant methods.

The protein or peptide can contain a single polypeptide chain or multiple polypeptide chains. The number of peptide bonds in the peptide can be, for example, at least three, ten or less, at least 100, about 100 to about 300, or at least 500. The protein can be simple or conjugated.

Examples of conjugated proteins include, but are not limited to, nucleoproteins, lipoproteins, phosphoproteins, metalloproteins and glycoproteins. The protein can be a virus, which can be complexes of proteins and nucleic acids, be they of the DNA or RNA types. The protein can be a shell to larger structures such as spheres or rod structures.

Proteins can be globular or fibrous in conformation. They can comprise a polypeptide chain or chains arranged in parallel as in, for example, a fiber. Examples include collagen and elastin. Globular proteins are polypeptides that are tightly folded into spherical or globular shapes and are mostly soluble in aqueous systems. Many enzymes, for example, are globular proteins, as are antibodies, some hormones and transport proteins, such as serum albumin and hemoglobin. Proteins can be used which have both fibrous and globular properties, like myosin and fibrinogen, which are tough, rod-like structures but are soluble. The proteins can possess more than one polypeptide chain, and can be oligomeric proteins, their individual components being called protomers. The oligomeric proteins usually contain an even number of polypeptide chains, not normally covalently linked to one another. Hemoglobin is an example of an oligomeric protein. Examples of proteins include immunoglobulins, IgG (rabbit, human, mouse, and the like), Protein A/G, fibrinogen, fibronectin, lysozymes, streptavidin, avdin, ferritin, lectin (Con. A), and BSA. Rabbit IgG and rabbit anti-IgG, bound in sandwich configuration to IgG are useful examples. Spliceosomes and ribozomes and the like can be used.

A wide variety of proteins are known to those of skill in the art and can be used. See, for instance, Chapter 3, "Proteins and their Biological Functions: A Survey," at pages 55-66 of BIOCHEMISTRY by A. L. Lehninger, 1970, which is incorporated herein by reference. Other embodiments include various nucleic acids. For example, the nucleic acid can be synthetically made, modified to include, for example, functional groups tailored for chemisorption or covalent bonding to the substrate, as well as naturally occurring. It can be of low, medium, or high molecular weight, oligomeric or polymeric. It can be single-, double-, or even triple-stranded. The nucleic acid can be based on deoxyribonucleic acid (DNA), ribonucleic acid (RNA), or combinations thereof. The structure of nucleic acids is generally described in, for example, Calladine and Drew, Understanding DNA, The Molecule and How it Works, 2.sup.nd Ed., 1997.

General types of nucleic acid that can be incorporated into the surfaces of the fluid passages and/or coatings configured to control liquid flow include, for example, DNA, RNA, PNA, CNA, RNA, HNA, p-RNA, oligonucleotides, oligonucleotides of DNA, oligonucleotides of RNA, primers, A-DNA, B-DNA, Z-DNA, polynucleotides of DNA, polynucleotides of RNA, T-junctions of nucleic acids, domains of non-nucleic acid polymer-nucleic acid block copolymers, and combinations thereof. Additional general types of nucleic acids include, for example, viral RNA or DNA, a gene associated with a disease, bacterial DNA, fungal DNA, nucleic acid from a biological source, nucleic acid which is a product of a polymerase chain reaction amplification, nucleic acid contacted with nanoparticles, and nucleic acid double-stranded and hybridized with the oligonucleotides on the nanoparticles resulting in the production of a triple-stranded complex.

In general, the nucleic acid can be any of a group of organic substances found in cells and viruses that play a central role in the storage and replication of hereditary information and in the expression of this information through protein synthesis. Purines, pyrimidines, carbohydrates, and phosphoric acid generally characterize the fundamental organic substances of a nucleic acid. Purines and pyrimidines are nucleotides, a nucleoside in which the primary hydroxy group of either 2-deoxy-D-ribose or of D-ribose is esterified by orthophosphoric acid. A nucleoside is a compound in which a purine or pyrimidine base is bound via a N-atom to C-1 replacing the hydroxy group of either 2-deoxy-D-ribose or of D-ribose, but without any phosphate groups. The common nucleosides in biological systems are adenosine, guanosine, cytidine, and uridine (which contain ribose) and deoxyadenosine, deoxyguanosine, deoxycytidine and thymidine (which contain deoxyribose). Thus, a purine base may be an adenine nucleotide or a guanine nucleotide. A pyrimidine base may be thymine nucleotide, a cytosine nucleotide, or a uracil nucleotide.

The sequence of a nucleic acid may be random or specific so as to encode a desired amino acid structure. For instance, a group of three nucleotides may comprise a codon. One codon comprises an amino acid. The coding region of a nucleic acid comprises codons. The nucleic acid can exist freely or can be bound to peptides or proteins to form nucleoproteins in discreet bundles or structured forms such as, for example, chromosomes. A nucleic acid also can exist in single-stranded or double-stranded forms. A nucleic acid may also be linear, circular, or supercoiled. Nucleic acid may be isolated directly from a cell or organelle. A plasmid or cloning vector are also examples of nucleic acids.

The nucleic acid can be made up of nucleotides, each containing a carbohydrate sugar (deoxyribose), a phosphate group, and mixtures of nitrogenous purine- and pyrimidine-bases. The sugar may be of a cyclic or acyclic form. DNA comprises only thymine and cytosine pyrimidines and no uracil. DNA may be isolated from a cell as genomic, nuclear, or mitochondrial DNA, or made synthetically (i.e., by chemical processes).

A gene present in a cell typically comprises genomic DNA made up of exonic and intronic stretches of DNA. The exonic stretches comprises nucleotides that comprise codons that encode amino acids, whereas the intronic stretches of DNA comprise nucleotides that likely do not comprise codons that encode amino acids. The nucleotide sequence of purines and pyrimidines determine the sequences of amino acids in the polypeptide chain of the protein specified by that gene.

DNA may also be isolated as complementary or copy DNA (cDNA) synthesized from an RNA template by the action of RNA-dependent DNA polymerase.

When in double-stranded form, the two DNA strands form a double helix. In this helix, each nucleotide in one strand is hydrogen bonded to a specific nucleotide on the other strand. Thus, in DNA, adenine bonds with thymine and guanine bonds with cytosine. The ability of nucleotides present in each strand to bind to each other determines that the strands will be complementary, e.g., that for every adenine on one strand there will be a thymine on the other strand.

RNA can be single-stranded or double-stranded and is transcribed from a cell's DNA. An RNA molecule may form a hairpin loop or other double-stranded structures. RNA may be template RNA, messenger RNA (mRNA), total RNA, or transfer RNA (tRNA). polysome. RNA-DNA hybrid molecules can be deposited according to the present invention. Furthermore, protein-nucleic acids, or "peptide nucleic acids" ("PNA") also may be used. The binding properties exhibited between complementary nucleotides can make nucleic acids useful as probes that can bind to other nucleic acids. Nucleic acids can be labelled and used as probes. By any one of a number of standard labelling techniques, nucleic acid probes can be used to detect, by hybridization, another nucleic acid. The hybridization can be visualized or detected if the label is, for example, a fluorescent, radioactive, or enzymatic label. In an embodiment, the coating configured to control liquid flow can incorporate a nucleic acid that is labelled, or modified so as to comprise a detectable entity, like a fluorescent marker or tag, a gold particle, streptavidin, digoxigenin, a magnetic bead, or other markers known to the skilled artisan.

The size of a nucleic acid can range considerably, from the size of a few nucleotides, to an oligonucleotide, or probe, to a polynucleotide, gene, chromosome fragment to entire chromosomes and genomes. For instance, a single- or double-stranded nucleic acid may be at least 10-, 20-, 30-, 40-, 50-, 60-, 70-, 80-, 90, or 100-nucleotides or base pairs (bp) in length. Larger still, a nucleic acid may be at least 0.2 kb, 0.3 kb, 0.4 kb, 0.5 kb, 0.6 kb, 0.7 kb, 0.8 kb, 0.9 kb, or 1.0 kb in size. Indeed, a nucleic acid incorporated into the coating of the present invention can be at least 1 kb, 2 kb, 3 kb, 4 kb, 5 kb, 6 kb, 7 kb, 8 kb, 9 kb, or 10 kb or larger in size. One preferred size range is 1-2 kb. The nucleic acid can be a chain of varying length of nucleotides and are typically called polynucleotides or oligonucleotides. An oligonucleotide is an oligomer generally resulting from linear sequences of nucleotides. The oligonucleotide can comprise, for example, about 2 to about 100, about 2 to about 20, about 10 to about 90, or about 15 to about 35 nucleotides. In oligonucleotide arrays, about 25-mer oligonucleotides can be used. Another particular range is about 60- to about 80-mers.

Nucleic acid arrays, and the types of nucleic acids used therein, are described for example in A Primer of Genome Science, G. Gibson and S. Muse, 2002, Chapters 3-4 (pages 123-181), which is hereby incorporated by reference. This reference, for example, describes both cDNA microarrays and oligonucleotide arrays, labeling, hybridization, and statistical analysis. cDNA arrays can be used for monitoring the relative levels of expression of thousands of genes simultaneously. PCR-amplified cDNA fragments (ESTs) can be spotted and probed against fluorescently or radioactively labeled cDNA. The intensity of the signal observed can be assumed to be in proportion to the amount of transcript present in the RNA population being studied. Differences in intensity reflect differences in transcript level between treatments. Statistical and bioinformatic analyses can then be performed, usually with the goal of generating hypotheses that may be tested with established molecular biological approaches. In other embodiments, the coating configured to control liquid flow can also comprise one or more biomolecules. Such biomolecules may include proteins; extracellular matrix proteins such as fibronectin, vitronectin and collagen; soluble proteins such as growth factors, including vascular endothelial growth factor (VEGF), brain-derived neurotrophic factor (BDNF) or neuronal growth factor (NGF); proteins that are part of a cellular membrane, such as semaphorins, neuropilins, PAR1 receptor, ephrins or plexins; proteins that are intracellular; a coupling biomolecule that links a protein or other biomolecule to a substrate such as streptavidin or antibodies; blocking agents to provide space for coupling biomolecules, proteins or other biomolecules to bind to a substrate; antibodies; receptors; ligands; lipids; antigens; full-size proteins; protein domains; peptides; enzymes and/or enzyme substrates; polysaccharides; DNA, RNA, or other nucleic acids; small biomolecules such as nucleotides (e.g. cyclic adenosine monophosphate); fluorescent reporters, small molecules and drugs, peptides and enzymatic substrates; small molecules that bind covalently to proteins, peptides or nucleic acids; aggregates of biomolecules, small particles or colloids less than 10 micron, less than 5 microns, less than 1 micron, less than 500 nm, less than 200 nm, less than 100 nm, or less than 50 nm diameter, including quantum dots, superparamagnetic nanoparticles, quantum dots coated with biomolecules as described above, superparamagnetic nanoparticles coated with biomolecules as described above, dendrimers coated with biomolecules as described above, glass or silica particles coated with biomolecules as described above, liposomes coated with biomolecules as described above, viruses or phage particles and analogous particles; or any combination thereof.

Biomolecules include, for example, proteins, peptides, nucleic acids, drugs, lipids, bioactive polymers, bioactive compounds, and any combination thereof. One or more biomolecules may be covalently or non-convalently attached to the substrate via a coupling molecule of varying length. The one or more of protein biomolecules may include fibronectin, vitronectin, collagen, growth factors, cellular membrane proteins, intracellular proteins, extracellular matrix proteins, soluble proteins, signaling proteins, and any combination thereof. The one or more of biomolecules may be attached to a particle or colloid include quantum dots, superparamagnetic nanoparticles, dendrimers, glass or silica particles, liposomes, viruses or phage particles and analogous particles, and any combination thereof.

In embodiments, the surfaces of the fluid passages of the microfluidic product comprise colorants. In embodiments, the colorants are incorporated into the coating that is configured to control fluid flow. In embodiments, the coating configured to control liquid flow can also comprise colorants. As used herein, the term "colorant" means any substance that imparts color and/or other opacity and/or other visual effect to the composition. The colorant can be added to the coating in any suitable form. A single colorant or a mixture of two or more colorants can be used in the coating composition described herein. Example colorants include pigments, dyes and tints, such as those used in the paint industry and/or listed in the Dry Color Manufacturers Association (DCMA), as well as special effect compositions. A colorant can be organic or inorganic and can be agglomerated or non-agglomerated. In general, the colorant can be present in any amount sufficient to impart the desired visual and/or color effect.

In embodiments, the colorant can be in the form of a dispersion including, but not limited to, a nanoparticle dispersion. Nanoparticle dispersions can include one or more highly dispersed nanoparticle colorants and/or colorant particles that produce a desired visible color and/or opacity and/or visual effect. Nanoparticle dispersions can include colorants such as pigments or dyes having a particle size of less than 150 nm, such as less than 70 nm, or less than 30 nm. Nanoparticle dispersions can also be produced by crystallization, precipitation, gas phase condensation, and chemical attrition (i.e., partial dissolution). In order to minimize re-agglomeration of nanoparticles within the coating, a dispersion of resin-coated nanoparticles can be used. As used herein, a "dispersion of resin-coated nanoparticles" refers to a continuous phase in which discreet "composite microparticles", which comprise a nanoparticle and a resin coating on the nanoparticle, is dispersed.

Example special effect compositions that may be used include pigments and/or compositions that produce one or more appearance effects such as reflectance, pearlescence, metallic sheen, phosphorescence, fluorescence, photochromism, photosensitivity, thermochromism, goniochromism and/or color-change. Additional special effect compositions can provide other perceptible properties, such as opacity or texture. In a non-limiting embodiment, special effect compositions can produce a color shift, such that the color of the coating changes when the coating is viewed at different angles. In certain non-limiting embodiments, a photosensitive composition and/or photochromic composition, which reversibly alters its color when exposed to one or more light sources, can be used in the coating configured to control liquid flow. Photochromic and/or photosensitive compositions can be activated by exposure to radiation of a specified wavelength. When the composition becomes excited, the molecular structure is changed and the altered structure exhibits a new color that is different from the original color of the composition. When the exposure to radiation is removed, the photochromic and/or photosensitive composition can return to a state of rest, in which the original color of the composition returns. In one non-limiting embodiment, the photochromic and/or photosensitive composition can be colorless in a non-excited state and exhibit a color in an excited state. Full color-change can appear within milliseconds to several minutes, such as from 20 seconds to 60 seconds. Example photochromic and/or photosensitive compositions include photochromic dyes.

In embodiments, the surfaces of the fluid passages of the microfluidic product comprise therapeutic agents. In embodiments, the non-genetic therapeutic agents are incorporated into the coating that is configured to control fluid flow. In embodiments, therapeutic agents in the microfluidic products can be used to treat a condition. The amount of therapeutic agent that is provided in connection with various embodiments of the present invention can be determined by those of ordinary skill in the art and depends upon the condition to be treated, the nature of the therapeutic agent itself, the avenue by which the device is administered to the intended subject, and so forth. In some embodiments, the coating acts as a depot for the therapeutic agent, releasing the therapeutic agent in a controlled manner once the microfluidic product has been positioned within a patient's body. In other embodiments, the coating acts as a barrier to control the passage of a therapeutic agent.

In embodiments, the surfaces of the fluid passages of the microfluidic product comprise non-generic therapeutic agents. In embodiments, the non-genetic therapeutic agents are incorporated into the coating that is configured to control fluid flow. Exemplary non-genetic therapeutic agents include: (a) anti-thrombotic agents such as heparin, heparin derivatives, urokinase, and PPack (dextrophenylalanine proline arginine chloromethylketone); (b) anti-inflammatory agents such as dexamethasone, prednisolone, corticosterone, budesonide, estrogen, sulfasalazine and mesalamine; (c) antineoplastic/antiproliferative/anti-mitotic agents such as paclitaxel, 5-fluorouracil, cisplatin, vinblastine, vincristine, epothilones, endostatin, angiostatin, angiopeptin, monoclonal antibodies capable of blocking smooth muscle cell proliferation, and thymidine kinase inhibitors; (d) anesthetic agents such as lidocaine, bupivacaine and ropivacaine; (e) anti-coagulants such as D-Phe-Pro-Arg chloromethyl ketone, an RGD peptide-containing compound, heparin, hirudin, antithrombin compounds, platelet receptor antagonists, anti-thrombin antibodies, anti-platelet receptor antibodies, aspirin, prostaglandin inhibitors, platelet inhibitors and tick antiplatelet peptides; (f) vascular cell growth promoters such as growth factors, transcriptional activators, and translational promotors; (g) vascular cell growth inhibitors such as growth factor inhibitors, growth factor receptor antagonists, transcriptional repressors, translational repressors, replication inhibitors, inhibitory antibodies, antibodies directed against growth factors, bifunctional molecules consisting of a growth factor and a cytotoxin, bifunctional molecules consisting of an antibody and a cytotoxin; (h) protein kinase and tyrosine kinase inhibitors (e.g., tyrphostins, genistein, quinoxalines); (i) prostacyclin analogs; (j) cholesterol-lowering agents; (k) angiopoietins; (l) antimicrobial agents such as triclosan, cephalosporins, aminoglycosides and nitrofurantoin; (m) cytotoxic agents, cytostatic agents and cell proliferation affectors; (n) vasodilating agents; and (o) agents that interfere with endogenous vasoactive mechanisms.

In embodiments, the surfaces of the fluid passages of the microfluidic product comprise genetic therapeutic agents. In embodiments, the genetic therapeutic agents are incorporated into the coating that is configured to control fluid flow. Genetic therapeutic agents include anti-sense DNA and RNA, oligo decoys, as well as DNA coding for: (a) anti-sense RNA, (b) tRNA or rRNA to replace defective or deficient endogenous molecules, (c) angiogenic factors including growth factors such as acidic and basic fibroblast growth factors, vascular endothelial growth factor, epidermal growth factor, transforming growth factor, platelet-derived endothelial growth factor, platelet-derived growth factor, tumor necrosis factor.alpha., hepatocyte growth factor and insulin-like growth factor, (d) cell cycle inhibitors including CD inhibitors, and (e) thymidine kinase ("TK") and other agents useful for interfering with cell proliferation. Cells include cells of human origin (autologous or allogeneic), including stem cells and platelets, or from an animal source (xenogeneic), which can be genetically engineered if desired to deliver proteins of interest.

Numerous therapeutic agents have been identified as agents that prevent restenosis and other negative occurences. Such agents can be incorporated into the fluid passages and/or coating configured to control liquid flow and include one or more of the following: (a) Ca-channel blockers including benzothiazapines such as diltiazem and clentiazem, dihydropyridines such as nifedipine, amlodipine and nicardapine, and phenylalkylamines such as verapamil, (b) serotonin pathway modulators including: 5-HT antagonists such as ketanserin and naftidrofuryl, as well as 5-HT uptake inhibitors such as fluoxetine, (c) cyclic nucleotide pathway agents including phosphodiesterase inhibitors such as cilostazole and dipyridamole, adenylate/guanylate cyclase stimulants such as forskolin, as well as adenosine analogs, (d) catecholamine modulators including .alpha.-antagonists such as prazosin and bunazosine, beta-antagonists such as propranolol and alpha/beta.-antagonists such as labetalol and carvedilol, (e) endothelin receptor antagonists, (f) nitric oxide donors/releasing molecules including organic nitrates/nitrites such as nitroglycerin, isosorbide dinitrate and amyl nitrite, inorganic nitroso compounds such as sodium nitroprusside, sydnonimines such as molsidomine and linsidomine, nonoates such as diazenium diolates and NO adducts of alkanediamines, S-nitroso compounds including low molecular weight compounds (e.g., S-nitroso derivatives of captopril, glutathione and N-acetyl penicillamine) and high molecular weight compounds (e.g., S-nitroso derivatives of proteins, peptides, oligosaccharides, polysaccharides, synthetic polymers/oligomers and natural polymers/oligomers), as well as C-nitroso-compounds, O-nitroso-compounds, N-nitroso-compounds and L-arginine, (g) ACE inhibitors such as cilazapril, fosinopril and enalapril, (h) ATII-receptor antagonists such as saralasin and losartin, (i) platelet adhesion inhibitors such as albumin and polyethylene oxide, (j) platelet aggregation inhibitors including aspirin and thienopyridine (ticlopidine, clopidogrel) and GP IIb/IIIa inhibitors such as abciximab, epitifibatide and tirofiban, (k) coagulation pathway modulators including heparinoids such as heparin, low molecular weight heparin, dextran sulfate and beta-cyclodextrin tetradecasulfate, thrombin inhibitors such as hirudin, hirulog, PPACK(D-phe-L-propyl-L-arg-chloromethylketone) and argatroban, FXa inhibitors such as antistatin and TAP (tick anticoagulant peptide), Vitamin K inhibitors such as warfarin, as well as activated protein C, (l) cyclooxygenase pathway inhibitors such as aspirin, ibuprofen, flurbiprofen, indomethacin and sulfinpyrazone, (m) natural and synthetic corticosteroids such as dexamethasone, prednisolone, methprednisolone and hydrocortisone, (n) lipoxygenase pathway inhibitors such as nordihydroguairetic acid and caffeic acid, (o) leukotriene receptor antagonists, (p) antagonists of E- and P-selectins, (q) inhibitors of VCAM-1 and ICAM-1 interactions, (r) prostaglandins and analogs thereof including prostaglandins such as PGE1 and PGI2 and prostacyclin analogs such as ciprostene, epoprostenol, carbacyclin, iloprost and beraprost, (s) macrophage activation preventers including bisphosphonates, (t) HMG-CoA reductase inhibitors such as lovastatin, pravastatin, fluvastatin, simvastatin and cerivastatin, (u) fish oils and omega-3-fatty acids, (v) free-radical scavengers/antioxidants such as probucol, vitamins C and E, ebselen, transretinoic acid and SOD mimics, (w) agents affecting various growth factors including FGF pathway agents such as bFGF antibodies and chimeric fusion proteins, PDGF receptor antagonists such as trapidil, IGF pathway agents including somatostatin analogs such as angiopeptin and ocreotide, TGF-beta pathway agents such as polyanionic agents (heparin, fucoidin), decorin, and TGF-beta antibodies, EGF pathway agents such as EGF antibodies, receptor antagonists and chimeric fusion proteins, TNF-.alpha. pathway agents such as thalidomide and analogs thereof, Thromboxane A2 (TXA2) pathway modulators such as sulotroban, vapiprost, dazoxiben and ridogrel, as well as protein tyrosine kinase inhibitors such as tyrphostin, genistein and quinoxaline derivatives, (x) MMP pathway inhibitors such as marimastat, ilomastat and metastat, (y) cell motility inhibitors such as cytochalasin B, (z) antiproliferative/antineoplastic agents including antimetabolites such as purine analogs (e.g., 6-mercaptopurine or cladribine, which is a chlorinated purine nucleoside analog), pyrimidine analogs (e.g., cytarabine and 5-fluorouracil) and methotrexate, nitrogen mustards, alkyl sulfonates, ethylenimines, antibiotics (e.g., daunorubicin, doxorubicin), nitrosoureas, cisplatin, agents affecting microtubule dynamics (e.g., vinblastine, vincristine, colchicine, paclitaxel and epothilone), caspase activators, proteasome inhibitors, angiogenesis inhibitors (e.g., endostatin, angiostatin and squalamine), rapamycin, cerivastatin, flavopiridol and suramin, (aa) matrix deposition/organization pathway inhibitors such as halofuginone or other quinazolinone derivatives and tranilast, (bb) endothelialization facilitators such as VEGF and RGD peptide, (cc) blood rheology modulators such as pentoxifylline, and (dd) endothelial-cell specific mitogens.

Typical polynucleotide therapeutic agents generally include DNA encoding for various polypeptide and protein products including those previously listed. Some additional examples of polynucleotide therapeutic agents include DNA encoding for the following: cytokines such as colony stimulating factors (e.g., granulocyte-macrophage colony-stimulating factor), tumor necrosis factors (e.g., fas ligand) and interleukins (e.g., IL-10, an anti-inflammatory interleukin), as well as protease inhibitors, particularly serine protease inhibitors (e.g., SERP-1), tissue inhibiting metalloproteinases (e.g., TIMP-1, TIMP-2, TIMP-3, TIMP-4), monocyte chemoattractant proteins (e.g., MCP-1), protein kinase inhibitors including cyclin-dependent kinase inhibitors (e.g., p27, p21), endogenous and inducible nitric oxide synthase, CO-generating enzymes, such as hemoxygenases, which catalyze the oxidation of heme into the biologically active molecules iron biliverdin and CO (e.g., HOI-1), antiproliferative compounds, such as hKIS in a transdominant mutant peptide form, which are capable of interfering with the ability of endogenous hKIS to phosphorylate p27 thereby enhancing cell cycle arrest, as well as derivatives Additional embodiments of the invention include the following:

Embodiment 1: A microfluidic product comprising one or more fluid passages wherein a first fluid passage comprises a top and a bottom surface wherein the first fluid passage comprises a coating configured to control liquid flow wherein the coating configured to control liquid flow comprises a gradient surface energy coating from a proximal location to a distal location on a surface of the fluid passage.

Embodiment 2: A microfluidic product comprising a plurality of fluid passages wherein the plurality of fluid passages comprise a first fluid passage and a second fluid passage, each with a top and a bottom surface, wherein both the first fluid passage and the second fluid passage each comprise a coating configured to control liquid flow wherein the coating configured to control liquid flow comprises a gradient surface energy coating from a proximal location to a distal location on a surface of the fluid passage.

Embodiment 3: A microfluidic product of embodiments 1 and 2 wherein at least one fluid passage comprises a coating configured to control liquid flow wherein the difference between the contact angle formed with water and the surface at the proximal location of the gradient surface energy coating and the contact angle formed with water and the surface at the distal location of the gradient surface energy coating is no less than 10 degrees.

Embodiment 4: A microfluidic product of embodiments 1-3 further comprising a fluid passage that is not coated.

Embodiment 5: A microfluidic product of embodiments 1-4, wherein the linear velocity of liquid in a first fluid passage is no less than 10 percent higher than the linear velocity of liquid in a second fluid passage.

Embodiment 6: A microfluidic product of embodiments 1-5 wherein at least a first fluid passage and the second fluid passage are in fluid communication with each other.

Embodiment 7: A microfluidic product of embodiments 1-6 wherein the chemical composition of the coating in a first fluid passage is different from the chemical composition of the coating in a fluid passage.

Embodiment 8: A microfluidic product of embodiments 1-7 wherein two or more fluid passages comprise a coating configured to control liquid flow wherein the coating comprises a gradient surface energy coating from a proximal location to a distal location on a surface of the fluid passage wherein the chemical composition of the coating is the same for the two or more fluid passages.

Embodiment 9: The microfluidic product of embodiments 1-8 further comprising at least one inlet port in communication with a first channel and a detection region in fluid communication of the first channel.

Embodiment 10: The microfluidic product of embodiment 9 further comprising a detector associated with the detection region.

Embodiment 11: The microfluidic product of embodiments 1-10 wherein the length of a first channel is no more than 10 percent greater than the length of a second channel.

Embodiment 12: The microfluidic product of embodiments 1-11 wherein the width of a first channel is no more than 10 percent greater than the width of a second channel.

Embodiment 13: The microfluidic product of embodiments 1-12 wherein the height of a first channel is no more than 10 percent greater than the height of a second channel.

Embodiment 14: A microfluidic product of embodiments 1-13 wherein the fluid passages comprise rectangular channels.

Embodiment 15: A microfluidic product of embodiment 14 wherein the length of the channels is no less than 3 millimeters, and the width of the channels is no greater than 1 millimeters.

Embodiment 16: The microfluidic product of embodiments 1-15 wherein the coating configured to control liquid flow comprises a species having a functional group M1 and a species having a functional group M2 where M1 and M2 have different surface energies.

Embodiment 17: The microfluidic product of embodiment 16 wherein the coating comprises a monolayer coating.

Embodiment 18: The microfluidic product of embodiments 1-17, wherein the coating is formed from species X1-J1-M1 and X2-J2-M2 wherein X1, X2, M1, and M2 represent separate functional groups where M1 and M2 have different surface energies and J1 and J2 represents spacer moieties, the species X1-J1-M1 and X2-J2-M2 forming a coating onto the surface from solution.

Embodiment 19: The microfluidic product of embodiments 1-18 wherein the molar concentration of the species comprising the functional group M2 continuously increases relative to the concentration of the species comprising functional group M1 in the coating from the proximal location to the distal location.

Embodiment 20: The microfluidic product of embodiments 1-19 wherein the coating configured to control liquid flow comprises a photoreactive group.

Embodiment 21: The microfluidic product of embodiments 1-20 wherein the coating configured to control liquid flow comprises a thermoreactive group.

Embodiment 22: The microfluidic product of embodiments 1-21 wherein the contact angle formed with water and the surface at the proximal location of the gradient surface energy coating is between 90 and 120 degrees and the contact angle formed with water and the surface at the distal location of the gradient surface energy coating is between 10 and 110 degrees.

Embodiment 23: The microfluidic product of embodiments 1-22 wherein the contact angle formed with water and the surface at the proximal location of the gradient surface energy coating is between 90 and 120 degrees and the contact angle formed with water and the surface at the distal location of the gradient surface energy coating is between 10 and 70 degrees.

Embodiment 24: The microfluidic product of embodiments 1-23 wherein the contact angle formed with water and the surface at the proximal location of the gradient surface energy coating is between 90 and 120 degrees and the contact angle formed with water and the surface at the distal location of the gradient surface energy coating is between 10 and 40 degrees.

Embodiment 25: The microfluidic product of embodiments 1-24 wherein the contact angle formed with water and the surface at the proximal location of the gradient surface energy coating is between 60 and 120 degrees Embodiment 26: The microfluidic product of embodiments 1-25 wherein the contact angle formed with water and the surface at the proximal location of the gradient surface energy coating is between 40 and 120 degrees.

Embodiment 27: The microfluidic product of embodiments 1-26 wherein the contact angle formed with water and the surface at the distal location of the gradient surface energy coating is between 10 and 40 degrees.

Embodiment 28: The microfluidic product of embodiments 1-27 wherein the contact angle formed with water and the surface at the distal location of the gradient surface energy coating is between 10 and 70 degrees.

Embodiment 29: The microfluidic product of embodiments 1-28 wherein the contact angle formed with water and the surface at the distal location of the gradient surface energy coating is between 10 and 110 degrees.

Embodiment 30: The microfluidic product of embodiments 1-29 wherein the proximal location corresponds to the fluid passage entrance and the distal location corresponds to the fluid passage exit.

Embodiment 31: The microfluidic product of embodiments 1-30 wherein the proximal location corresponds to a location on a surface of the fluid passage that is downstream of the fluid passage entrance.

Embodiment 32: The microfluidic product of embodiments 1-31 wherein the proximal location corresponds to a location on the surface of the fluid passage that is at the mid-point between the fluid passage entrance and the fluid passage exit Embodiment 33: The microfluidic product of embodiments 1-31 wherein the proximal location corresponds to a location on the surface of the fluid passage that is upstream of the mid-point between the fluid passage entrance and the fluid passage exit.

Embodiment 34: The microfluidic product of embodiments 1-31 wherein the proximal location corresponds to a location on the surface of the fluid passage that is downstream of the mid-point between the fluid passage entrance and the fluid passage exit.

Embodiment 35: The microfluidic product of embodiments 1-34 wherein the distal location corresponds to a location on the surface of the fluid passage upstream of the fluid passage exit.

Embodiment 36: The microfluidic product of embodiments 1-33 wherein the distal location corresponds to a location on the surface of the fluid passage that is at the mid-point between the fluid passage entrance and the fluid passage exit.

Embodiment 36: The microfluidic product of embodiments 1-33 and 35 wherein the distal location corresponds to a location on the surface of the fluid passage that is upstream of the mid-point between the fluid passage entrance and the fluid passage exit.

Embodiment 37: The microfluidic product of embodiments 1-35 wherein the distal location corresponds to a location on the surface of the fluid passage that is downstream of the mid-point between the fluid passage entrance and the fluid passage exit.

Embodiment 38: The microfluidic product of embodiments 1-37 wherein a surface of the fluid passages comprise a polymer.

Embodiment 39: The microfluidic product of embodiments 1-38 wherein the microfluidic product comprises a thermoplastic polymer.

Embodiment 40: The microfluidic product of embodiments 1-39 wherein a surface of the fluid passages comprise a metal selected from the group consisting of gold, silver, nickel, copper, steel, palladium, platinum, or their alloys.

Embodiment 41: The microfluidic product of embodiments 1-40 wherein a surface of the fluid passages comprise a glass, metal oxide, or dielectric material.

Embodiment 42: The microfluidic product of embodiments 1-41, wherein a surface of a fluid passage further comprises a substantially uniform coating.

Embodiment 43: The microfluidic product of embodiments 42 wherein the substantially uniform coating is a hydrophilic coating.

Embodiment 44: The microfluidic product of embodiments 42-43 wherein the substantially uniform coating is a hydrophobic coating.

Embodiment 45: The microfluidic product of embodiments 1-44 wherein for at least one fluid passage, the contact angle formed with water and the surface of the fluid passage at the proximal location of the gradient surface energy coating is no less than 90 degrees and wherein the contact angle formed with water and the surface decreases at an average linear rate for the length of the fluid passage.

Embodiment 46: The microfluidic product of embodiments 1-45 wherein for at least one fluid passage, the contact angle formed with water and the surface of the fluid passage at the proximal location of the gradient surface energy coating is no less than 60 degrees and wherein the contact angle formed with water and the surface decreases at an average linear rate for the length of the fluid passage.

Embodiment 47: The microfluidic product of embodiments 1-46 wherein for at least one fluid passage, the contact angle formed with water and the surface of the fluid passage at the proximal location of the gradient surface energy coating is no less than 30 degrees and wherein the contact angle formed with water and the surface decreases at an average linear rate for the length of the fluid passage.

Embodiment 48: The microfluidic product of embodiments 45-47 wherein the average linear rate is between 1 degree/millimeter and 10 degrees/millimeter.

Embodiment 49: The microfluidic product of embodiments 1-48 wherein the microfluidic product comprises a clear or transparent material.

Embodiment 50: The microfluidic product of embodiments 1-49 further wherein the material comprising the fluid passages comprises a scale for measuring length.

Embodiment 51: The microfluidic product of embodiments 1-50 wherein the overall length of the device is no more than 200 millimeters, the overall width is no more than 150 millimeters, and the overall thickness is no more than 20 millimeters.

Embodiment 52: The microfluidic product of embodiments 1-51 wherein the overall length of the device is no more than 100 millimeters, the overall width is no more than 75 millimeters, and the overall thickness is no more than 10 millimeters.

Embodiment 53: The microfluidic product of embodiments 1-52 wherein the height of the fluid passages is no greater than 200 microns.

Embodiment 54: The microfluidic product of embodiments 42-53 wherein the uniform coating is between the fluid passage entrance and the proximal location for the gradient surface energy coating.

Embodiment 55: The microfluidic product of embodiments 42-54 wherein the uniform coating is between the fluid passage exit and the proximal location for the gradient surface energy coating.

Embodiment 56: The microfluidic product of embodiments 42-55 wherein the uniform coating is between the fluid passage exit and the distal location for the gradient surface energy coating.

Embodiment 57: The microfluidic product of embodiments 1-56 wherein the microfluidic product comprises an assay cartridge.

Embodiment 58: The microfluidic product of embodiments 1-57 wherein the microfluidic product comprises a sample module.

Embodiment 59: The microfluidic product of embodiments 1-58 wherein the fluid microfluidic products comprises a reagent module.

Embodiment 60: The microfluidic product of embodiments 1-59 wherein a fluid passage comprises a therapeutic agent.

Embodiment 61: The microfluidic product of embodiments 1-60 wherein a fluid passage comprises a detection agent.

Embodiment 62: The microfluidic product of embodiments 1-61 wherein a fluid passage comprises a colorant.

Embodiment 63: The microfluidic product of embodiments 1-62 wherein a fluid passage comprises a biopolymer.

Embodiment 64: The microfluidic product of embodiments 1-63 wherein the coating configured to control liquid flow comprises a therapeutic agent.

Embodiment 65: The microfluidic product of embodiments 1-64 wherein the coating configured to control liquid flow comprises a detection agent.

Embodiment 66: The microfluidic product of embodiments 1-65 wherein the coating configured to control liquid flow comprises a colorant.

Embodiment 67: The microfluidic product of embodiments 1-66 wherein the coating configured to control liquid flow comprises a biopolymer.

The above disclosure is intended to be illustrative and not exhaustive. This description will suggest many variations and alternatives to one of ordinary skill in this art. All these alternatives and variations are intended to be included within the scope of the claims where the term "comprising" means "including, but not limited to". Those familiar with the art may recognize other equivalents to the specific embodiments described herein which equivalents are also intended to be encompassed by the claims.

Further, the particular features presented in the dependent claims can be combined with each other in other manners within the scope of the invention such that the invention should be recognized as also specifically directed to other embodiments having any other possible combination of the features of the dependent claims. For instance, for purposes of claim publication, any dependent claim which follows should be taken as alternatively written in a multiple dependent form from all prior claims which possess all antecedents referenced in such dependent claim if such multiple dependent format is an accepted format within the jurisdiction (e.g. each claim depending directly from claim 1 should be alternatively taken as depending from all previous claims). In jurisdictions where multiple dependent claim formats are restricted, the following dependent claims should each be also taken as alternatively written in each singly dependent claim format which creates a dependency from a prior antecedent-possessing claim other than the specific claim listed in such dependent claim below.

Those skilled in the art may recognize other equivalents to the specific embodiment described herein which equivalents are intended to be encompassed by the claims attached hereto.

The following documents contain additional information on the materials, processes, and product applications that can be suitable with the microfluidic products of the invention. All documents cited in this application are herein incorporated by reference in their entirety.

U.S. Pat. No. 6,887,362
U.S. Pat. No. 8,048,633
U.S. Pat. No. 5,002,582
U.S. Pat. No. 7,790,265
US 20010014448
US20030077452
US 20030049381
US 20060030669
US 20070003707
US 20020100714
US 20030129130
US 20060280866
US 20070031283
US 20080124252
US 20080264506
US 20090181864
US 20090264317
US 20090297733
US 20100025250
US 20100197523
US 20100285490
US 2010297659
WO1999016907
WO1999047176
WO2003031979
WO2010033482
WO 2011084811
WO 2008149282

We claim:

1. A microfluidic product comprising an inlet port, a first detection region positioned downstream of a first fluid passage, and a second detection region positioned downstream of a second fluid passage, the first and second fluid passages each having a top surface and a bottom surface, wherein the first and second fluid passages each comprise a coating configured to control liquid flow on the top surface or the bottom surface wherein the coating configured to control liquid flow comprises a gradient surface energy coating from a proximal location on the top or bottom surface to a distal location on the top or bottom surface of the first and second fluid passages, wherein
   the inlet port is in fluid communication with the first and second detection regions, and
   the gradient surface energy coating of the first and second fluid passages comprises species X1-J1-M1 and species X2-J2-M2 wherein X1, X2, M1, and M2 represent separate functional groups where M1 and M2 have different surface energies and J1 and J2 represents spacer moieties, and the molar concentration of the species X2-J2-M2 increases relative to the molar concentration of the species X1-J1-M1 in the gradient surface energy coating from the proximal location to the distal location.

2. The microfluidic product of claim 1 wherein the first and second detection regions comprises one or more binding domains having immobilized binding reagents.

3. The microfluidic product of claim 2 wherein the binding reagents comprise one or antibodies, proteins, receptors, ligands, haptens, or nucleic acids.

4. The microfluidic product of claim 2 wherein the binding reagents comprise one or more electrochemiluminescent labels.

5. The microfluidic product of claim 1 further comprising a pierceable container.

6. The microfluidic product of claim 1 further comprising a reagent chamber for storing liquid reagents, the reagent chamber connected via one or more additional fluid passages to the first or second detection region.

7. The microfluidic product of claim 1 wherein the coating configured to control liquid flow further comprises a therapeutic agent, a detection agent, a colorant, a biopolymer or combinations thereof.

8. The microfluidic product of claim 1 wherein the composition of the gradient surface energy coating in the first fluid passage is different from the composition of the gradient surface energy coating in the second fluid passage.

9. The microfluidic product of claim 1 wherein the top or bottom surface of the first or second fluid passage comprises a polymer material selected from the group consisting of polystyrene, polycarbonate, polyester, polyethylene, polyethylene terephthalate (PET), polyglycolic acid (PGA), polyolefin, poly-(pphenyleneterephthalamide), polyphosphazene, polypropylene, polytetrafluoroethylene, polyurethane, polyvinyl chloride, and polyacrylate (including polymethacrylate) and the functional groups X1 and X2 in species X1-J1-M1 and X2-J2-M2 comprise a photoreactive group.

10. The microfluidic product of claim 1 wherein the top surface or bottom surface of the first or second fluid passage comprises a material selected from the group consisting of gold, silver, nickel, copper, aluminum, cadmium, zinc, palladium, platinum, mercury, lead, iron, chromium, manganese, tungsten, silicon, silicon oxide, and any alloys of the above and the functional groups X1 and X2 in species X1-J1-M1 and X2-J2-M2 are selected from the group consisting of thiols, sulfides, disulfides, silanes, and chlorosilanes.

11. The microfluidic product of claim 1 wherein the first or second fluid passage further comprises a therapeutic agent, a detection agent, a colorant, a biopolymer or combinations thereof.

12. The microfluidic product of claim 1 wherein the M2 species in the surface energy gradient coating of the first fluid passage is different from the M2 species in the surface energy gradient coating of the second fluid passage.

13. The microfluidic product of claim 2 wherein the binding reagents comprise virus antibodies.

14. The microfluidic product of claim 1 wherein the proximal location corresponds to the first or second fluid passage entrance and the distal location corresponds to the first or second fluid passage exit.

15. The microfluidic product of claim 1 wherein the proximal location corresponds to a location on a surface of the first or second fluid passage that is downstream of the first or second fluid passage entrance.

16. The microfluidic product of claim 1 wherein the distal location corresponds to a location on the surface of the first or second fluid passage upstream of the first or second fluid passage exit.

17. The microfluidic product of claim 1 further comprising a fluid passage that is not coated.

18. The microfluidic product of claim 1 further comprising a third detection region wherein the third detection region is used in a control/calibration for measuring assay control/calibration samples.

19. The microfluidic product of claim 1 wherein the microfluidic product comprises an assay cartridge used to carry out panels of assays.

20. The microfluidic product of claim 19 wherein the assay comprises virus antibodies.

* * * * *